(12) United States Patent
Kawahito et al.

(10) Patent No.: US 10,230,914 B2
(45) Date of Patent: Mar. 12, 2019

(54) CHARGE MODULATION ELEMENT AND SOLID-STATE IMAGING DEVICE

(71) Applicant: National University Corporation Shizuoka University, Shizuoka-shi, Shizuoka (JP)

(72) Inventors: Shoji Kawahito, Shizuoka (JP); Keita Yasutomi, Shizuoka (JP); Sangman Han, Shizuoka (JP)

(73) Assignee: National University Corporation Shizuoka University, Shizuoka-shi (JP)

( * ) Notice: Subject to any disclaimer, the term of this patent is extended or adjusted under 35 U.S.C. 154(b) by 255 days.

(21) Appl. No.: 15/115,814

(22) PCT Filed: Feb. 6, 2015

(86) PCT No.: PCT/JP2015/000559
§ 371 (c)(1),
(2) Date: Sep. 21, 2016

(87) PCT Pub. No.: WO2015/118884
PCT Pub. Date: Aug. 13, 2015

(65) Prior Publication Data
US 2017/0171485 A1    Jun. 15, 2017

(30) Foreign Application Priority Data
Feb. 7, 2014    (JP) ................. 2014-022516

(51) Int. Cl.
*G01C 3/08*    (2006.01)
*H04N 5/378*    (2011.01)
(Continued)

(52) U.S. Cl.
CPC ........... *H04N 5/378* (2013.01); *G01S 7/4863* (2013.01); *G01S 17/89* (2013.01);
(Continued)

(58) Field of Classification Search
CPC ...... H04N 5/378; H04N 5/374; G01S 7/4863; G01S 17/89; H01L 27/1461; H01L 27/14623; H01L 27/14643
See application file for complete search history.

(56) References Cited

U.S. PATENT DOCUMENTS 7,843,029 B2    11/2010    Kawahito et al.
9,202,902 B2    12/2015    Kawahito
(Continued)

FOREIGN PATENT DOCUMENTS

EP        2881991 A1    6/2015
JP     2009-47661 A    3/2009
(Continued)

OTHER PUBLICATIONS

An extended European search report dated Sep. 13, 2017 in the counterpart European patent application.
(Continued)

*Primary Examiner* — Samantha K Abraham
(74) *Attorney, Agent, or Firm* — Metrolexis Law Group, PLLC

(57) ABSTRACT

A charge-modulation element includes a first charge-accumulation region, a second charge-accumulation region, a third charge-accumulation region, and a fourth charge-accumulation region, provided symmetric with respect to a center position of a light-receiving area, and a first field-control electrode pair, a second field-control electrode pair, a third field-control electrode pair, and a fourth field-control electrode pair, arranged on both sides of respective charge transport paths, for changing depletion potentials of the charge transport paths, which extend from the center position of the light-receiving area to the first charge-accumulation region, the second charge-accumulation region, the third charge-accumulation region, and the fourth charge-accumulation region.

13 Claims, 32 Drawing Sheets

(51) Int. Cl.
*H01L 27/144* (2006.01)
*G01S 17/89* (2006.01)
*G01S 7/486* (2006.01)
*H01L 27/146* (2006.01)
*H04N 5/374* (2011.01)

(52) U.S. Cl.
CPC ...... *H01L 27/1446* (2013.01); *H01L 27/1461* (2013.01); *H01L 27/14623* (2013.01); *H01L 27/14643* (2013.01); *H04N 5/374* (2013.01)

(56) References Cited

U.S. PATENT DOCUMENTS

| | | |
|---|---|---|
| 2010/0073541 A1 | 3/2010 | Kawahito |
| 2011/0037969 A1 | 2/2011 | Spickermann et al. |
| 2011/0157354 A1 | 6/2011 | Kawahito |

FOREIGN PATENT DOCUMENTS

| | | | |
|---|---|---|---|
| JP | 2010-32425 A | 2/2010 | |
| JP | 2011-13138 A | 1/2011 | |
| WO | 2007/119626 A1 | 10/2007 | |
| WO | 2008/069141 A1 | 6/2008 | |
| WO | 2009/025365 A1 | 2/2009 | |
| WO | 2014/021417 A1 | 2/2014 | |
| WO | WO-2014021417 A1 * | 2/2014 | ......... H01L 27/1461 |

OTHER PUBLICATIONS

English translation of the international preliminary report on patentability issued for the corresponding International Application (PCT/IB/338, PCT/IB/373 and PCT/ISA/237).

* cited by examiner

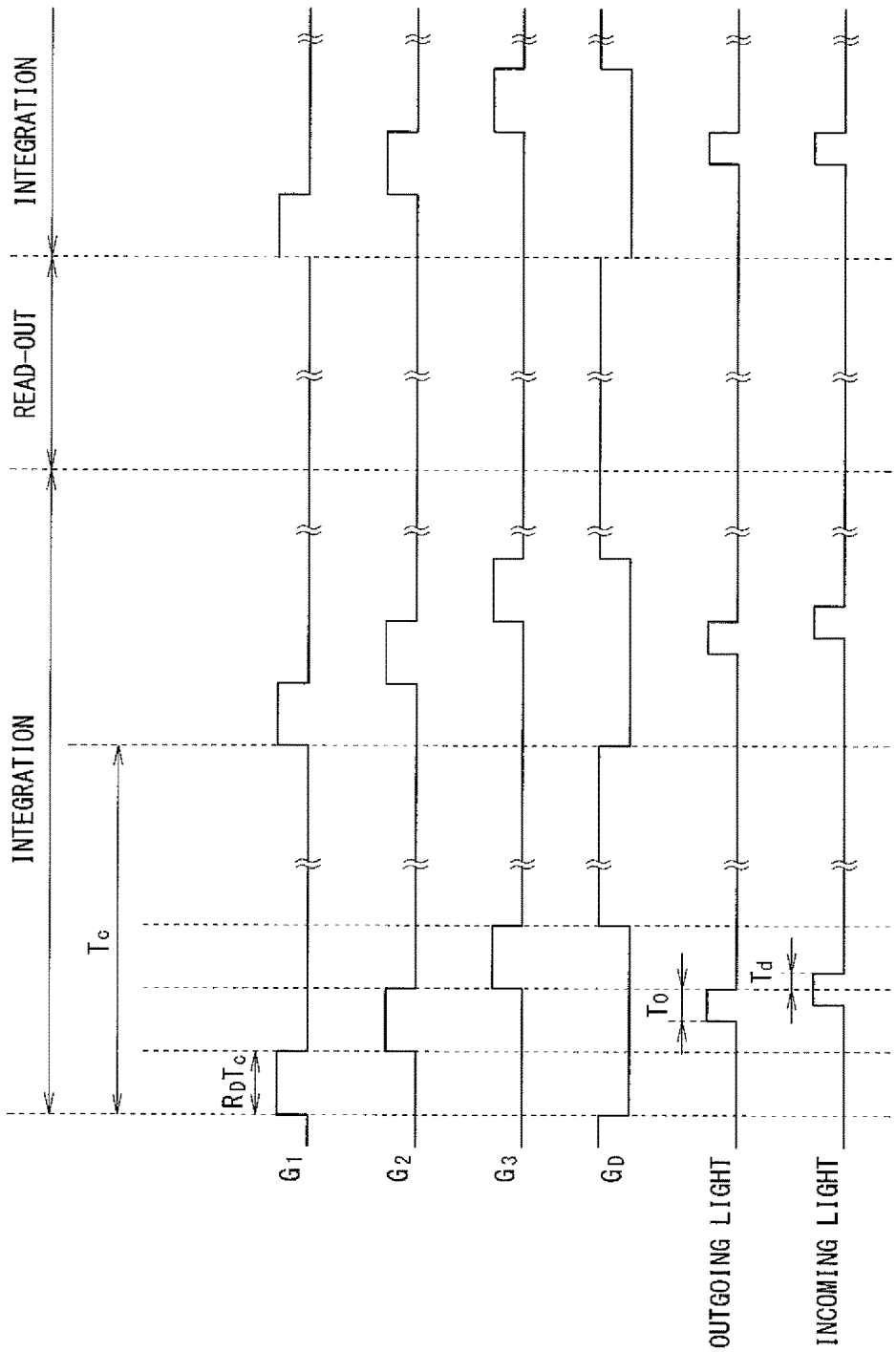

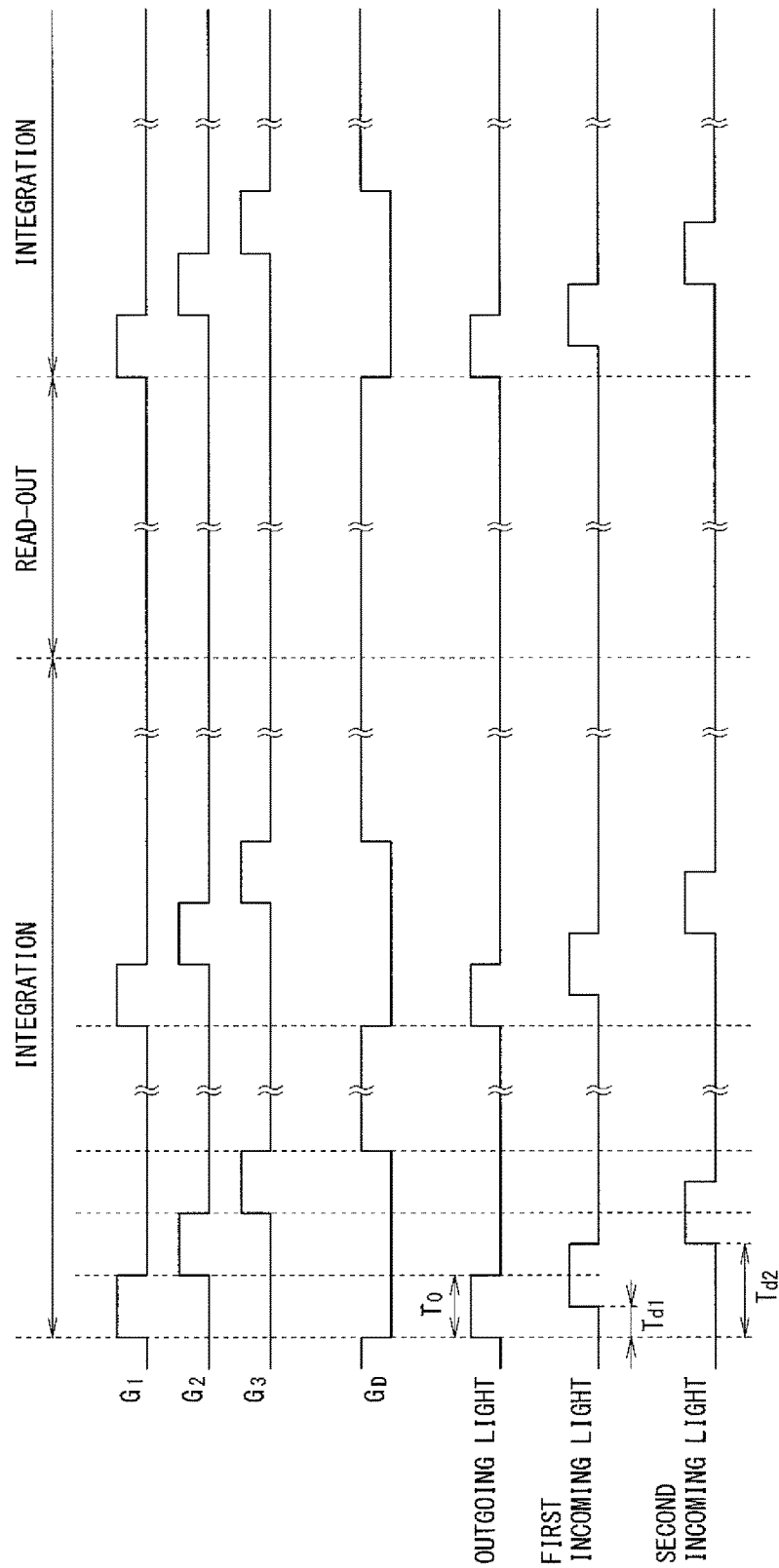

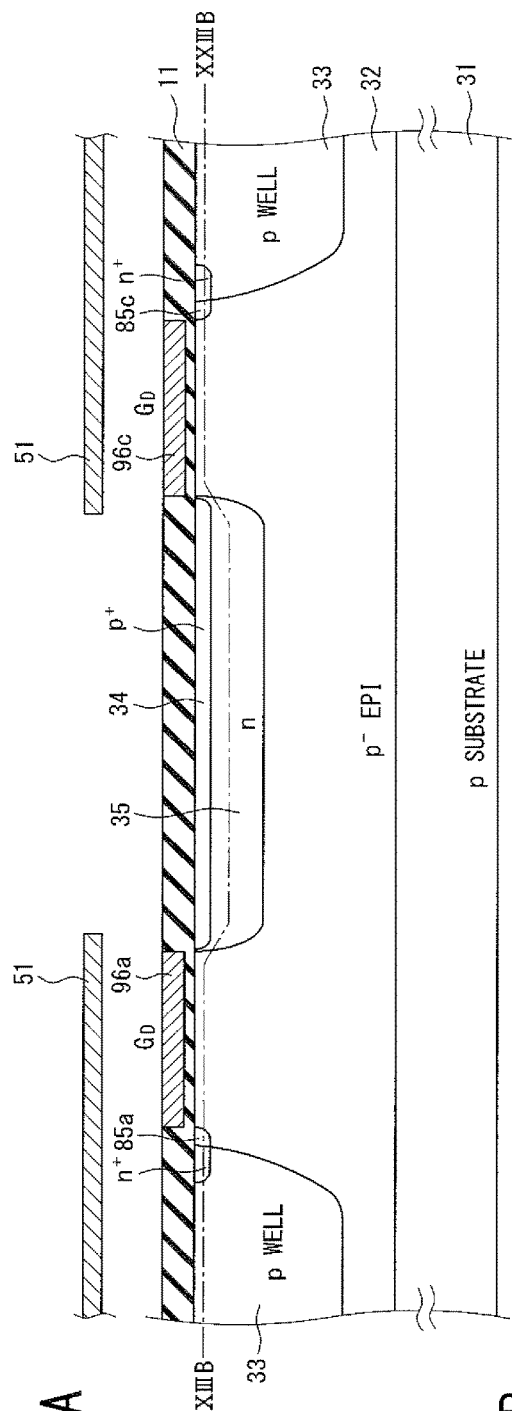
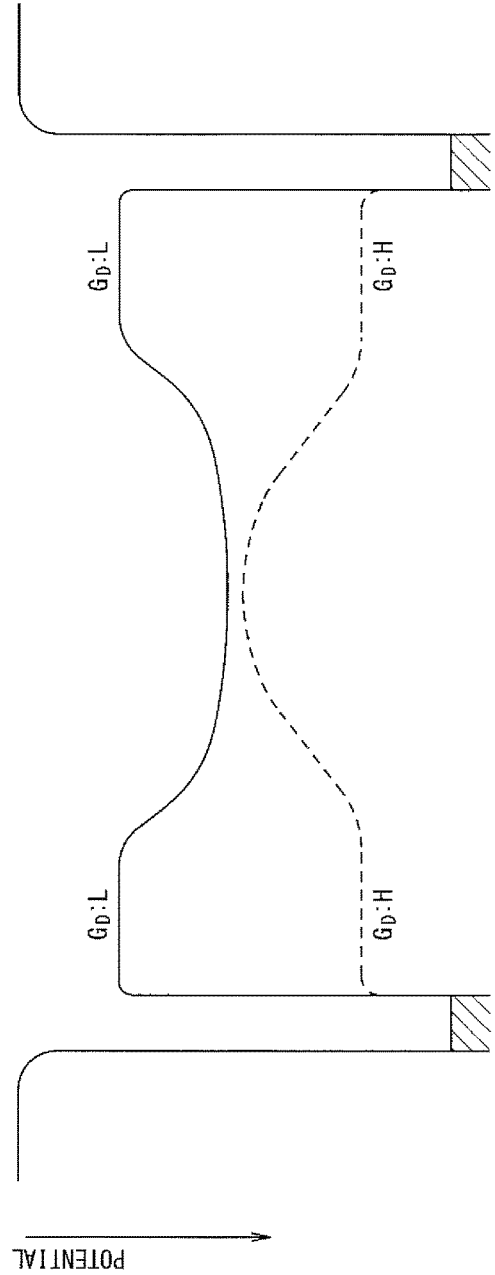
FIG. 23A
FIG. 23B

CHARGE MODULATION ELEMENT AND SOLID-STATE IMAGING DEVICE

TECHNICAL FIELD

The present invention relates to a charge-modulation element, sequentially transporting signal charges to three or more charge-accumulation regions, by selecting paths for the three or more charge-accumulation regions, the charges are implemented by electrons or holes. Furthermore, the present invention relates to a solid-state imaging device, in which a plurality of unit columns are periodically arrayed in one dimension or two dimensions, wherein the charge-modulation elements or equivalent structures of the charge-modulation elements are periodically arranged in each of the unit columns.

BACKGROUND ART

In a time-of-flight (TOF) range sensor configured to acquire a range image, by using TOF scheme, a potential just under a gate electrode of a MOS structure is controlled in a vertical direction (depth direction) of the MOS structure. For example, a CMOS distance-measuring element and a TOF image sensor using the CMOS distance-measuring element are disclosed in patent literature (PTL) 1. The CMOS distance-measuring element has a structure such that an n-type charge-generation buried region buried in a p-type semiconductor layer, a charge-transfer buried region, a charge-read-out buried region, an insulating film covering the charge-generation buried region and the charge-transfer buried region, a transfer gate electrode provided on the insulating film to transfer signal charges to the charge-transfer buried region, a read-out gate electrode provided on the insulating film to transfer the signal charges to the charge-read-out buried region. When pulse lights are irradiated to the charge-generation buried region in the CMOS distance-measuring element recited in PTL 1, light signals are converted to signal charges in a semiconductor layer just under the charge-generation buried region, and a distance to an object is measured from a distribution ratio of charges accumulated in the charge-transfer buried region.

The CMOS distance-measuring element or the TOF image sensor using the CMOS distance-measuring element has a problem of generation of noise or dark current caused by interface defects, interface states, or the like just under the transfer gate electrode. In addition, in the case of using the transfer gate electrode disclosed in PTL 1, a potential gradient over a long distance is difficult to control, and a substantially uniform electric field over a long distance of a charge transport path is practically difficult to maintain. For this reason, in the charge-modulation elements such as distance-measuring elements having long charge transport paths, carriers are stopped in the middle of the charge transport paths, and thus, there are issues such that expected performances of the charge-modulation element are difficult to achieve.

CITATION LIST

Patent Literature

PTL 1: WO 2007/119626 A

SUMMARY OF INVENTION

Technical Problem

An objective of the present invention is to provide a charge-modulation element capable of avoiding a problem of generation of noise or dark current, or a problem of deterioration in transport speed caused by interface defects or interface states in an interface of a semiconductor surface, facilitating control of potential distribution so as to maintain a substantially uniform electric field over a long distance of the charge transport path necessary for a TOF range sensor or the like, and to transport signal charges to a plurality of target regions, through long charge transport paths at a higher speed, in which charge transport paths are arranged in good symmetry, and further, to provide a solid-state imaging device with lower noise, higher resolution, and higher response speed, in which a plurality of the charge-modulation elements are arranged.

Solution to Problem

In order to achieve the objective, a first aspect of the present invention inheres in a charge-modulation element encompassing (a) a pixel constructing area including an active-area setting-layer of a first conductivity type, a surface buried region of a second conductivity type provided in an upper portion of the active-area setting-layer, and a pinning layer of the first conductivity type being in contact with a surface of the surface buried region, (b) an insulating film provided on the pixel constructing area, (c) a light-receiving area assigned at a central portion of the pixel constructing area, (d) first, second, third, and fourth charge-accumulation regions of the second conductivity type, having a higher impurity concentration than the active-area setting-layer, and being separated from each other at quadruple positions symmetric with respect to the center position of the light-receiving area, surrounding the light-receiving area, and (e) first, second, third, and fourth field-control electrode pairs being provided at positions surrounding the light-receiving area as pairs to both sides of respective charge transport paths, which extend from the center position of the light-receiving area on the insulating film to the respective first, second, third, and fourth charge-accumulation regions. In the charge-modulation element pertaining to the first aspect, depletion potentials of the surface buried region are sequentially changed, by periodically applying field-control pulses at different phases to the first, second, third, and fourth field-control electrode pairs, and thus, potential gradient for transporting the charges is generated in one of the charge transport paths, so that destinations of majority carriers generated in the surface buried region are sequentially controlled so as to elect one of the first, second, third, and fourth charge-accumulation regions.

A second aspect of the present invention inheres in a solid-state imaging device encompassing a plurality of active pixels arrayed on a same semiconductor chip, each of the active pixels including a plurality of charge-modulation elements pertaining to the first aspect, the charge-modulation elements are arranged in a matrix shape so as to establish an integrated structure. In the solid-state imaging device pertaining to the second aspect, in each of the charge-modulation elements, depletion potentials of the surface buried region are sequentially changed, by periodically applying field-control pulses at different phases to the first, second, third, and fourth field-control electrode pairs, and thus, potential gradient for transporting the charges is generated in one of the charge transport paths, so that destinations of majority carriers generated in the surface buried region are sequentially controlled so as to elect one of the first, second, third, and fourth charge-accumulation regions, thereby a range image is captured.

Advantageous Effects of Invention

According to the present invention, it is possible to achieve a charge-modulation element facilitating control of potential distribution for maintaining substantially uniform electric fields over a long distance of charge transport paths, so that signal charges can be transported to a plurality of target regions, through long charge transport paths, at higher speeds, in which the charge transport paths are arranged in good symmetry, thereby avoiding issues of generation of noises or dark currents or problems of deteriorations in transport speeds caused by interface defects or interface states in interfaces of semiconductor surfaces, and further it is possible to provide a solid-state imaging device with lower noise, higher resolution, and higher response speed, in which a plurality of the charge-modulation elements are arranged.

BRIEF DECRYPTION OF DRAWINGS

FIG. 1 is a schematic plan view (top diagram) illustrating an overview of a triple-output charge-modulation element according to a first embodiment of the present invention;

FIG. 2A is a schematic cross-sectional view illustrating a schematic structure of the triple-output charge-modulation element of the first embodiment as viewed from a direction IIA-IIA of FIG. 1, FIG. 2B is a view illustrating a potential distribution in a lower edge (bottom) of a conduction band as viewed at the level of a direction IIB-IIB of the cross-sectional view of FIG. 2A by using a voltage applied to the first field-control electrode as a parameter, and FIG. 2C is a view illustrating a change of potential distribution in an upper edge (top) of the valence band as viewed at the level of a direction IIC-IIC as a horizontal direction of the cross-sectional view of FIG. 2A by using the voltage applied to the first field-control electrode as a parameter;

FIG. 3A is a schematic cross-sectional view illustrating a schematic structure of the triple-output charge-modulation element of the first embodiment as viewed from a direction IIIA-IIIA of FIG. 1, and FIG. 3B is a view illustrating a potential distribution in a lower edge (bottom) of the corresponding conduction band by using voltages applied to the first to fourth field-control electrodes as parameters;

FIG. 4A is a schematic cross-sectional view illustrating a schematic structure of the triple-output charge-modulation element of the first embodiment as viewed from a direction IVA-IVA of FIG. 1, and FIG. 4B is a view illustrating a potential distribution in a lower edge (bottom) of the corresponding conduction band by using voltages applied to the first to fourth field-control electrodes as parameters;

FIG. 5 is a timing diagram illustrating operations of the triple-output charge-modulation element of the first embodiment of the present invention;

FIG. 6 is another timing diagram illustrating other operations of the triple-output charge-modulation element of the first embodiment of the present invention;

Figure 14:
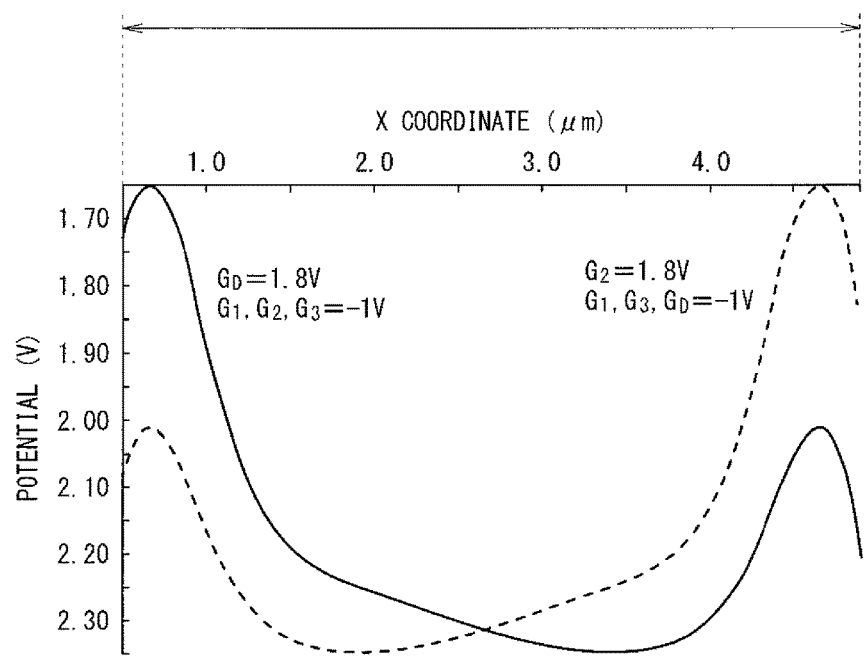
FIG. 14 is a view illustrating a potential distribution in a lower edge (bottom) of a conduction band in the triple-output charge-modulation element according to the modified example of the first embodiment as viewed in a direction XIV-XIV of FIG. 12 by using voltages applied to the first to fourth field-control electrodes as parameters.
Figure 15:
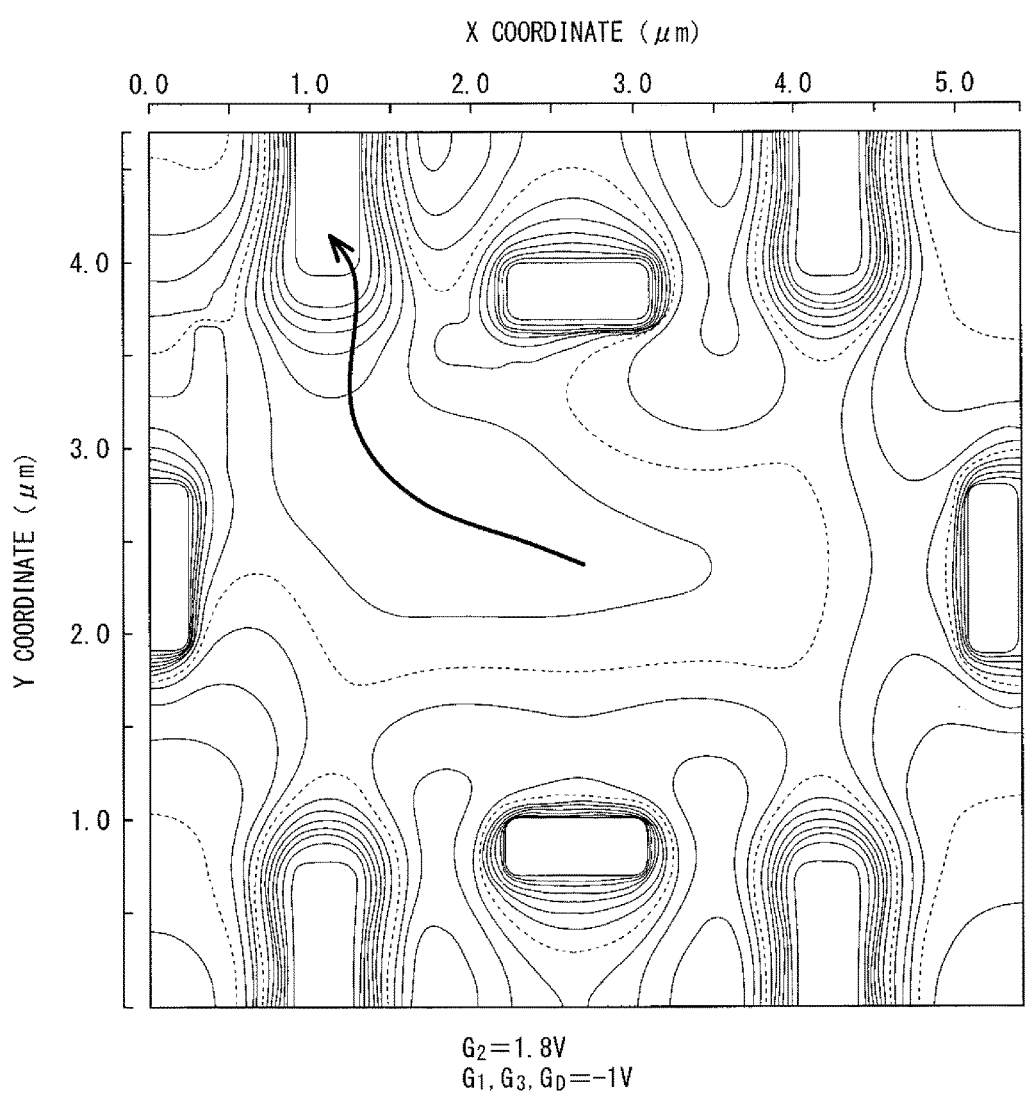
Figure 16:
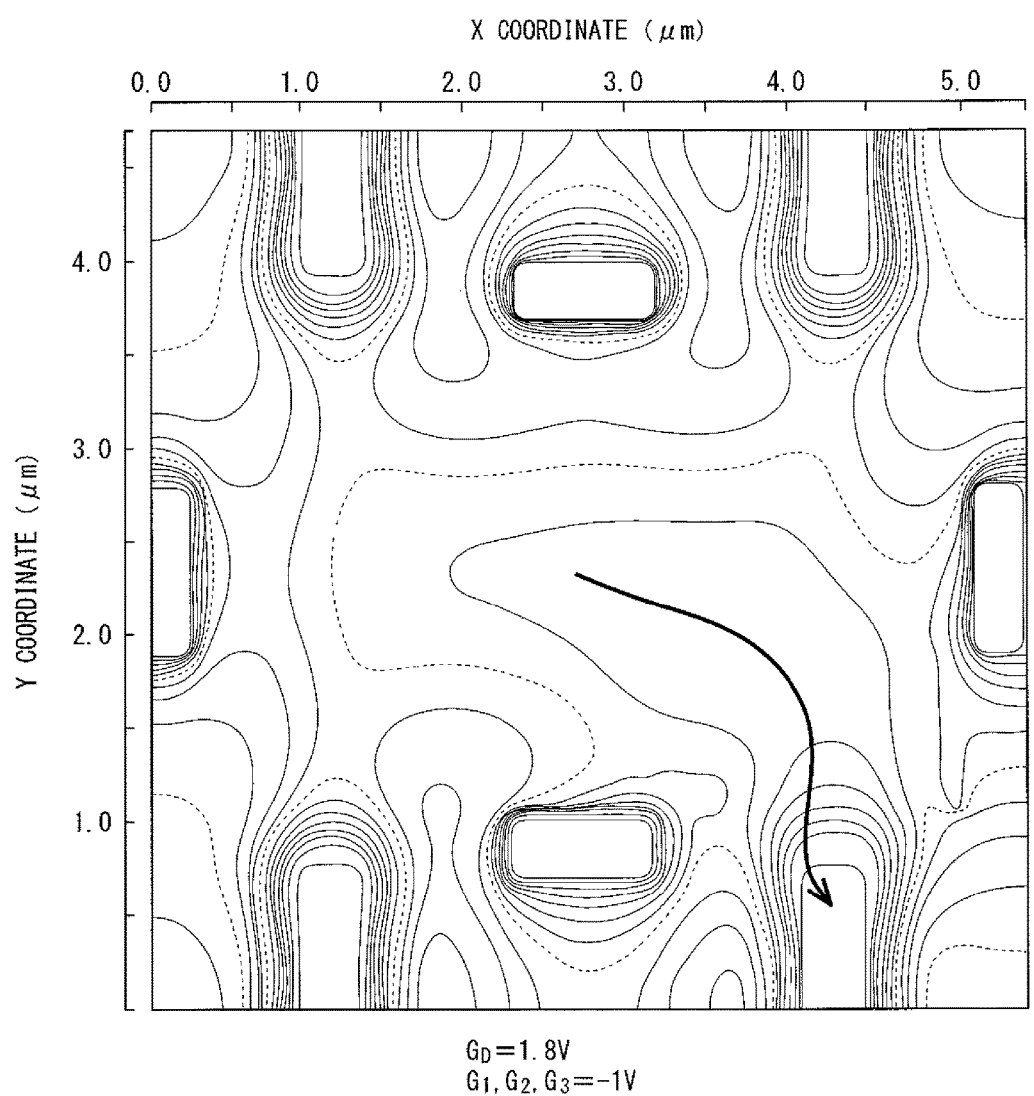
Figure 17:
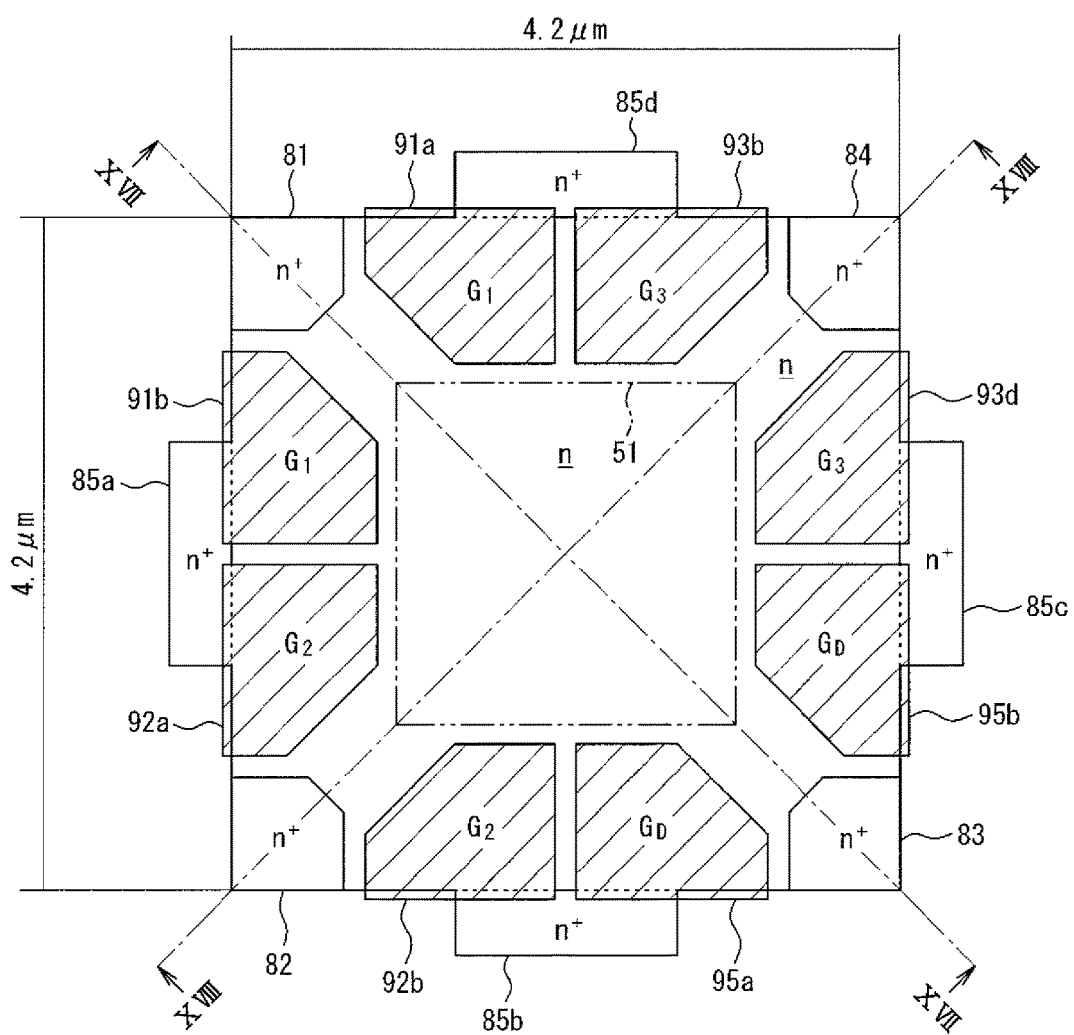
Figure 18:
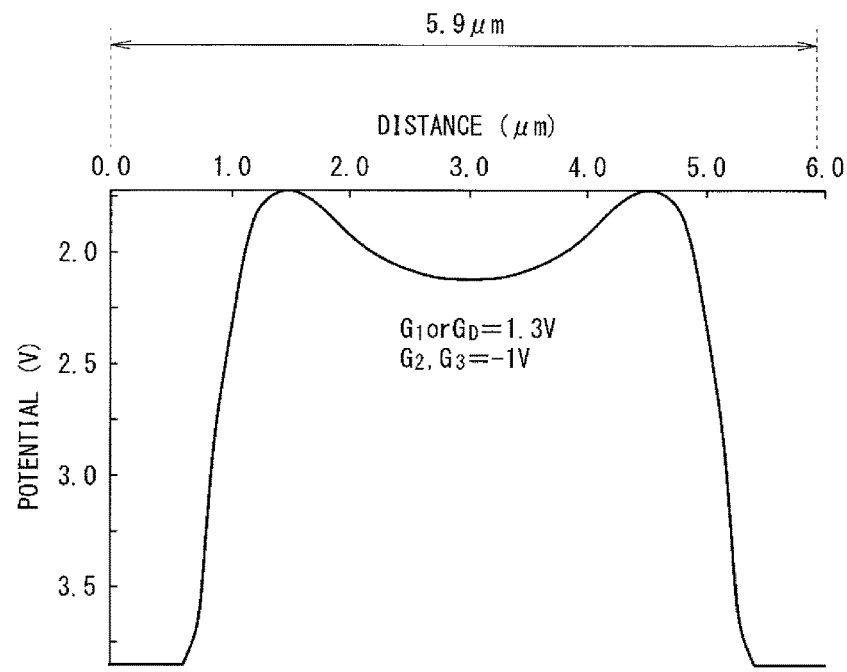
Figure 19:
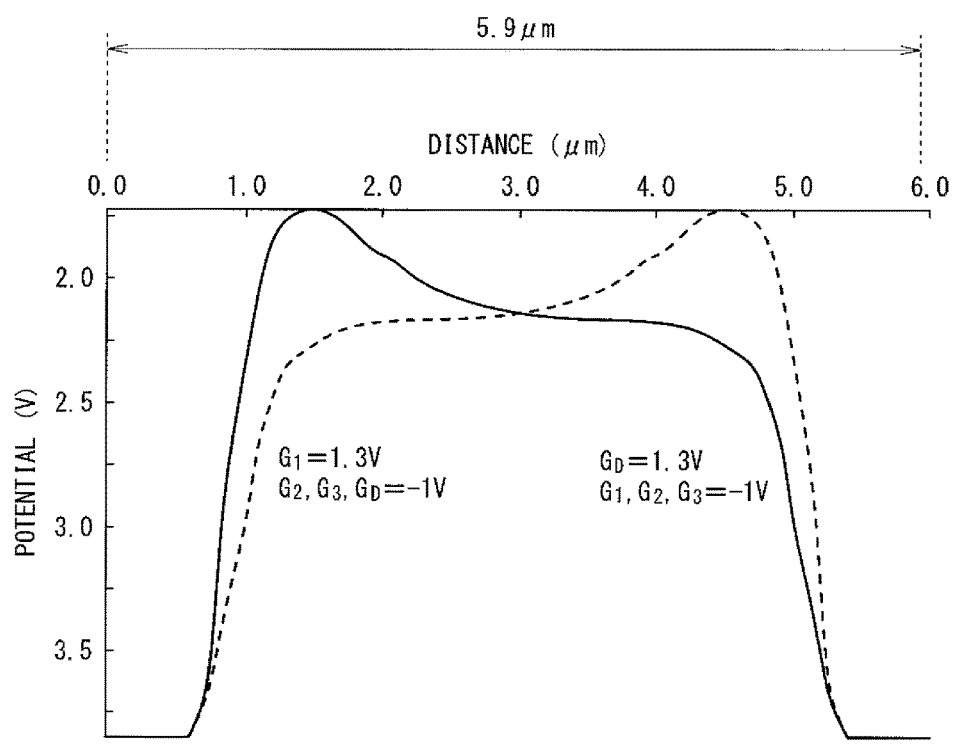
Figure 20:
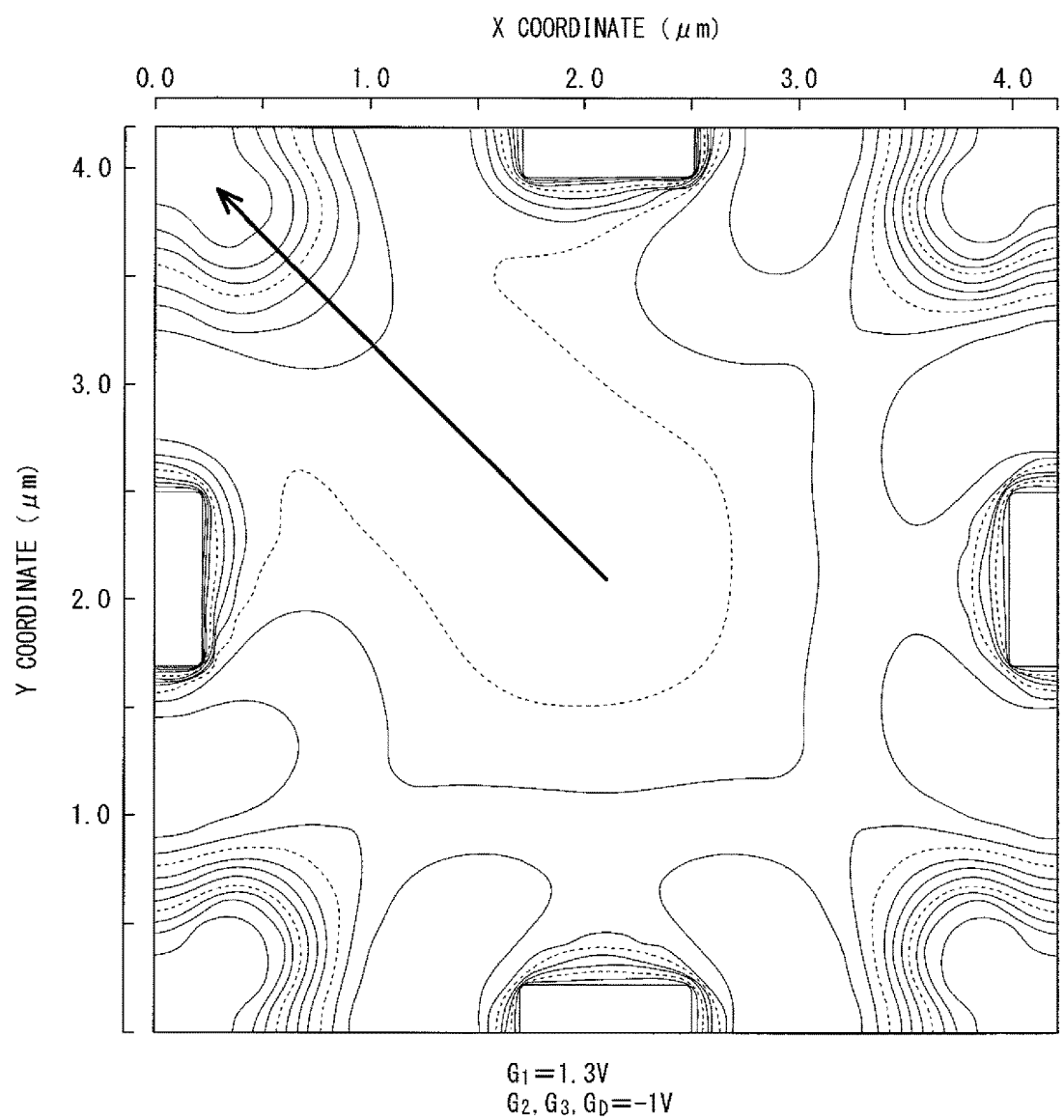
Figure 21:
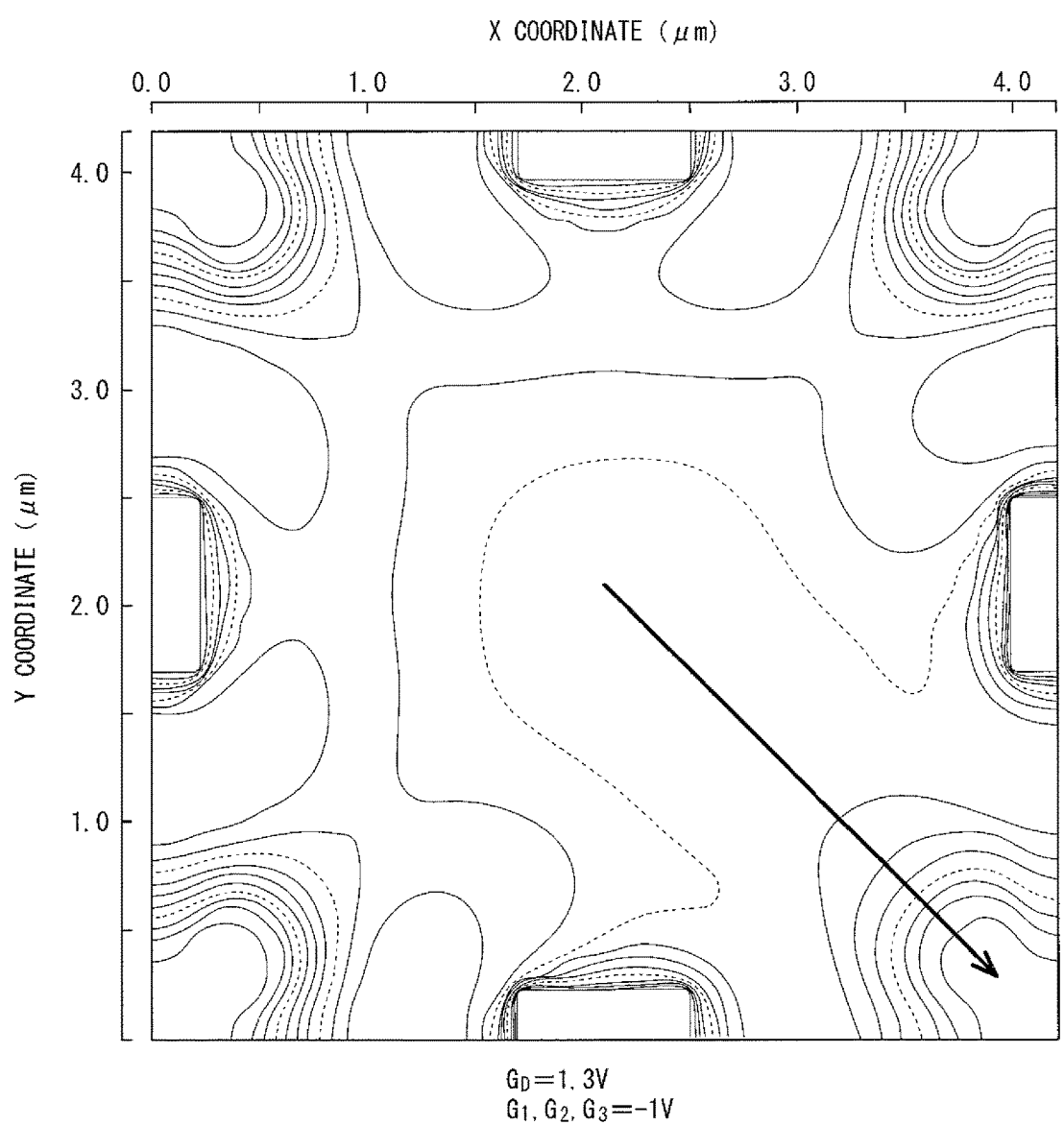
Figure 22:
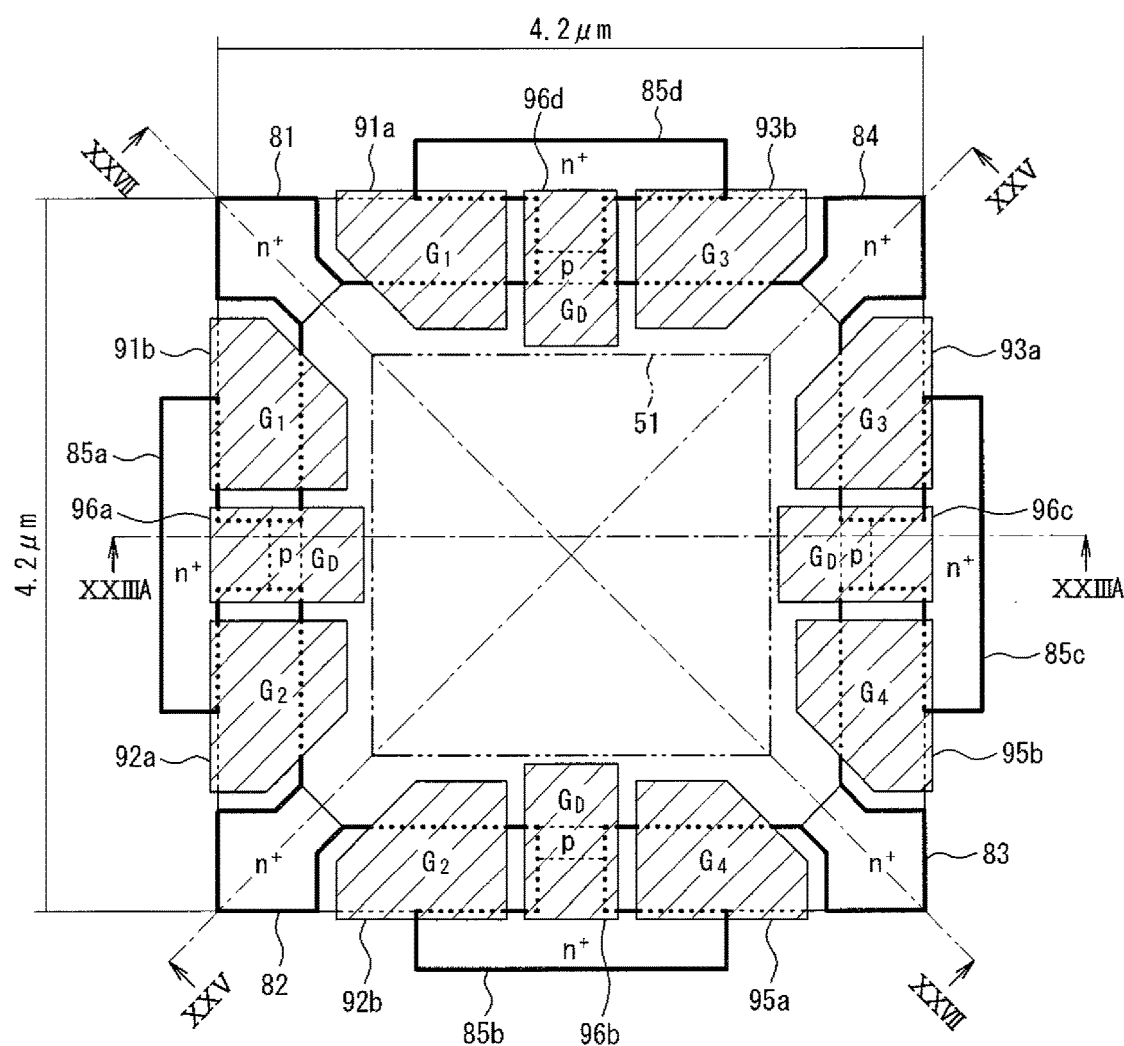
Figure 24:
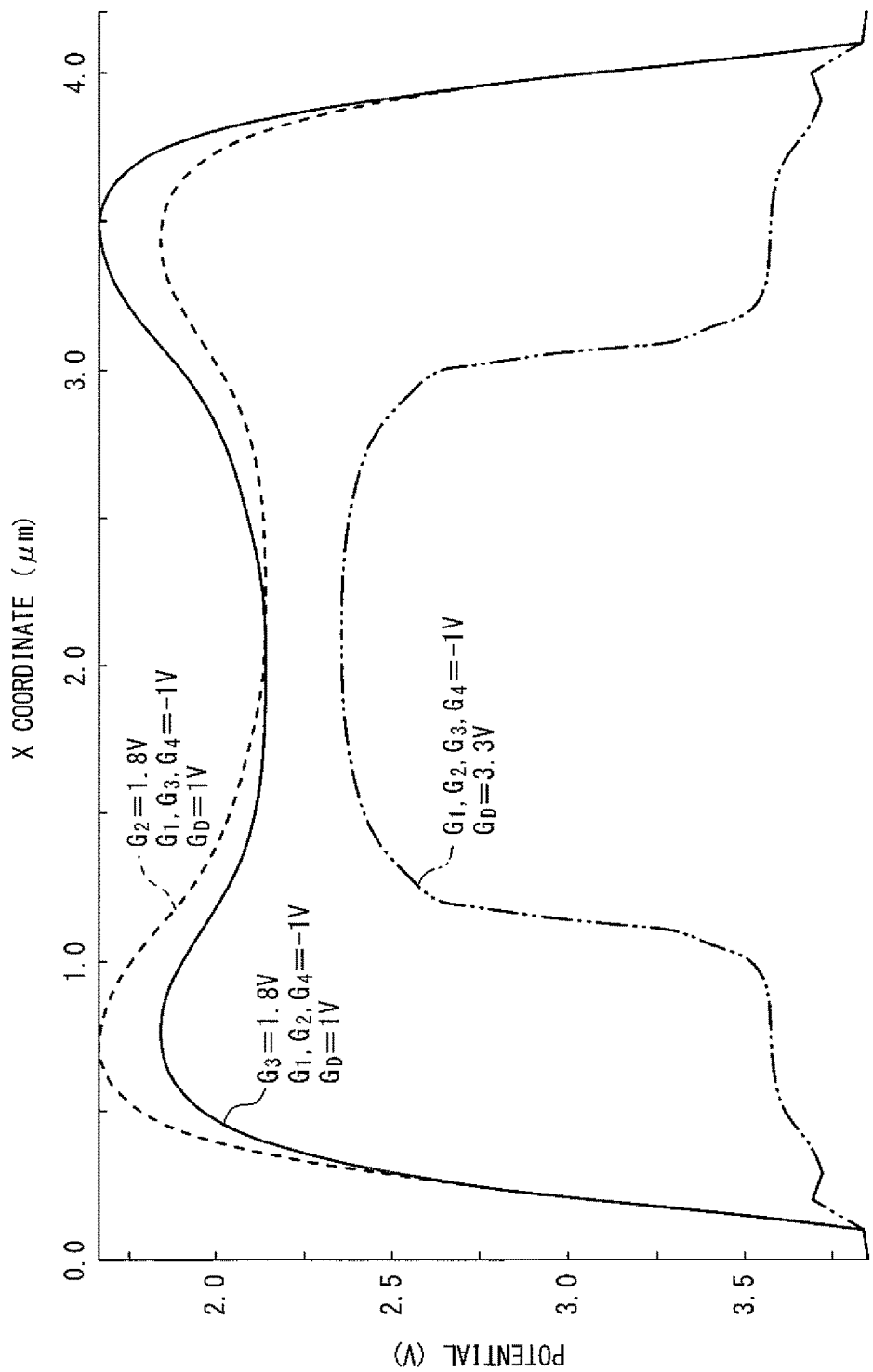
Figure 25A:
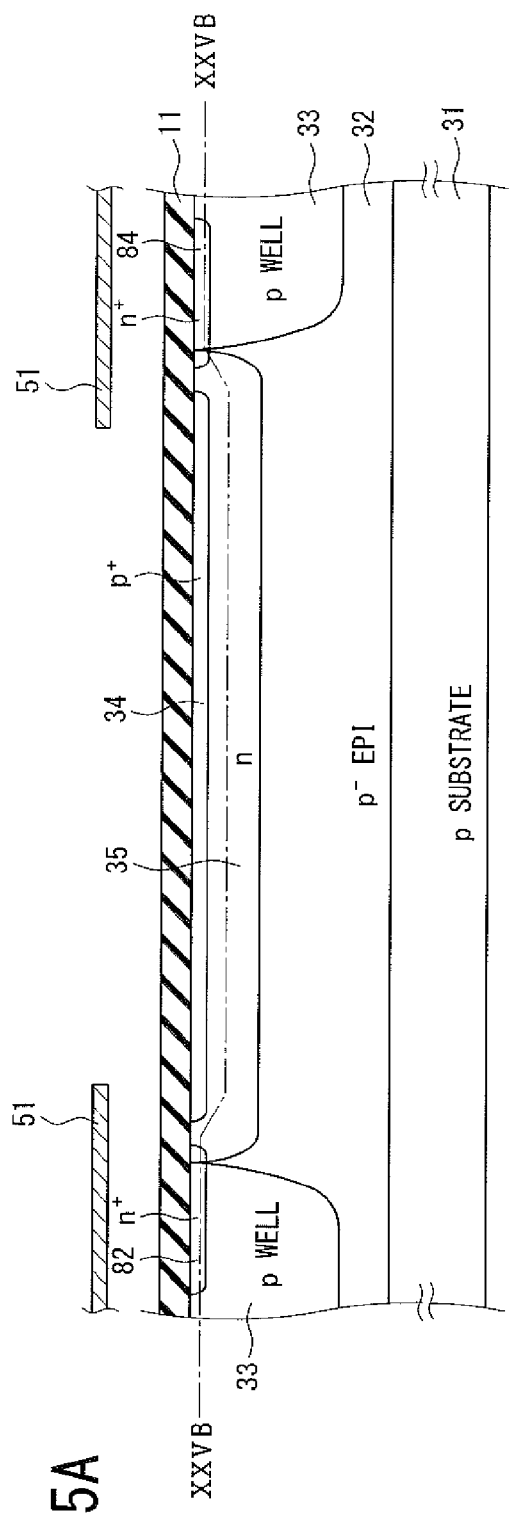
Figure 25B:
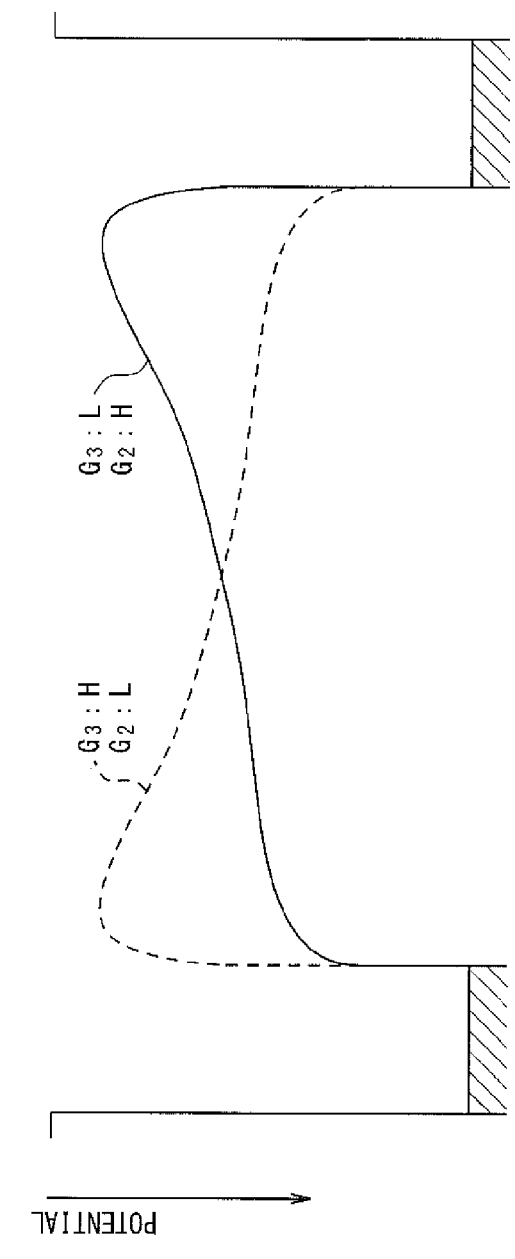
Figure 26:
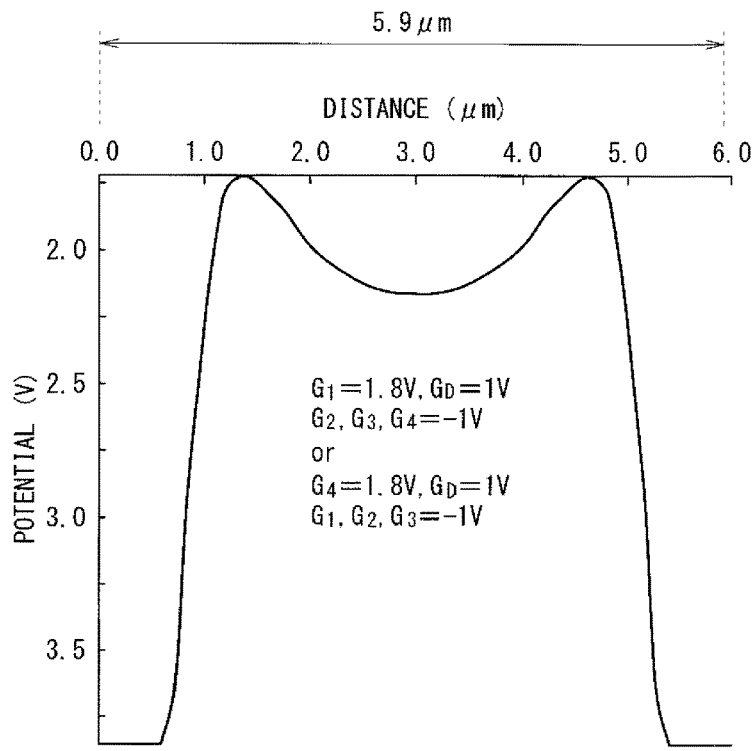
Figure 27:
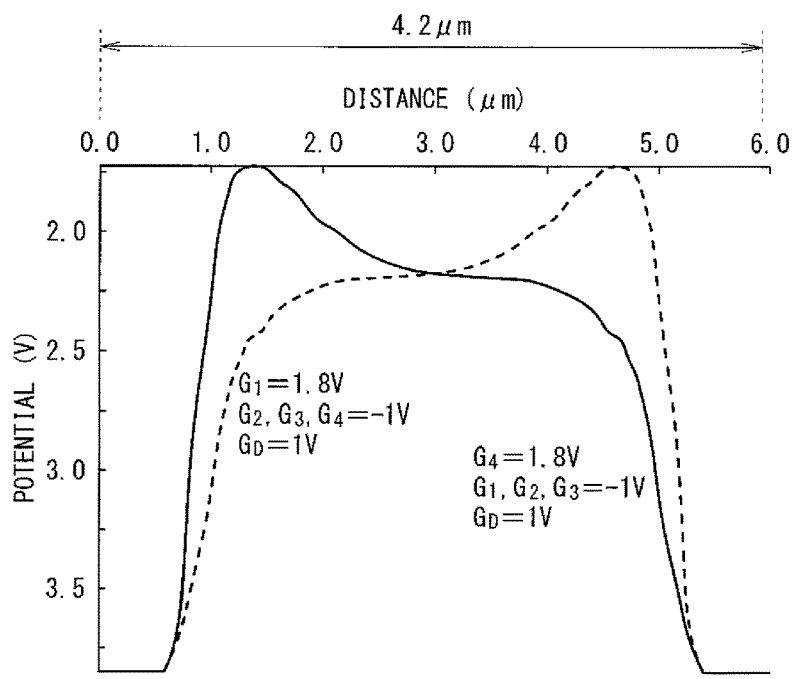
Figure 28:
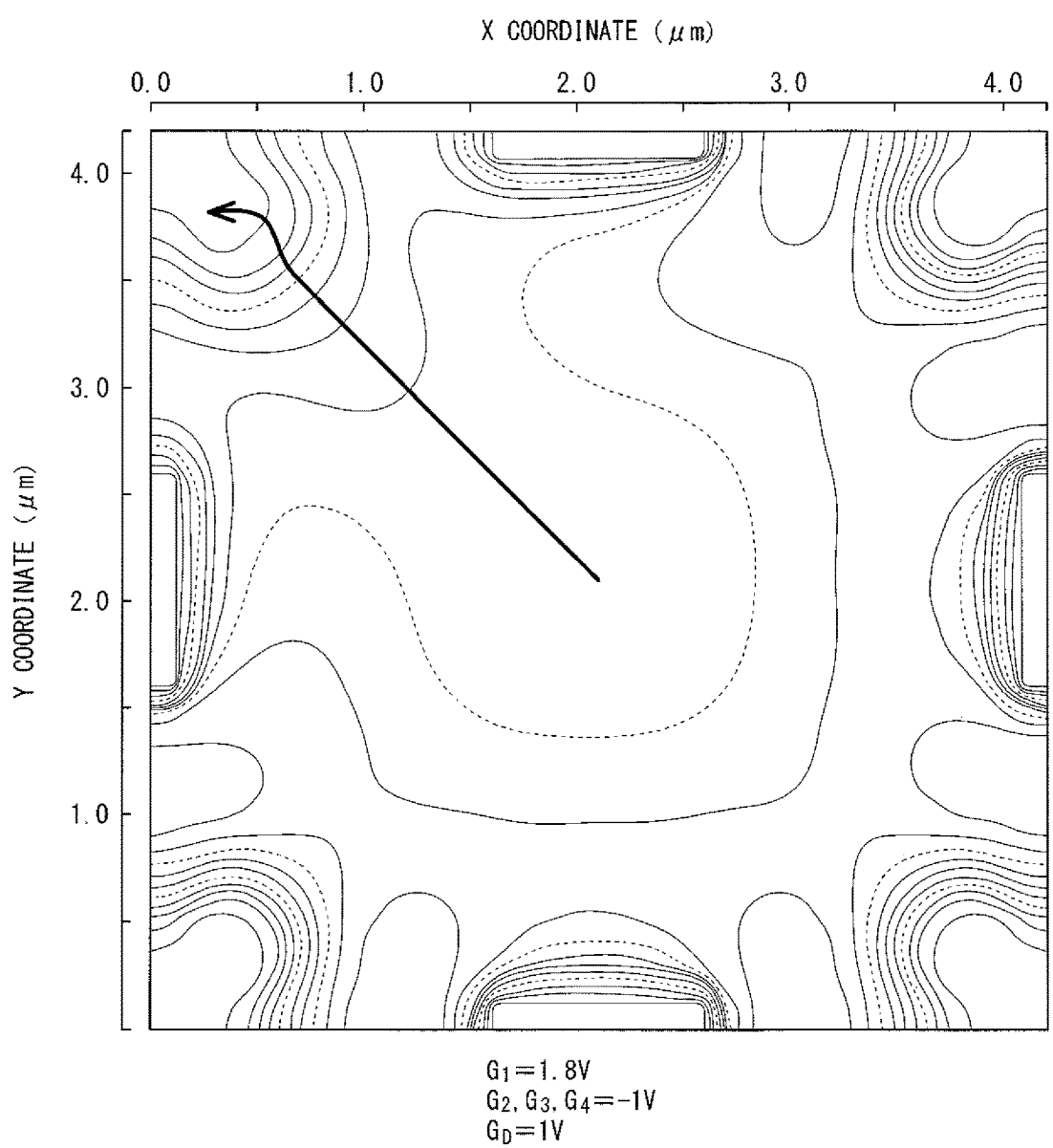
Figure 29:
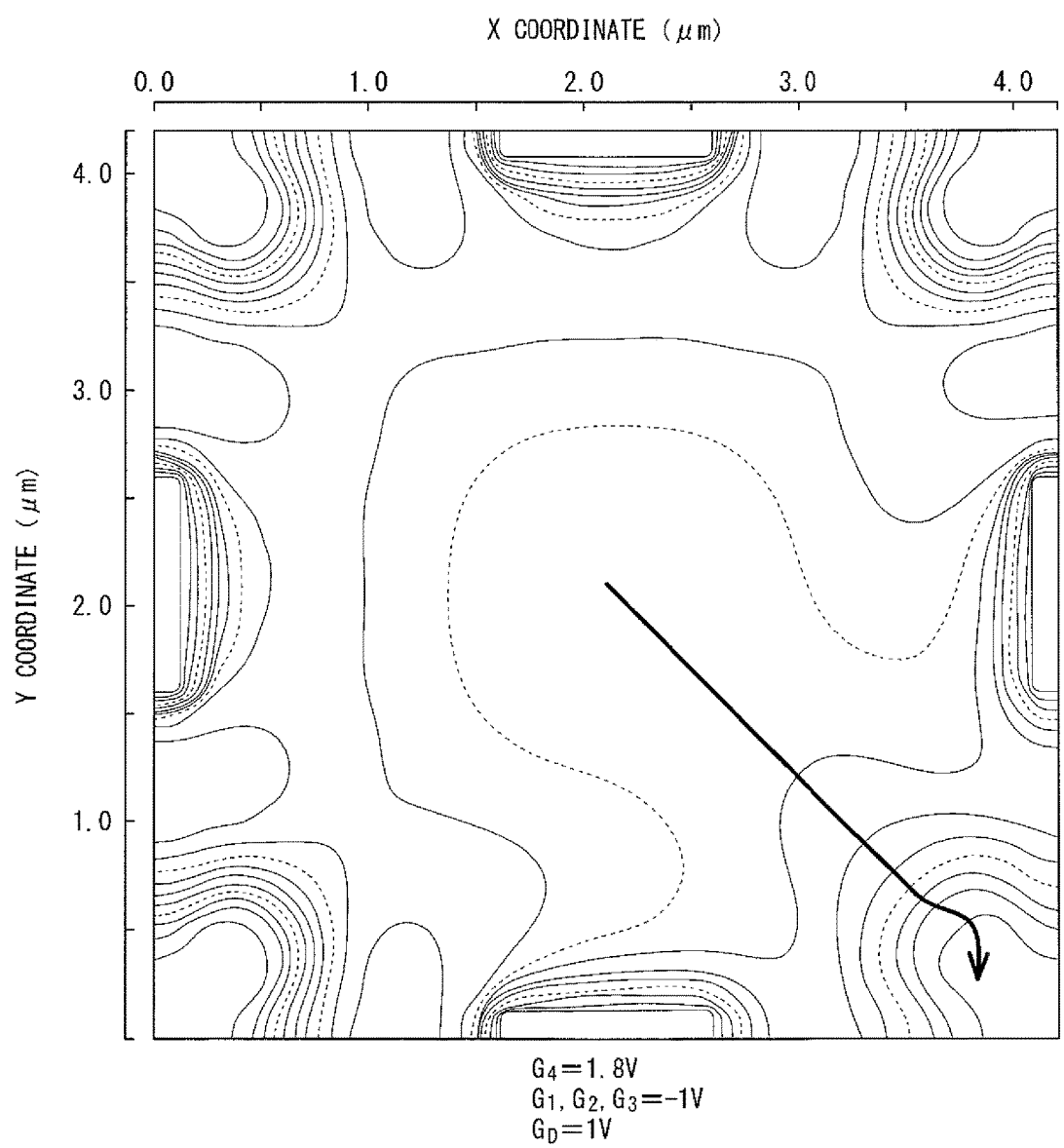
Figure 30:
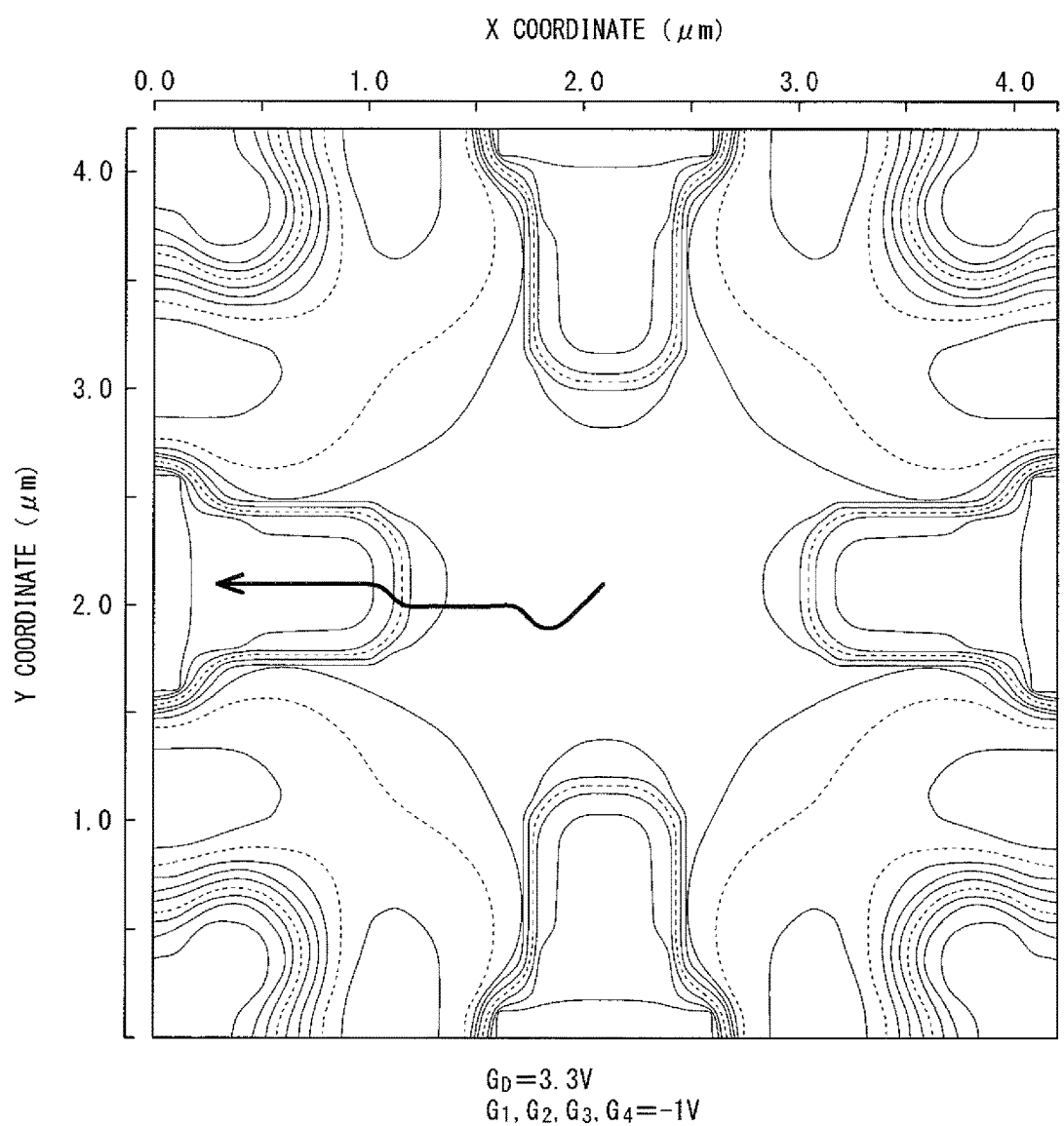
Figure 31:
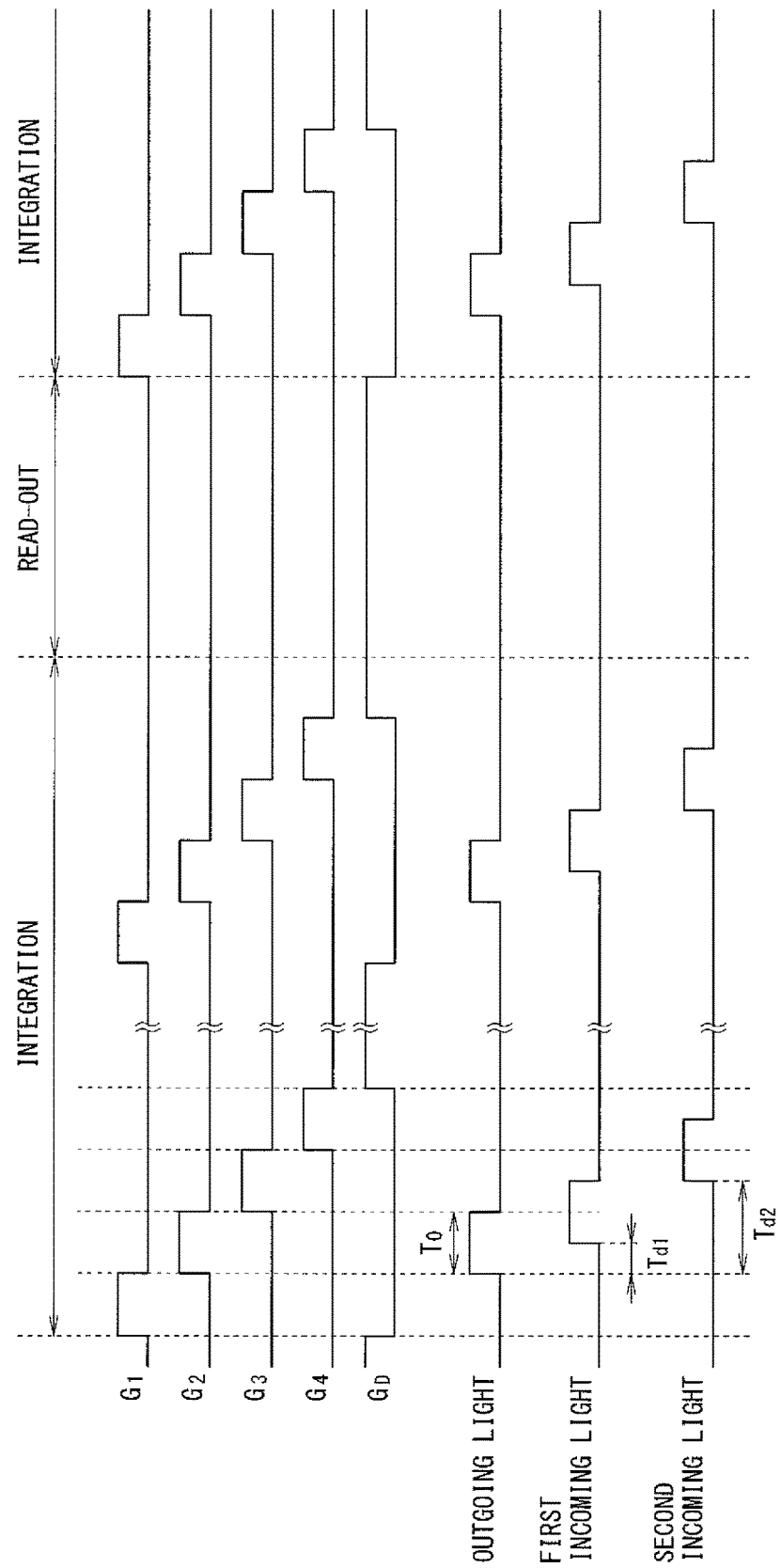
Figure 32:
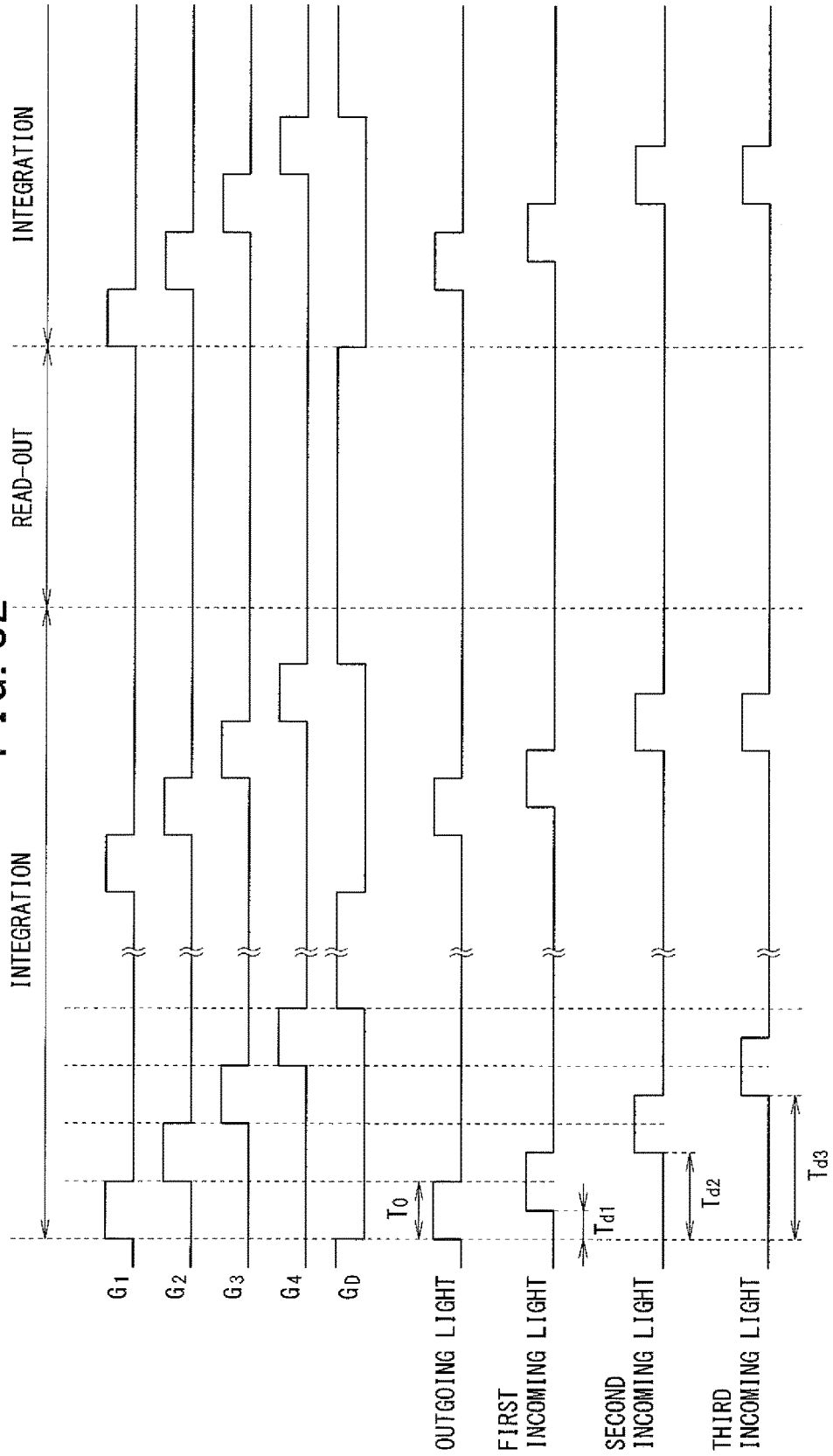
Figure 33:
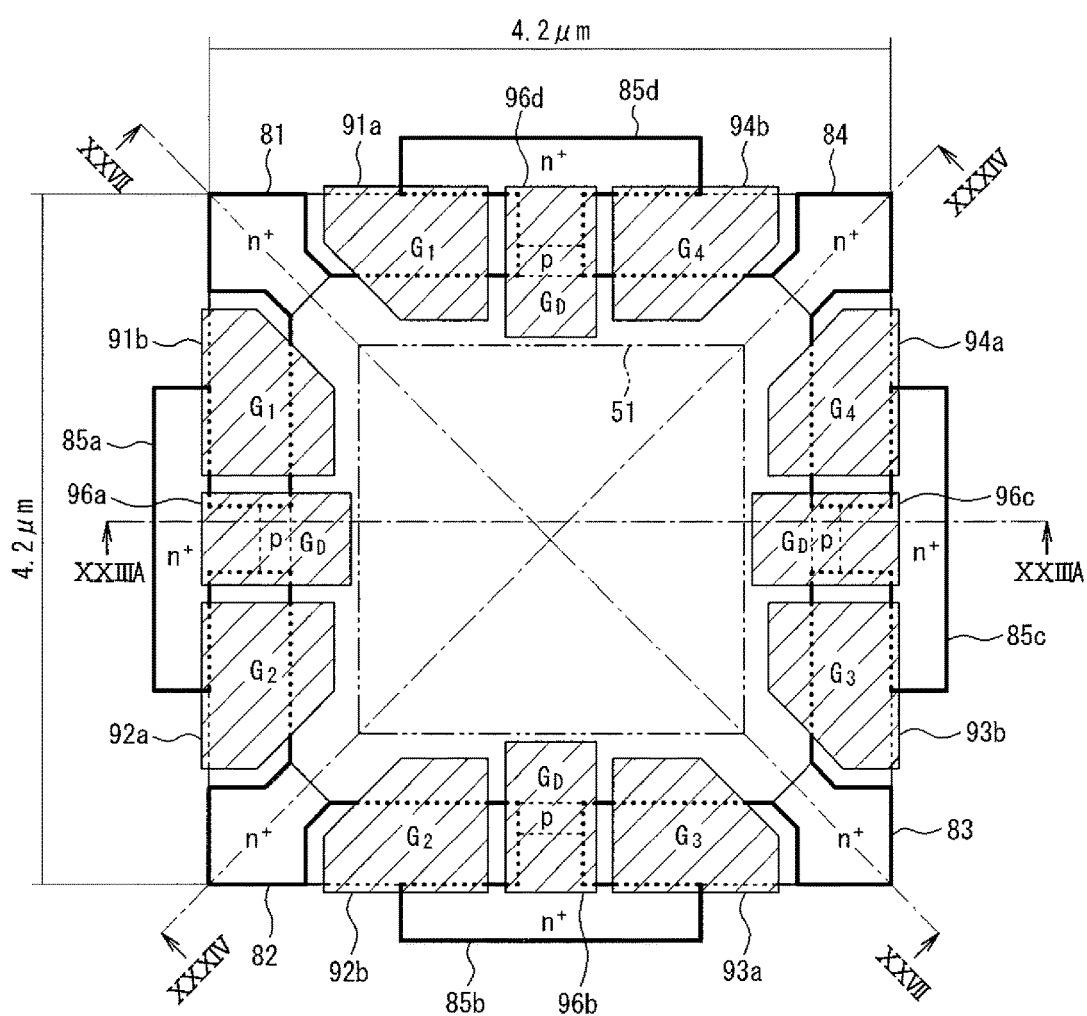
Figure 34A:
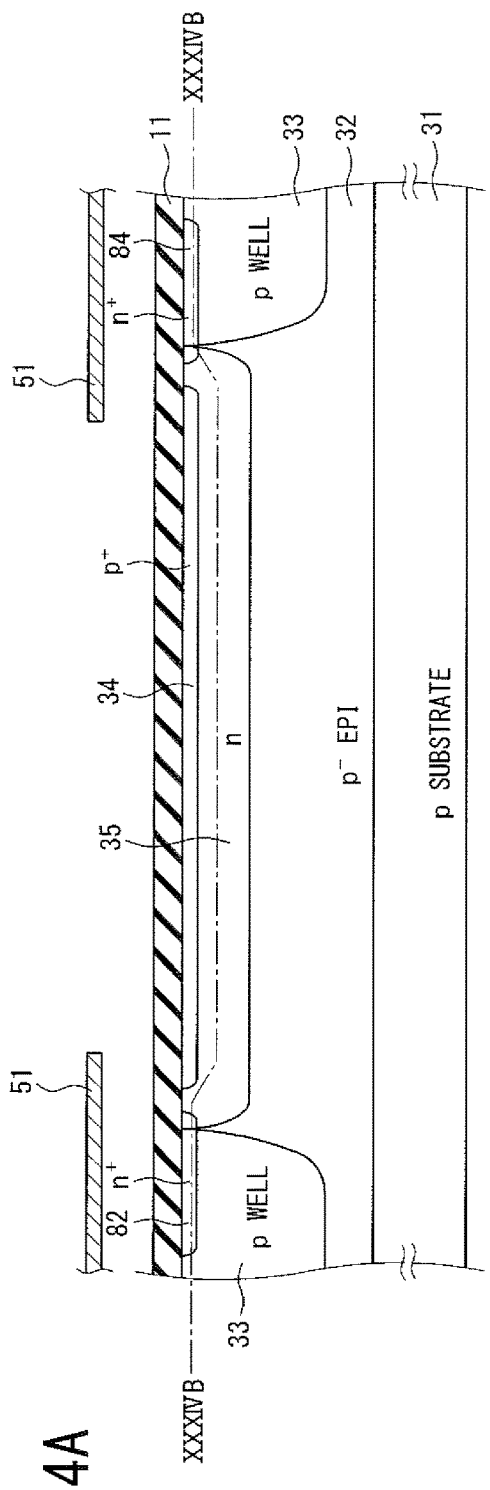
Figure 34B:
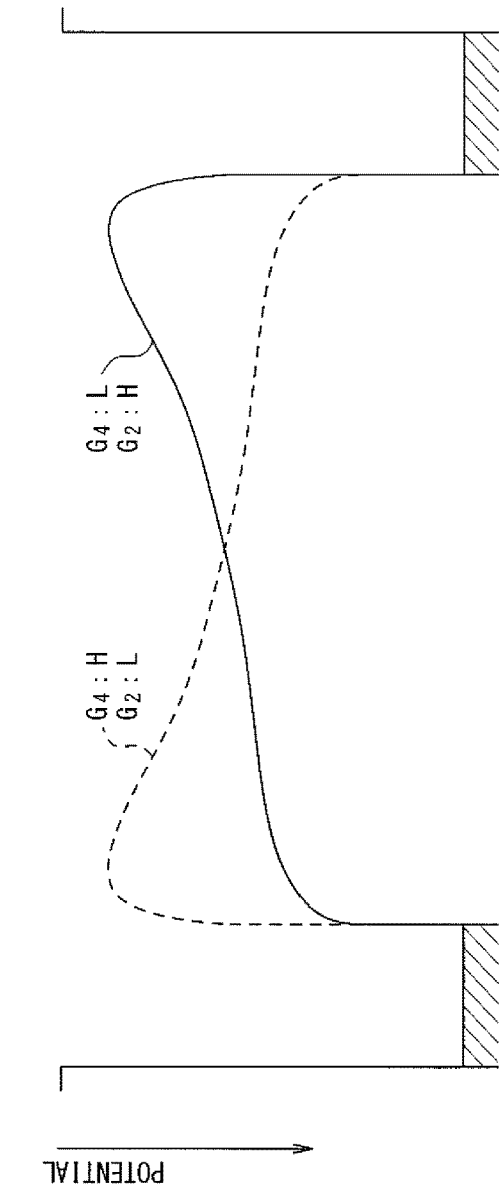
Figure 35:
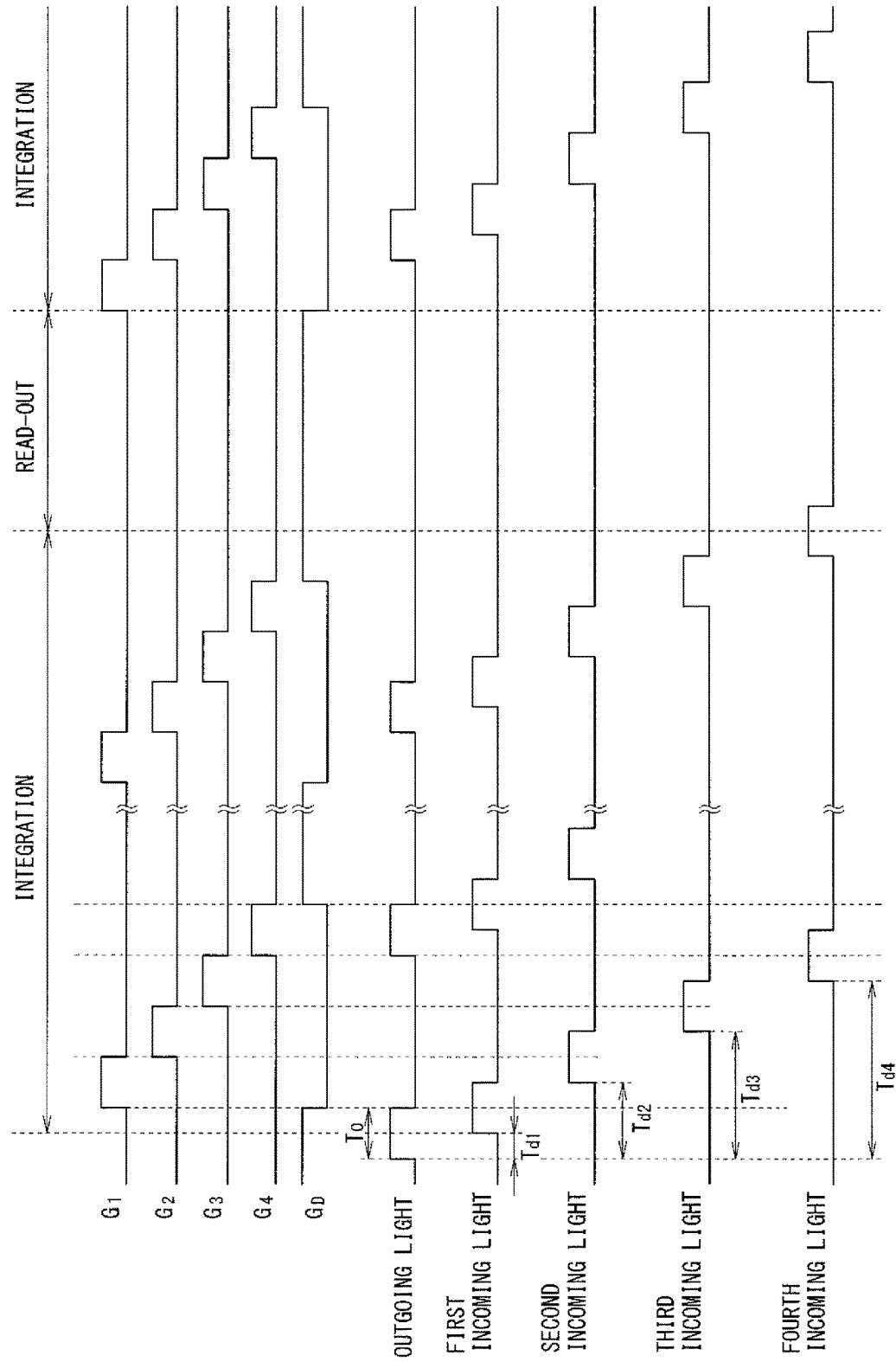

FIG. 15 is a view illustrating equipotential lines in the X-Y plane as viewed from a side above a pixel constructing area of the triple-output charge-modulation element according to the modified example of the first embodiment corresponding to the potential gradient represented by the solid line in FIG. 14 and a charge transport path of electrons set by a potential distribution of the equipotential lines;

FIG. 16 is a view illustrating equipotential lines in the X-Y plane as viewed from a side above a pixel constructing area of the triple-output charge-modulation element according to the modified example of the first embodiment corresponding to the potential gradient represented by the broken line in FIG. 14 and a charge transport path of electrons set by a potential distribution of the equipotential lines;

FIG. 17 is a schematic plan view (top diagram) illustrating an overview of a triple-output charge-modulation element according to a second embodiment of the present invention;

FIG. 18 is a view illustrating a potential distribution in a lower edge (bottom) of a conduction band in the triple-output charge-modulation element pertaining to the second embodiment as viewed in a direction XVIII-XVIII of FIG. 17 by using voltages applied to the first to fourth field-control electrodes as parameters;

FIG. 19 is a view illustrating a potential distribution in a lower edge (bottom) of a conduction band in the triple-output charge-modulation element pertaining to the second embodiment as viewed in a direction XVII-XVII of FIG. 17 by using voltages applied to the first to fourth field-control electrodes as parameters;

FIG. 20 is a view illustrating equipotential lines in the X-Y plane as viewed from a side above a pixel constructing area of the triple-output charge-modulation element pertaining to the second embodiment corresponding to the potential gradient represented by the broken line in FIG. 19 and a charge transport path of electrons set by a potential distribution of the equipotential lines;

FIG. 21 is a view illustrating equipotential lines in the X-Y plane as viewed from a side above a pixel constructing area of the triple-output charge-modulation element pertaining to the second embodiment corresponding to the potential gradient represented by the solid line in FIG. 19 and a charge transport path of electrons set by a potential distribution of the equipotential lines;

FIG. 22 is a schematic plan view (top diagram) illustrating an overview of a quadruple-output charge-modulation element according to a third embodiment of the present invention;

FIG. 23A is a schematic cross-sectional view illustrating a schematic structure of the quadruple-output charge-modulation element pertaining to the third embodiment as viewed from a direction XXIIIA-XXIIIA of FIG. 22, and FIG. 23B is a view illustrating a potential distribution in a lower edge (bottom) of a conduction band as viewed at the level of a direction XXIIIB-XXIIIB of the cross-sectional view of FIG. 23A by using voltages applied to the first and third charge transfer gate electrodes as parameters;

FIG. 24 is a view illustrating a result of simulation of the potential distribution illustrated in FIG. 23B, more specifically, by using the voltages applied to the first to fourth field-control electrode pairs as parameters;

FIG. 25A is a schematic cross-sectional view illustrating a schematic structure of the quadruple-output charge-modulation element pertaining to the third embodiment as viewed from a direction XXV-XXV of FIG. 22, and FIG. 25B is a view illustrating a potential distribution in a lower edge (bottom) of a conduction band as viewed at the level of a direction XXVB-XXVB of the cross-sectional view of FIG. 25A by using voltages applied to the first to fourth charge transfer gate electrodes as parameters;

FIG. 26 is a view illustrating a potential distribution in a lower edge (bottom) of a conduction band as viewed at the level of a direction XXV-XXV of FIG. 22 by using voltages applied to the first to fourth charge transfer gate electrodes as parameters;

FIG. 27 is a view illustrating a potential distribution in a lower edge (bottom) of a conduction band as viewed at the level of a direction XXVII-XXVII of FIG. 22 by using voltages applied to the first to fourth charge transfer gate electrodes as parameters;

FIG. 28 is a view illustrating equipotential lines in the X-Y plane as viewed from a side above a pixel constructing area of the quadruple-output charge-modulation element pertaining to the third embodiment corresponding to the potential gradient represented by the broken line in FIG. 27 and a charge transport path of electrons set by a potential distribution of the equipotential lines;

FIG. 29 is a view illustrating equipotential lines in the X-Y plane as viewed from a side above a pixel constructing area of the quadruple-output charge-modulation element pertaining to the third embodiment corresponding to the potential gradient represented by the solid line in FIG. 27 and a charge transport path of electrons set by a potential distribution of the equipotential lines;

FIG. 30 is a view illustrating equipotential lines in the X-Y plane as viewed from a side above a pixel constructing area of the quadruple-output charge-modulation element pertaining to the third embodiment corresponding to the potential gradient represented by the two-dot dashed line in FIG. 24 and a charge transport path of electrons set by a potential distribution of the equipotential lines, where the illustration is focused to only the charge transport path leading to the first charge-extraction auxiliary-region;

FIG. 31 is a timing diagram illustrating operations of the quadruple-output charge-modulation element pertaining to the third embodiment of the present invention;

FIG. 32 is another timing diagram illustrating other operations of the quadruple-output charge-modulation element pertaining to the third embodiment of the present invention;

FIG. 33 is a schematic plan view (top diagram) illustrating an overview of a quadruple-output charge-modulation element according to a fourth embodiment of the present invention;

FIG. 34A is a schematic cross-sectional view illustrating a schematic structure of the quadruple-output charge-modulation element pertaining to the fourth embodiment as viewed from a direction XXXIV-XXXIV of FIG. 33, and FIG. 34B is a view illustrating a potential distribution in a lower edge (bottom) of a conduction band as viewed at the level of a direction XXXIVB-XXXIVB of the cross-sectional view of FIG. 34A by using voltages applied to the first to fourth charge transfer gate electrodes as parameters; and FIG. 35 is a timing diagram illustrating operations of the quadruple-output charge-modulation element pertaining to the fourth embodiment of the present invention.

DESCRIPTION OF EMBODIMENTS

Hereinafter, first to fourth embodiments of the present invention will be described. In the drawings described hereinafter, the same or similar components are denoted by the same or similar reference numerals. It should be noted that the drawings are schematic and relationships of thickness and planar dimension, ratios of thicknesses of layers are different from those of actual relationships and ratios. Therefore, specific thicknesses or sizes should be determined, considering the following description. In addition, among the drawings, there are also included portions being different from each other in size relation and ratio. In the description of the first to fourth embodiments described hereinafter, the case where a first conductivity type is p-type and a second conductivity type is n-type is exemplarily described. However, the inverse relationship of the conductivity types may be selected, and the first conductivity type may be n-type and the second conductivity type may be p-type. In a case where the first conductivity type is p-type and the second conductivity type is n-type, carriers as signal charges are electrons. In a case where the first conductivity type is n-type and the second conductivity type is p-type, carriers as signal charges are holes. In addition, in the description hereinafter, directions "left and right" or "up and down" are merely defined for the convenience of description, and thus, this definition does not limit the technical spirit of the present invention. Therefore, for example, if the paper plane is rotated by 90 degrees, the "left and right" and the "up and down" are read in exchange. If the paper plane is rotated by 180 degrees, the "left" is changed to the "right", and the "right" is changed to the "left".

First Embodiment

Figure 1:
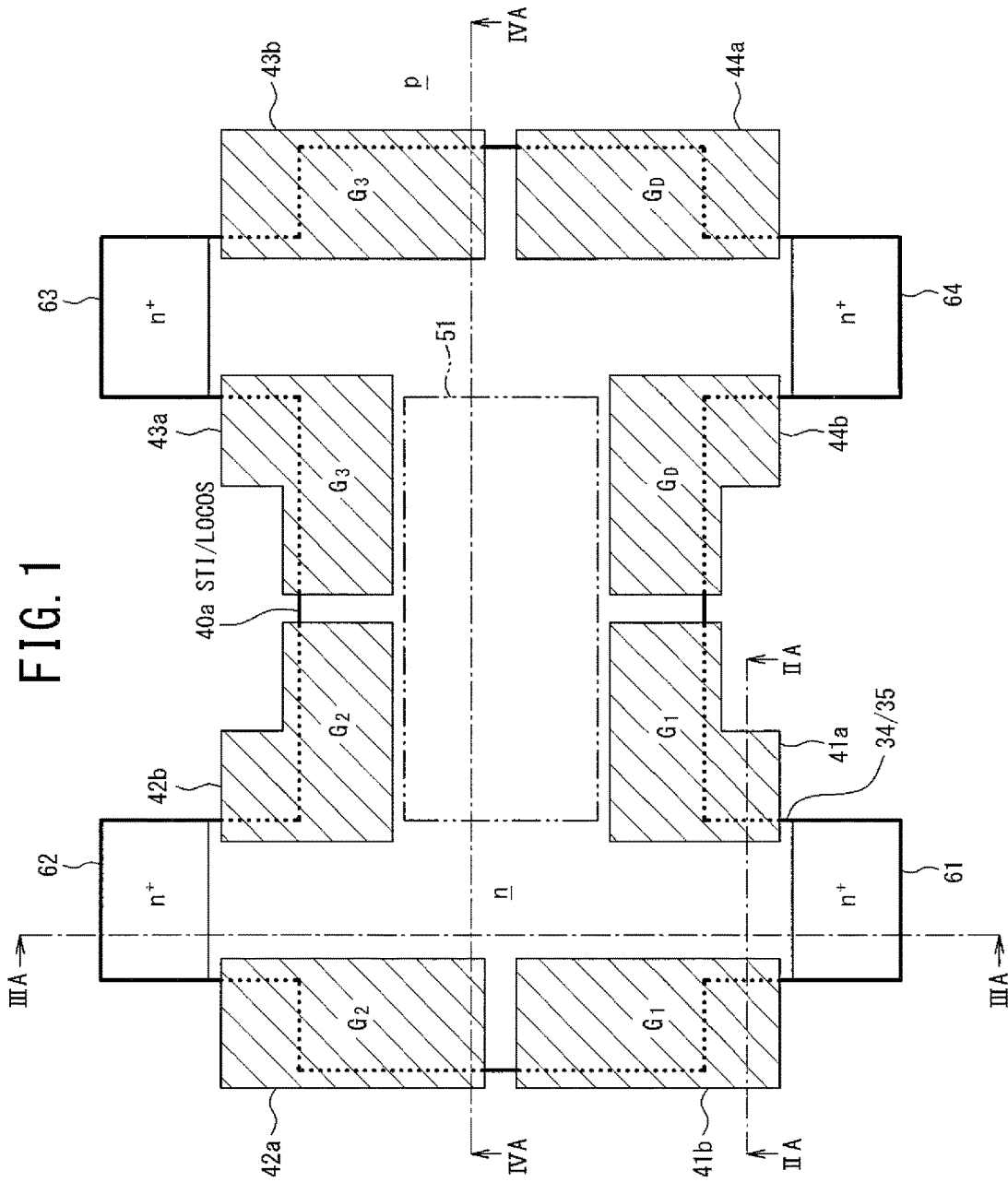
Figure 2A:
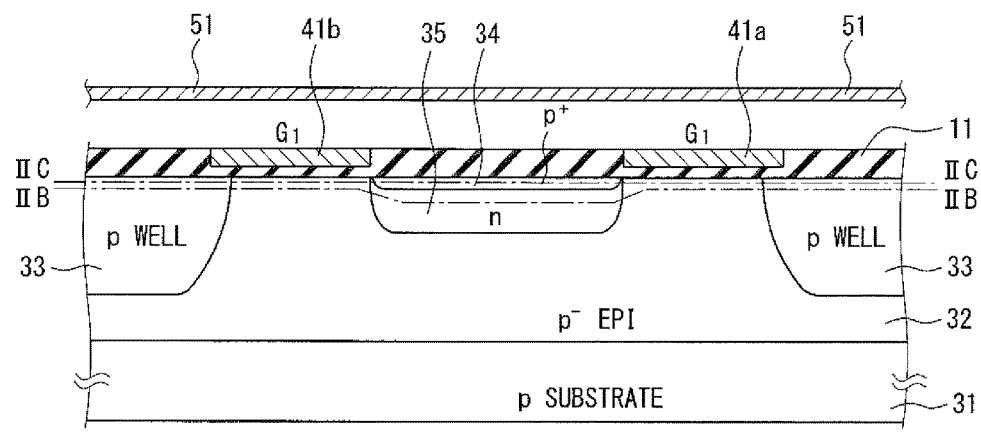

As illustrated in a plan view of FIG. 1 and a cross-sectional view of FIG. 2A or the like, a triple-output charge-modulation element according to a first embodiment of the present invention encompasses a pixel constructing area (32, 34, 35) including an active-area setting-layer 32 having a first conductivity type (p-type), a surface buried region 35 having a second conductivity type (n-type) provided in an upper portion of the active-area setting-layer 32, and a pinning layer 34 of p-type being in contact with a surface of the surface buried region 35, an insulating film 11 provided on the pixel constructing area (32, 34, 35), a light-receiving area which is assigned at a central portion of the pixel constructing area (32, 34, 35), a first charge-accumulation region 61, a second charge-accumulation region 62, a third charge-accumulation region 63, and a fourth charge-accumulation region 64 of n-type with a higher impurity concentration than the active-area setting-layer 32, being separated from each other at quadruple positions being symmetric with respect to a center position of the light-receiving area, surrounding the light-receiving area. And a first field-control electrode pair (41a, 41b), a second field-control electrode pair (42a, 42b), a third field-control electrode pair (43a, 43b), and a fourth field-control electrode pair (44a, 44b) are provided on the insulating film 11 at positions surrounding the light-receiving area. As pairs, the first field-control electrode pair (41a, 41b), the second field-control electrode pair (42a, 42b), the third field-control electrode pair (43a, 43b), and the fourth field-control electrode pair (44a, 44b) are arranged respectively on both sides of the charge transport paths, which extend from the center position of the light-receiving area to the respective first charge-accumulation region 61, second charge-accumulation region 62, third charge-accumulation region 63, and fourth charge-accumulation region 64.

Figures 3A, 3B:
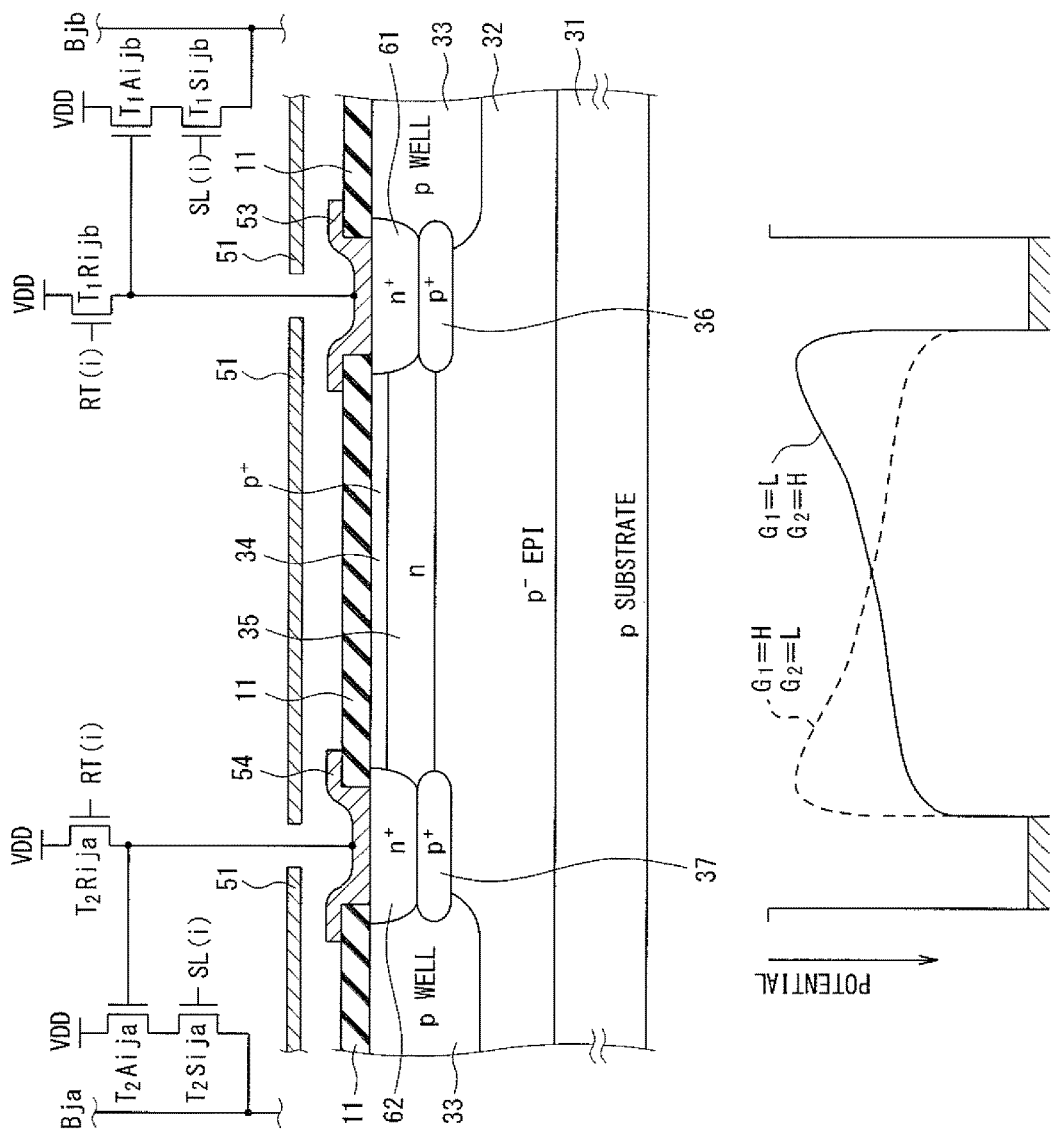
Figure 4A:
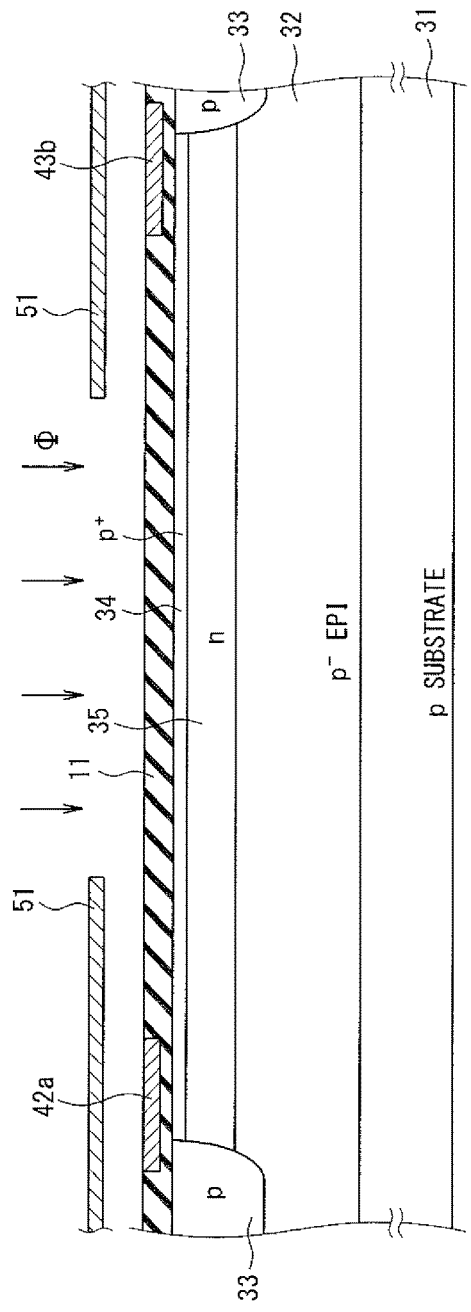
Figure 4B:
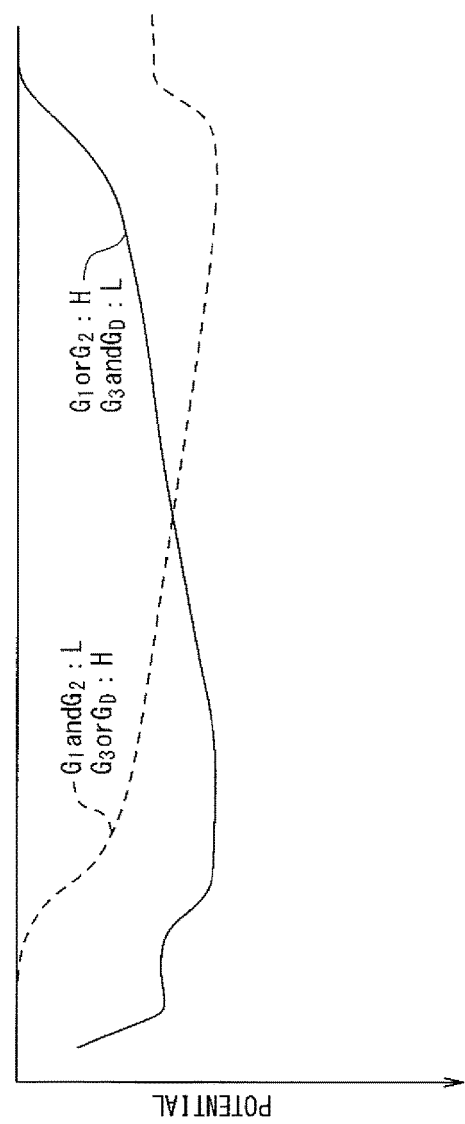

In the triple-output charge-modulation element of the first embodiment, depletion potentials of the surface buried region 35 are sequentially changed, by periodically applying field-control pulses at different phases illustrated in FIG. 5 to the first field-control electrode pair (41a, 41b), the second field-control electrode pair (42a, 42b), the third field-control electrode pair (43a, 43b), and the fourth field-control electrode pair (44a, 44b), thereby establishing sequentially potential gradients as illustrated in FIGS. 3B and 4B. Because the potential gradients facilitate majority carriers generated in the surface buried region 35 to be transported in one of the charge transport paths, the destinations of majority carriers are sequentially selected to one of the first charge-accumulation region 61, the second charge-accumulation region 62, the third charge-accumulation region 63, and the fourth charge-accumulation region 64. Namely, in the triple-output charge-modulation element of the first embodiment, charge modulation is performed by transporting photoelectrons generated in the light-receiving area along the H-shaped charge transport paths at a higher speed by electric field control in left and right directions and up and down directions of the letter H by using the first field-control electrode pair (41a, 41b), the second field-control electrode pair (42a, 42b), the third field-control electrode pair (43a, 43b), and the fourth field-control electrode pair (44a, 44b), which are quadruple gates performing the electric field control by static induction effect. The static induction effects are applied along the directions perpendicular to the respective charge transport paths.

As understood from the plan view of FIG. 1, the arrangement topology of the first charge-accumulation region 61, the second charge-accumulation region 62, the third charge-accumulation region 63, and the fourth charge-accumulation region 64 has a double rotational symmetry with respect to the center position of the light-receiving area. As viewed from a different side, the arrangement topology of the first charge-accumulation region 61 and the fourth charge-accumulation region 64 and the arrangement topology of the second charge-accumulation region 62 and the third charge-accumulation region 63 have mirror symmetry with respect to a horizontal line passing through the center position of the light-receiving area.

Each of the first charge-accumulation region 61, the second charge-accumulation region 62, and the third charge-accumulation region 63 illustrated in FIG. 1 acts as a charge read-out region accumulating majority carriers generated in the surface buried region 35 illustrated in FIGS. 2A, 3A, 4A, and the like as signal charges and reading out the signal charges, and the fourth charge-accumulation region 64 acts as a charge-extraction region extracting the charges of dark current component generated in the surface buried region 35 caused by background light. In addition, in FIG. 3A, a first block layer 36 and a second block layer 37 under the first charge-accumulation region 61 and the second charge-accumulation region 62, respectively are illustrated so that planar pattern viewed from the top is coincident with the first charge-accumulation region 61 and the second charge-accumulation region 62. In a case where incoming light arriving to the triple-output charge-modulation element of the first embodiment has a long wavelength, in the state that electrons generated at a deep position of the active-area setting-layer 32 are returned to the surface by diffusion, the first block layer 36 and the second block layer 37 are semiconductor regions for blocking portions of the electrons from being captured by the first charge-accumulation region 61 and the second charge-accumulation region 62. For this reason, even in a case where long-wavelength light such as near-infrared light is used, it is possible to suppress the influence of the returning of the electrons generated at a deep position of the active-area setting-layer 32 to the surface by diffusion on modulation characteristics in transporting the signal charges to the first charge-accumulation region 61 and the second charge-accumulation region 62. However, in a case where the wavelength of visible light or ultraviolet light is used, or in a case where the diffusion of the electrons generated at a deep position of the active-area setting-layer 32 to the surface does not cause a problem, the first block layer 36 and the second block layer 37 may be omitted according to the objective. In addition, for simplification of the manufacturing process, since it is preferable that the first block layer 36 and the second block layer 37 are not provided, the first block layer 36 and the second block layer 37 are not essential regions.

As illustrated in FIGS. 2A, 3A, 4A, and the like, an optical shielding plate 51 is further provided above the insulating film 11. Through an opening of the optical shielding plate 51, a planar pattern of the light-receiving area is defined at the central portion of the pixel constructing area (32, 34, 35), and the light-receiving area is selectively irradiated with light.

In the plan view of FIG. 1, the light-receiving area as an opening of the optical shielding plate 51 is defined in the central portion of the pixel constructing area (32, 34, 35), and a charge transport path is defined in the light-receiving area in the horizontal direction (X-direction). If the charge transport path running in the horizontal direction is assigned as the central bar of the letter H, and charge transport paths along the vertical direction (Y-direction) perpendicular to the charge transport path running in the horizontal direction can be assigned by both ends of the central bar. Therefore, in the plan view of FIG. 1, an H-shaped charge transport paths are defined. In addition, the first charge-accumulation region 61, the second charge-accumulation region 62, the third charge-accumulation region 63, and the fourth charge-accumulation region 64 are connected to the respective quadruple end portions of the H shape.

As illustrated in FIG. 1, one pair of the second field-control electrodes 42a and 42b is arranged in the upper side of the charge transport path running in the vertical direction allocated at the left side, through the insulating film 11 (see FIG. 3), on the pixel constructing area (32, 34, 35) on the planar pattern, interposing the charge transport path running in the vertical direction allocated at the left side. In addition, one pair of the first field-control electrodes 41a and 41b is arranged in the lower side of the charge transport path allocated at the left side, the charge transport path being defined between the first charge-accumulation region 61 and the second charge-accumulation region 62. The pair of the first field-control electrodes 41a and 41b is separated from and adjacent to the respective second field-control electrodes 42a and 42b. The pair of the first field-control electrodes 41a and 41b is arranged along the direction perpendicular to the charge transport path allocated at the left side, through the insulating film 11 on the pixel constructing area (32, 34, 35), on the planar pattern so as to interpose the charge transport path running in the vertical direction.

As illustrated in FIG. 1, one pair of the third field-control electrodes 43a and 43b is arranged in the upper side of the charge transport path running in the vertical direction allocated at the right side, through the insulating film 11, on the pixel constructing area (32, 34, 35) on the planar pattern so as to interpose the charge transport path running in the vertical direction allocated at the right side. In addition, one pair of the fourth field-control electrodes 44a and 44b is arranged in the lower side of the charge transport path allocated at the right side, along the charge transport path allocated at the right side, which is defined between the third charge-accumulation region 63 and the fourth charge-accumulation region 64. The pair of the fourth field-control electrodes 44a and 44b is separated from and adjacent to the respective third field-control electrodes 43a and 43b. The pair of the fourth field-control electrodes 44a and 44b is arranged along the direction perpendicular to the charge transport path allocated at the right side, through the insulating film 11 on the pixel constructing area (32, 34, 35), on the planar pattern so as to interpose the charge transport path running in the vertical direction. The third field-control electrode pair (43a, 43b) and the fourth field-control electrode pair (44a, 44b) are applied with different field-control voltages to change depletion potentials of the charge transport paths, so that transport directions of the signal charges being transported in the pixel constructing area (32, 34, 35) are sequentially controlled.

In addition, when attention is focused to the charge transport path running in the horizontal direction, the third and fourth field-control electrodes 43a and 44b are arranged as a pair at the right side of the charge transport path running in the horizontal direction so as to interpose the charge transport path running in the horizontal direction. In addition, the first field-control electrode 41a and the second field-control electrode 42b as a pair are arranged at the left side of the charge transport path running in the horizontal direction. Along the charge transport path running in the horizontal direction, the first field-control electrode 41a and the second field-control electrode 42b are separated from and adjacent to the respective third and fourth field-control electrodes 43a and 44b. As pair, the first field-control electrode 41a and the second field-control electrode 42b are arranged along the direction perpendicular to the charge transport path running in the horizontal direction on the planar pattern so as to interpose the charge transport path running in the horizontal direction.

At the beginning, the second, the third, and the fourth field-control pulses $G_2$, $G_3$, and $G_D$ with low voltages are applied to the respective second, third, and fourth field-control electrode pairs (42a, 42b), (43a, 43b), and (44a, 44b), and further the first field-control pulse $G_1$ with a high voltage is applied to the first field-control electrode pair (41a, 41b), so that the electrons generated in the light-receiving area can be moved along the central bar of the letter H in the left direction of FIG. 1, and further can be moved along the charge transport path which will pass through between the first field-control electrode pair (41a, 41b). Here, the light-receiving area is represented by the two-dot dashed line, which is labeled by reference numeral 51, in the central portion of FIG. 1.

The first field-control electrode pair (41a, 41b) and the second field-control electrode pair (42a, 42b) are applied with different field-control voltages by using the first field-control pulse $G_1$ and the second field-control pulse $G_2$ to change the depletion potentials of the charge transport paths, so that the potential gradients having different directions are generated as represented by the broken line and the solid line in FIG. 3B, and thus, transport directions of the signal charges being transported in the pixel constructing area (32, 34, 35) are sequentially controlled. In order to move the charges via the charge transport path, passing through between the first field-control electrode pair (41a, 41b) to the first charge-accumulation region 61, a potential gradient represented by the broken line in FIG. 3B may be formed. On the other hand, in order to move the charges via the charge transport path, passing through between the second field-control electrode pair (42a, 42b) to the second charge-accumulation region 62, a potential gradient represented by the solid line in FIG. 3B may be formed.

In order to efficiently change the depletion potential, as illustrated in the cross-sectional view of FIG. 2A, the thickness of the insulating film 11 in the portion just under the first field-control electrodes 41a and 41b as a pair is smaller than those of other portions, and the insulating film acts as a so-called "gate insulating film". Although not shown, the thickness of the insulating film 11 in the portion just under each of the second field-control electrodes 42a and 42b as a pair, the third field-control electrodes 43a and 43b as a pair, and fourth field-control electrodes 44a and 44b as a pair is also set to be smaller than those of other portions, and similarly, the insulating film acts as a gate insulating film.

Similarly, in a case where the electrons generated in the light-receiving area represented by the two-dot dashed line, being labeled by reference numeral 51, in the central portion of FIG. 1 are moved along the central bar of the letter H in the right direction of FIG. 1 and further moved to the charge transport path which passes through the third field-control electrode pair (43a, 43b), the first field-control pulse $G_1$, second field-control pulse $G_2$, and fourth field-control pulse $G_D$, and with low voltages are applied to the respective first field-control electrode pair (41a, 41b), the second field-control electrode pair (42a, 42b), and the fourth field-control electrode pair (44a, 44b) and the third field-control pulse $G_3$ with a high voltage is applied to the third field-control electrode pair (43a, 43b), so that a potential gradient represented by the broken line in FIG. 4B is generated.

As illustrated in the cross-sectional views of FIGS. 2A, 3A, and 4A, the pixel constructing area (32, 34, 35) illustrated in FIG. 1 includes the active-area setting-layer 32 made by a p-type semiconductor and the n-type surface buried region 35 provided in a portion of the upper portion of the active-area setting-layer 32, and thus, the electrons as majority carriers in the surface buried region 35 are transported as the signal charges in the surface buried region 35. The p-type pinning layer 34 is being in contact with the surface of the surface buried region 35 acting as the charge transport paths. As illustrated in the cross-sectional views of FIGS. 2A, 3A, and 4A, since the pixel constructing area (32, 34, 35) having a triple-layer structure is further formed on the p-type semiconductor substrate 31, the cross-sectional structure of the triple-output charge-modulation element of the first embodiment is actually a quadruple-layer structure.

In the cross-sectional views of FIGS. 2A, 3A, and 4A, a structure where the active-area setting-layer 32 is grown on the p-type semiconductor substrate 31 by epitaxial growth or the like is exemplified, but the active-area setting-layer 32 may be provided on the n-type semiconductor substrate 31. In addition, other layers may be included between the active-area setting-layer 32 and the semiconductor substrate 31 or the like, so that a quintuple-or-more-layered structure may be formed. In the pinning layer 34, the density of holes as carriers having a conductivity type opposite to that of the signal charges is changed by voltages applied to the first field-control electrode pair (41a, 41b), the second field-control electrode pair (42a, 42b), the third field-control electrode pair (43a, 43b), and the fourth field-control electrode pair (44a, 44b) together with a change in depletion potential of the charge transport path.

Although the insulating film 11 is not illustrated in the plan view of FIG. 1, as illustrated in the cross-sectional view of FIG. 2A, it can be understood that one pair of the first field-control electrodes 41a and 41b is arranged on the semiconductor region (32, 34, 35) through the insulating film 11 along the direction perpendicular to the transport direction of the signal charges so as to interpose the surface buried region 35 acting as the charge transport path. In addition, although the cross-sectional structure of the second field-control electrodes 42a and 42b side is omitted in illustration, as illustrated in the cross-sectional view of FIG. 2A, one pair of the second field-control electrodes 42a and 42b is also arranged on the semiconductor region (32, 34, 35) through the insulating film 11 so as to interpose the surface buried region 35 acting as the charge transport path.

Although the aperture as the opening of the optical shielding plate 51 is illustrated by a rectangular two-dot dashed line in the plan view of FIG. 1, since the cross-sectional views illustrated in FIGS. 2A and 3B correspond to the cross-sections at positions deviated from the light-receiving area, a structure where the entire surface of the charge transport path is shielded by the optical shielding plate 51 is illustrated. In the plan view of FIG. 1, a portion of the p-type active-area setting-layer 32 positioned just under the inner portion of the aperture illustrated by the rectangular two-dot dashed line and a portion of the n-type surface buried region 35 implement a buried photodiode region. In FIG. 1, the first field-control electrode pair (41a, 41b), the second field-control electrode pair (42a, 42b), the third field-control electrode pair (43a, 43b), and the fourth field-control electrode pair (44a, 44b) are arranged to surround the buried photodiode region acting as the light-receiving area just under the aperture, and thus, when the voltages which are to be applied to the first field-control electrode pair (41a, 41b), the second field-control electrode pair (42a, 42b), the third field-control electrode pair (43a, 43b), and the fourth field-control electrode pair (44a, 44b) are changed, the depletion potentials of the surface buried region 35 can be changed so as to form the charge transport paths.

As illustrated in FIG. 3A, the gate electrode of a first signal read-out transistor (amplifying transistor) $T_1A_{ijb}$ is connected through a contact window cut in the insulating film 11 to the first charge read-out region 61. The drain electrode of the first signal read-out transistor (amplifying transistor) $T_1A_{ijb}$ is connected to a power supply VDD, and the source electrode is connected to the drain electrode of a first switching transistor $T_1S_{ijb}$ for pixel selection. The source electrode of the first switching transistor $T_1S_{ijb}$ for pixel selection is connected to a vertical signal line $B_{jb}$, and the gate electrode is applied with a select-control signal SL(i) of the horizontal line from a vertical shift register 23 illustrated in FIG. 9. By setting the select-control signal SL(i) to the high (H) level, the first switching transistor $T_1S_{ijb}$ is turned on, and the current corresponding to the potential of the first charge read-out region 61 amplified by the first signal read-out transistor $T_1A_{ijb}$ is flowed in the vertical signal line $B_{jb}$. In addition, the source electrode of a first reset transistor $T_1R_{ijb}$ is connected to the first charge read-out region 61. The drain electrode of the first reset transistor $T_1R_{ijb}$ is connected to the power supply VDD, and the gate electrode of the first reset transistor $T_1R_{ijb}$ is applied with a reset signal $RT_1(i)$ from the vertical shift register 23 illustrated in FIG. 9. By setting the reset signal $RT_1(i)$ to the high (H) level, the first reset transistor $T_1R_{ijb}$ extracts the charges accumulated in the first charge read-out region 61 to reset the first charge read-out region 61.

On the other hand, the gate electrode of a second signal read-out transistor (amplifying transistor) $T_2A_{ija}$ is connected through a contact window cut in the insulating film 11 to the second charge read-out region 62. The drain electrode of the second signal read-out transistor (amplifying transistor) $T_2A_{ija}$ is connected to the power supply VDD, and the source electrode is connected to the drain electrode of a second switching transistor $T_2S_{ija}$ for pixel selection. The source electrode of the second switching transistor $T_2S_{ija}$ for pixel selection is connected to a vertical signal line $B_{ja}$, and the gate electrode is applied with a select-control signal SL(i) of the horizontal line from a vertical shift register 23 illustrated in FIG. 9. By setting the select-control signal SL(i) to the high (H) level, the second switching transistor $T_2S_{ija}$ is turned on, and the current corresponding to the potential of the second charge read-out region 62 amplified by the second signal read-out transistor $T_2A_{ija}$ is followed in the vertical signal line $B_{ja}$. In addition, the source electrode of a second reset transistor $T_2R_{ija}$ is connected to the second charge read-out region 62. The drain electrode of the second reset transistor $T_2R_{ija}$ is connected to the power supply VDD, and the gate electrode of the second reset transistor $T_2R_{ija}$ is applied with a reset signal $RT_2(i)$. By setting the reset signal $RT_2(i)$ to the high (H) level, the second reset transistor $T_2R_{ija}$ extracts the charges accumulated in the second charge read-out region 62 to reset the second charge read-out region 62.

Figure 2B:
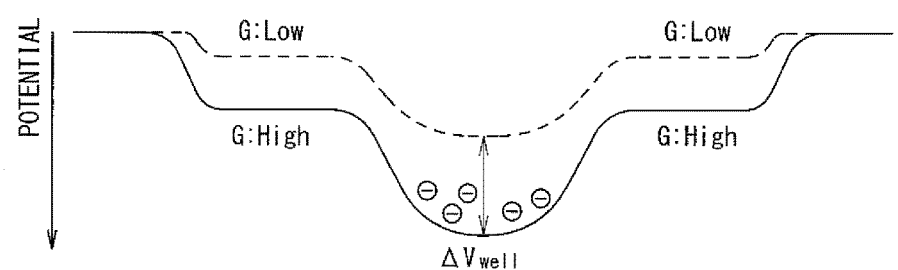

In a case that the description is focused to one pair of the first field-control electrodes 41a and 41b illustrated in FIG. 2 for the convenience of description, in order to perform freely the control of movement of the electrons generated in the light-receiving area at will, by the voltages applied to the first field-control electrode pair (41a, 41b), the second field-control electrode pair (42a, 42b), the third field-control electrode pair (43a, 43b), and the fourth field-control electrode pair (44a, 44b), as illustrated in FIG. 2B, the depletion potential (depletion potential inside of a buried diode) of the semiconductor region interposed between the first field-control electrode pair (41a, 41b) shall be greatly changed arbitrarily, by applying voltages to the first field-control electrode pair (41a, 41b). This can be performed by setting the impurity concentration of the substrate and selecting the p+ pinning layer 34 for hole pinning of the surface to a relatively low level.

Figure 2C:
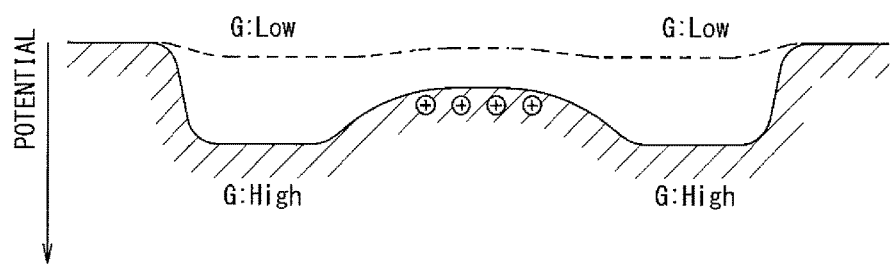

FIG. 2B illustrates a change of the potential distribution in the lower portion (bottom) of the conduction band taken along the direction IIB-IIB in the horizontal direction of the cross-sectional view of FIG. 2A according to the voltage applied to one pair of the first field-control electrodes 41a and 41b, and FIG. 2C illustrates a change of the potential distribution in the upper edge (top) of the valence band taken along the direction IIC-IIC in the horizontal direction of the cross-sectional view of FIG. 2A according to the voltage applied to one pair of the first field-control electrodes 41a and 41b. Although the potential distribution is also changed according to the area of the buried photodiode region, the surface buried region 35, and the impurity concentration of the p+ pinning layer 34 of the surface, when the one pair of the first field-control electrodes 41a and 41b is applied with a low or negative voltage (voltage of first potential level "L"), as represented by the broken line in FIG. 2B, the potential well for the electrons becomes shallow. When one pair of the first field-control electrodes 41a and 41b is applied with a high voltage (voltage of second potential level "H"), as represented by the solid line in FIG. 2B, the potential well for the electrons becomes deep. On the other hand, as illustrated in FIG. 2C, when one pair of the first field-control electrodes 41a and 41b is applied with a low or negative voltage (voltage of first potential level "L"), as represented by the broken line in FIG. 2C, the potential well for the holes becomes deep, and thus, the holes are accumulated in the pinning layer. However, when one pair of the first field-control electrodes 41a and 41b is applied with a high voltage (voltage of second potential level "H"), as represented by the solid line in FIG. 2C, the potential well for the holes becomes shallow, and thus, the holes are depleted. For this reason, in order to greatly change the depletion potential of the surface buried region 35 at the voltage of one pair of the first field-control electrodes 41a and 41b, design scheme of the impurity concentration of acceptors in the p+ pinning layer 34 of the surface is important.

Namely, in this region of the p+ pinning layer 34 sandwiched in between the field-control electrodes 41a and 41b, if the first field-control electrodes 41a and 41b is applied with a low or negative voltage, the hole density of the p+ pinning layer 34 of the surface is substantially equal to the impurity concentration of the acceptors in the p+ pinning layer 34. However, if one pair of the first field-control electrodes 41a and 41b is applied with a very high voltage, the hole density in the p+ pinning layer 34 is decreased, and thus, the depleted state is formed, so that the potential is increased. Therefore, in order to increase the depth $\Delta V_{well}$ of the potential well in the lower edge of the conduction band illustrated in FIG. 2B, the potential distribution in the upper edge of the valence band illustrated in FIG. 2C, particularly, the potential in the central portion needs to be greatly changed. If the impurity concentration in the p+ pinning layer 34 of the surface is very high (for example, the impurity concentration is $10^{19}$ cm$^{-3}$ or more), the region is not depleted, and the potential in the p+ pinning layer 34 of the central portion is substantially fixed to the substrate potential not to be changed even in a case where the field-control voltage applied to the one pair of the first field-control electrodes 41a and 41b is changed. In such a case, $\Delta V_{well}$ remains in small change.

On the other hand, the p+ pinning layer 34 of the surface is extended to a wide range including the light-receiving area just under the aperture as illustrated in FIG. 4A, and thus, it is preferable that the impurity concentration of the p+ pinning layer 34 is set to be as high as possible in order to reduce the dark current as the buried photodiode region. As a factor of generation of the dark current, there is a generation-recombination current $J_d$ according to states of the interface traps between the silicon and the silicon oxide film. The generation-recombination current $J_d$s is given by the following Formula, here the hole density of the p+ pinning layer 34 of the surface is denoted by p.

$$J_d = S_0 n_i^2/p \qquad (1)$$

In Eq. (1), $S_0$ is a constant representing a generation speed, and $n_i$ is carrier density of intrinsic semiconductor. Namely, as expressed in Eq. (1), the generation-recombination current $J_d$ according to the states of the interface traps is inversely proportional to the hole density of the p+ pinning layer 34 of the surface.

Therefore, in order to reduce the dark current and to obtain a large change in depletion potential according to the one pair of the first field-control electrodes 41a and 41b, an optimal hole density of the p+ pinning layer 34 of the surface needs to be selected, and it is estimated that the hole density is in a range of from about the second half of the order of $10^{17}$ cm$^{-3}$ to about the first half of the order of $10^{18}$ cm$^{-3}$. In addition, the change in depletion potential depends on a thickness of the p+ pinning layer 34 of the surface, and thus, it is preferable that the thickness is set to be about 0.1 μm. This becomes a criterion as to whether or not the carrier density in the p+ pinning layer 34 is greatly changed according to the voltage applied to the one pair of the first field-control electrodes 41a and 41b.

As described above, the insulating film 11 is a dielectric film acting as a so-called "gate insulating film" where the thickness of the portions just under the first field-control electrode pair (41a, 41b), the second field-control electrode pair (42a, 42b), the third field-control electrode pair (43a, 43b), and the fourth field-control electrode pair (44a, 44b) is set to be smaller than that of the other portions. As a material of the insulating film of the portion acting as the gate insulating film, a silicon oxide film (SiO$_2$ film) is very preferred, and besides the silicon oxide film (SiO$_2$ film), an insulating gate structure of an insulated gate transistor (MIS transistor) using various insulating films may be formed. For example, an ONO film implemented by a triple-layer stack film of silicon oxide film (SiO$_2$ film)/silicon nitride film (Si$_3$N$_4$ film)/silicon oxide film (SiO$_2$ film) may also be used. Furthermore, an oxide containing at least one element of strontium (Sr), aluminum (Al), magnesium (Mg), yttrium (Y), hafnium (Hf), zirconium (Zr), tantalum (Ta), and bismuth (Bi), a silicon nitride containing such an element, or the like may be used for a gate insulating film.

As an actual structure, an interlayer insulating film is selectively implemented by a thin insulating film acting as the gate insulating film so as to surround the first field-control electrode pair (41a, 41b), the second field-control electrode pair (42a, 42b), the third field-control electrode pair (43a, 43b), and the fourth field-control electrode pair (44a, 44b), so that the insulating film 11 may be formed in a double-layer structure with stepped configurations. Alternatively, another interlayer insulating film or a field insulating film having a thickness different from that of the gate insulating film is selectively formed in a region other than the portion acting as the gate insulating film so as to surround the first field-control electrode pair (41a, 41b), the second field-control electrode pair (42a, 42b), the third field-control electrode pair (43a, 43b), and the fourth field-control electrode pair (44a, 44b), so that the insulating film 11 may be formed to have a stepped configuration. In this case, the material of the interlayer insulating film or the field insulating film may be the same as or different from the material of the gate insulating film, and thus, for example, the portion of the interlayer insulating film may be implemented by a dielectric substance of which relative dielectric constant is smaller than that of the portion of the gate insulating film.

In a case where a silicon oxide film is used as the portion of the gate insulating film of the insulating film 11, a charge density $Q_{ox}$ per unit area, which will be induced to both ends of a capacitor insulating film of a parallel plate capacitor using the silicon oxide film as a capacitor insulating film (dielectric film), will be considered. Namely, the charge density $Q_{ox}$ per unit area induced to both end of the capacitor insulating film can be obtained by the following Formula, with an inter-electrode voltage V across both ends of the parallel plate capacitor and the capacitance $C_{ox}$ per unit area:

$$Q_{ox}=C_{ox}V \quad (2)$$

For example, if the thickness of the silicon oxide film as the insulating film 11 is 7 nm and the voltage difference V is 3 V, the charge density $Q_{ox}$ per unit area induced to both ends of the silicon oxide film is about $1.5 \times 10^{-6}$ cm$^{-2}$.

On the other hand, if we suppose the hole carrier density of the p+ pinning layer 34 is $1 \times 10^{18}$ cm$^{-3}$, the thickness of the p+ pinning layer 34 is 0.1 μm, and the hole density is uniform in the thickness range, the charge density $Q_{pin}$ is as follows:

$$Q_{pin} = 1.6 \times 10^{-19} \times 10^{18} \text{ cm}^{-3} \times 0.1 \times 10^{-4} \text{ cm}$$
$$= 1.6 \times 10^{-6} \text{ cm}^{-2}$$

Therefore, the charge density becomes about the same value as the charge density $Q_{ox}$ per unit area induced to both ends of the silicon oxide film. Since these values are merely estimated values, and because the subject p+ pinning layer 34 is not addressing to the silicon region just under the insulating film 11, but to a silicon region in an area adjacent to, or separated from the silicon region just under the insulating film 11 on the planar pattern, the hole density in the p+ pinning layer 34 cannot be controlled directly by one pair of the first field-control electrodes 41a and 41b. However, if one pair of the first field-control electrodes 41a and 41b has the capability of changing the charge density in the surface buried region 35 adjacently allocated in the side area of the silicon region just under the insulating film 11 on the planar pattern, the hole density in the subject p+ pinning layer 34 on the adjacently allocated surface buried region 35 can be changed, so that the subject p+ pinning layer 34 can be depleted, depending on the conditions.

Heretofore, although the description is focused to one pair of the first field-control electrodes 41a and 41b for the convenience of description, by the voltage applied to another pair of the second field-control electrodes 42a and 42b, even in one pair of the second field-control electrodes 42a and 42b, similarly to FIG. 2B, the potential distribution in the lower edge (bottom) of the conduction band is changed, and similarly to FIG. 2C, the potential distribution in the upper edge (top) of the valence band is changed. Namely, although not shown, even in one pair of the second field-control electrodes 42a and 42b, the same potential distributions as illustrated in FIGS. 2B and 2C can be established, and exactly the same description as the case of one pair of the first field-control electrodes 41a and 41b is satisfied.

Similarly, even in one pair of the third field-control electrodes 43a and 43b, similarly to FIG. 2B, the potential distribution in the lower edge (bottom) of the conduction band is changed, and similarly to FIG. 2C, the potential distribution in the upper edge (top) of the valence band is changed. In addition, even in one pair of the fourth field-control electrodes 44a and 44b, similarly to FIG. 2B, the potential distribution in the lower edge (bottom) of the conduction band is changed, and similarly to FIG. 2C, the potential distribution in the upper edge (top) of the valence band is changed. Namely, although not shown, even in each of one pair of the third field-control electrodes 43a and 43b and one pair of the fourth field-control electrodes 44a and 44b, the same potential distributions as illustrated in FIGS. 2B and 2C can be established, and exactly the same explanation as the case of one pair of the first field-control electrodes 41a and 41b can be held.

In a typical solid-state imaging device, the pinning layer is a layer suppressing surface carrier generation in the dark period or signal carrier trapping, and the pining layer is used as a preferred layer for reducing the dark current or signal carrier trapping in the related art. However, in addition to the behaviors well known in the related art, the p+ pinning layer 34 in the triple-output charge-modulation element of the first embodiment acts as an important layer exhibiting the performance of greatly changing the depletion potential of the surface buried region 35 by the voltages of the first field-control electrode pair (41a, 41b), the second field-control electrode pair (42a, 42b), the third field-control electrode pair (43a, 43b), and the fourth field-control electrode pair (44a, 44b).

It is possible to build the charge-modulation element or the like where, by applying the gate voltages having different voltage levels to one pair of the first field-control electrodes 41a and 41b and one pair of the second field-control electrodes 42a and 42b illustrated in FIG. 1, the carriers (electrons) generated in the buried photodiode region by the light incident on the opening (aperture) of the optical shielding plate 51 are moved at a higher speed so as to be alternatively distributed to the upper and lower sides along the vertical direction, in the vertical bar of the left side of the letter H. Similarly, by applying the gate voltages having different voltage levels to one pair of the third field-control electrodes 43a and 43b and one pair of the fourth field-control electrodes 44a and 44b illustrated in FIG. 1, the carriers (electrons) generated in the buried photodiode region by the light incident on the opening (aperture) of the optical shielding plate 51 can be moved at a higher speed so as to be alternatively distributed to the upper and lower sides along the vertical direction in the vertical bar of the right side of the letter H, by the field-control voltages applied to one pair of the third field-control electrodes 43a and 43b and one pair of the fourth field-control electrodes 44a and 44b.

Namely, in the triple-output charge-modulation element of the first embodiment, as illustrated in FIG. 1, since the first charge read-out region 61 and the second charge read-out region 62 are provided at both ends of the charge transport path along the vertical direction in the vertical bar of the left side of the letter H, the operation of the TOF range sensor can be established. In the TOF range sensor, the respective gate voltages having different first and second potential levels are applied to one pair of the first field-control electrodes 41a and 41b and one pair of the second field-control electrodes 42a and 42b, so as to transport the carriers (electrons) generated in the buried photodiode region at the central portion of the letter H toward the left side, and thereafter, by transporting further the signal charges at a higher speed, such that the signal charges can be alternately distributed to the upper and lower sides in the vertical direction, in the vertical bar allocated at the left side of the letter H, by the field-control voltages applied to one pair of the first field-control electrodes 41a and 41b and to one pair of the second field-control electrodes 42a and 42b. In addition, since the third charge read-out region 63 and the fourth charge-accumulation region (charge-extraction region) 64 are provided at both ends of the charge transport path along the vertical direction in the vertical bar allocated at the right side of the letter H as illustrated in FIG. 1, the charges of dark current components caused by the background light can be exhausted toward the lower direction in the vertical direction, along the vertical bar allocated at the right side of the letter H, by applying the gate voltages having different first and second potential levels to one pair of the third field-control electrodes 43a and 43b and one pair of the fourth field-control electrodes 44a and 44b so as to move the carriers (electrons) generated in the buried photodiode region at the central portion of the letter H toward the right side, and after that, by transporting the signal charges at a higher speed toward the up direction in the vertical direction along the vertical bar allocated at the right side of the letter H, by the field-control voltages applied to one pair of the third field-control electrodes 43a and 43b and to one pair of the fourth field-control electrodes 44a and 44b.

Namely, by applying the gate voltages having the potentials of the first and second potential levels to one pair of the first field-control electrodes 41a and 41b and to one pair of the second field-control electrodes 42a and 42b, the potential gradient which declines in the second charge read-out region 62 side can be formed as illustrated in FIG. 3B. For example, when the voltage applied to one pair of the first field-control electrodes 41a and 41b is −2 V (voltage of first potential level "L") and the voltage applied to one pair of the second field-control electrodes 42a and 42b is 1 V (voltage of second potential level "H"), the charges are transported to the second charge read-out region 62 in the left side of FIG. 3B. On the contrary, when the voltage applied to one pair of the first field-control electrodes 41a and 41b is 1 V (voltage of second potential level "H") and the voltage applied to one pair of the second field-control electrodes 42a and 42b is −2 V (voltage of first potential level "L"), the potential gradient which declines in the first charge read-out region 61 side can be formed as represented by the broken line in FIG. 3B, so that the generated photoelectrons are transported to the first charge read-out region 61 in the right side of FIG. 3B.

As illustrated in FIG. 3A, since the gate electrode of the first signal read-out transistor (amplifying transistor) $T_1A_{ijb}$ is connected to the first charge read-out region 61, the output amplified by the first signal read-out transistor (amplifying transistor) $T_1A_{ijb}$ is transferred through the first switching transistor $T_1S_{ijb}$ to the outside by the voltage corresponding to the charge amount transported to the first charge read-out region 61. Similarly, since the gate electrode of the second signal read-out transistor (amplifying transistor) $T_2A_{ija}$ is connected to the second charge read-out region 62, the output amplified by the second signal read-out transistor (amplifying transistor) $T_2A_{ija}$ is transferred through the second switching transistor $T_2S_{ija}$ to the outside by the voltage corresponding to the charge amount transported to the second charge read-out region 62.

For example, in the application to a TOF range sensor, a target may be repeatedly irradiated with light as a pulse signal from a light source provided to the TOF range sensor, and a delay time $T_d$ required for round flight of the light reflected by the target may be measured. Namely, in the application to the TOF range sensor, as described above, the delay time $T_d$ is measured by periodically repeating the operation of applying the first field-control pulse $G_1$, second field-control pulse $G_2$, third field-control pulse $G_3$, and fourth field-control pulse $G_D$ having different phases as illustrated in FIG. 5 to the respective first field-control electrode pair (41a, 41b), the second field-control electrode pair (42a, 42b), the third field-control electrode pair (43a, 43b), and the fourth field-control electrode pair (44a, 44b) in synchronization with a period of repetition of the light pulse of an outgoing light as illustrated in FIG. 5. Namely, defining the light pulse of the pulse width $T_0$ which is shorter than the time of twice the pulse width of each of the first field-control pulse $G_1$, second field-control pulse $G_2$, and third field-control pulse $G_3$, and the light pulse is applied to the respective first field-control electrode pair (41a, 41b), second field-control electrode pair (42a, 42b), and third field-control electrode pair (43a, 43b). If the light pulse of the pulse width $T_0$ is received at the timing as illustrated in FIG. 5 so as to include transition time of voltage from the first potential level "L" to the second potential level "H" of the third field-control pulse $G_3$ and transition time of voltage from the second potential level "H" to the first potential level "L" of the second field-control pulse $G_2$, the delay time $T_d$ according to the round-flight time taken for the light pulse reflected on the target to return can be obtained. If the delay time $T_d$ defined by the round-flight time of the light pulse is obtained, the distance "L" from the light source of the light pulse to the target can be obtained by multiplying the speed of light with a half of the delay time $T_d$.

As illustrated in FIG. 5, the triple-output charge-modulation element of the first embodiment is operated by using pulse light having a relatively small duty. As illustrated in FIG. 5, in the period when the light pulse of the incoming light is irradiated and the charges modulated by the charge-modulation element are accumulated, the charge-modulation element is operated by periodically applying four gate signals implemented by the first field-control pulse $G_1$, second field-control pulse $G_2$, third field-control pulse $G_3$, and fourth field-control pulse $G_D$ as illustrated in the figure.

(a) In the period when the first field-control pulse $G_1$ is at the second potential level "H", the second field-control pulse $G_2$ is at the first potential level "L", the third field-control pulse $G_3$ is at the first potential level "L", and the fourth field-control pulse $G_D$ is at the first potential level "L", the signal charges generated in the light-receiving area are transferred to the first charge-accumulation region 61.

(b) In the period when the second field-control pulse $G_2$ is at the second potential level "H", the first field-control pulse $G_1$ is at the first potential level "L", the third field-control pulse $G_3$ is at the first potential level "L", and the fourth field-control pulse $G_D$ is at the first potential level "L", the signal charges generated in the light-receiving area are transferred to the second charge-accumulation region 62.

(c) In the period when the third field-control pulse $G_3$ is at the second potential level "H", the first field-control pulse $G_1$ is at the first potential level "L", the third field-control pulse $G_3$ is at the first potential level "L", and the fourth field-control pulse $G_D$ is at the first potential level "L", the signal charges generated in the light-receiving area are transferred to the third charge-accumulation region 63.

(d) In the period when the fourth field-control pulse $G_D$ is at the second potential level "H", the first field-control pulse $G_1$ is at the first potential level "L", the second field-control pulse $G_2$ is at the first potential level "L", and the third field-control pulse $G_3$ is at the first potential level "L", the signal charges generated in the light-receiving area are exhausted to the fourth charge-accumulation region (charge-extraction region) 64.

At the time if the light pulse of the incoming light arrives at the timing illustrated in FIG. 5, the photoelectrons are transferred to the second charge-accumulation region 62 and the third charge-accumulation region 63. If the charge amount accumulated in the second charge-accumulation region 62 and the third charge-accumulation region 63 are denoted by Q2 and Q3, respectively, the charge amounts are expressed by the following formulas:

$$Q2 = I_{ph}(T_0 - T_d) + I_a T_0 \quad (3)$$

$$Q3 = I_{ph} T_d + I_a T_0 \quad (4)$$

Here, $I_{ph}$ is a photocurrent according to the signal light pulse, $I_a$ is a photocurrent according to the background light, $T_0$ is a pulse width of light, and $T_d$ is a delay time of light pulse according to TOF of the light. In the period when the first field-control pulse $G_1$ is at the second potential level "H", the second field-control pulse $G_2$ is at the first potential level "L", the third field-control pulse $G_3$ is at the first potential level "L", and the fourth field-control pulse $G_D$ is at the first potential level "L", since the light pulse does not arrive, the signal caused by only the background light is accumulated. At this time, if the charge amount accumulated in the first charge-accumulation region 61 is denoted by Q1, the charge amount is expressed by the following formula:

$$Q1 = I_a T_0 \quad (5)$$

While canceling the influence of the background light included in the Q2 and Q3, the TOF of the light can be estimated by using the Q1. Namely, the TOF of the light is expressed by the following Formula from Eqs. (3), (4), and (5):

$$T_d = T_0(Q3 - Q1)/(Q2 + Q3 - 2Q1) \quad (6)$$

In addition, in the period when the fourth field-control pulse $G_D$ is at the second potential level "H", the first field-control pulse $G_1$ is at the first potential level "L", the second field-control pulse $G_2$ is at the first potential level "L", and the third field-control pulse $G_3$ is at the first potential level "L", although the photoelectrons are generated by the background light, since the photoelectrons are exhausted to the fourth charge-accumulation region (charge-extraction region) 64, the influence of the background light can be reduced by gathering up the light energy in the period when the second field-control pulse $G_2$ is at the second potential level "H" and the third field-control pulse $G_3$ is at the second potential level "H" by using the light pulse having such a small duty. Furthermore, the component of the background light is canceled by the canceling process. Accordingly, the TOF measurement with high tolerance to the background light is performed.

FIG. 6 illustrates operation timing in the case of obtaining the distance corresponding to the delay time of twice the pulse width $T_0$ of the outgoing light by using the triple-output charge-modulation element of the first embodiment. In this case, the pulse width $T_0$ of the outgoing light and the widths of the first field-control pulse $G_1$, second field-control pulse $G_2$, and third field-control pulse $G_3$ of the gate signal are set to be equal. With respect to the outgoing light pulse, in a case where the delay time (TOF) of the received incoming light pulse is the delay time $T_d$ corresponding to the first incoming light of FIG. 6, the charge amounts Q1, Q2, and Q3 are expressed as follows:

$$Q1 = I_{ph}(T_0 - T_d) + I_a T_0 \quad (7)$$

$$Q2 = I_{ph} T_d + I_a T_0 \quad (8)$$

$$Q3 = I_a T_0 \quad (9)$$

Therefore, the delay time $T_d$ corresponding to the first incoming light can be obtained by the following Formula:

$$T_d = T_0(Q2 - Q3)/(Q1 + Q2 - 2Q3) \quad (10)$$

With respect to the outgoing light pulse, in a case where the delay time (TOF) of the received incoming light pulse is the delay time $T_{d2}$ corresponding to the second incoming light of FIG. 6, the charge amounts Q1, Q2, and Q3 of the first charge-accumulation region 61, the second charge-accumulation region 62, and the third charge-accumulation region 63 are expressed as follows:

$$Q1 = I_a T_0 \quad (11)$$

$$Q2 = I_{ph}(2T_0 - T_{d2}) + I_a T_0 \quad (12)$$

$$Q3 = I_{ph}(T_{d2} - T_0) + I_a T_0 \quad (13)$$

Therefore, the delay time $T_{d2}$ corresponding to the second incoming light can be obtained by the following Formula:

$$T_{d2} = T_0 + T_0(Q3 - Q1)/(Q2 + Q3 - 2Q1) \quad (14)$$

Whether or not the TOF of the light pulse is larger than the pulse width $T_0$ of the outgoing light is found by comparing Q1 and Q3. Namely, if Q1>Q3, the TOF of the light pulse is calculated by using Eq. (10), and if Q1≤Q3, the TOF of the light pulse is calculated by using Eq. (14).

Figure 7A:
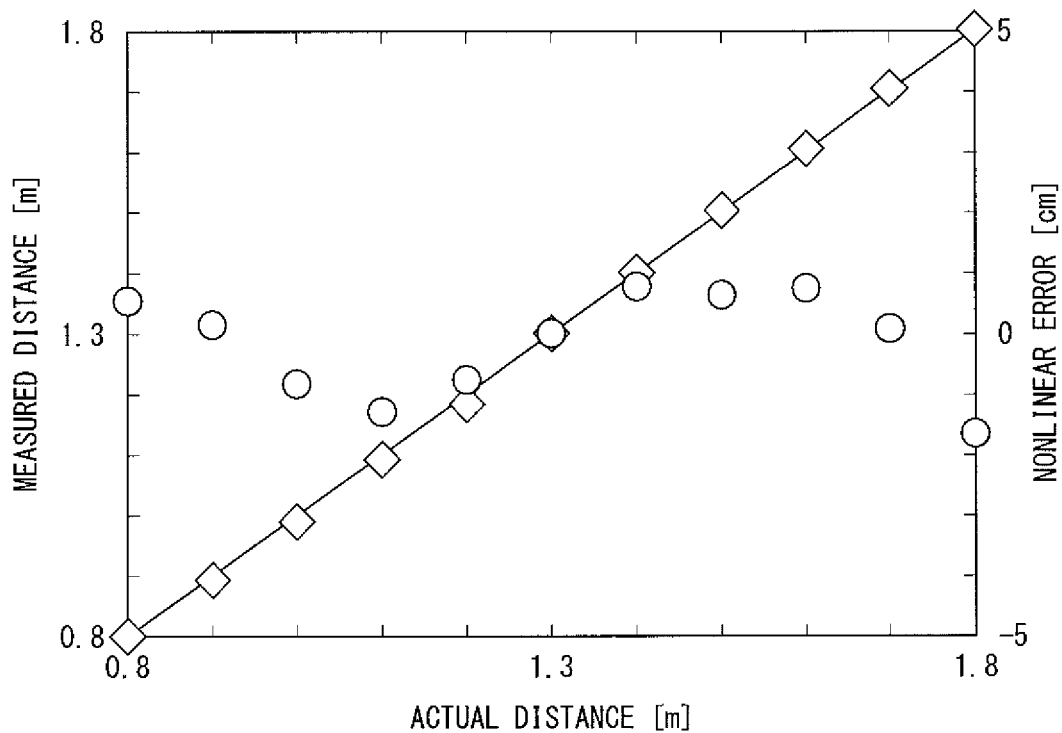
FIGS. 7A and 7B are views illustrating measurement results of accuracy (linearity) and resolution of the triple-output charge-modulation element of the first embodiment in a case where there is no background light.
Figure 7B:
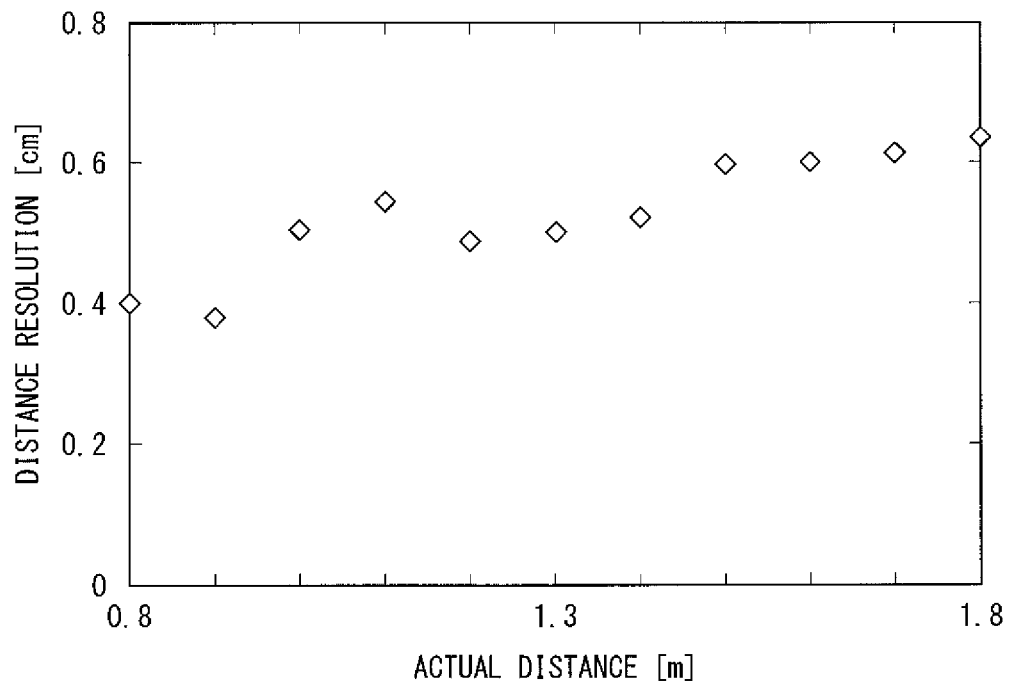
Figure 8A:
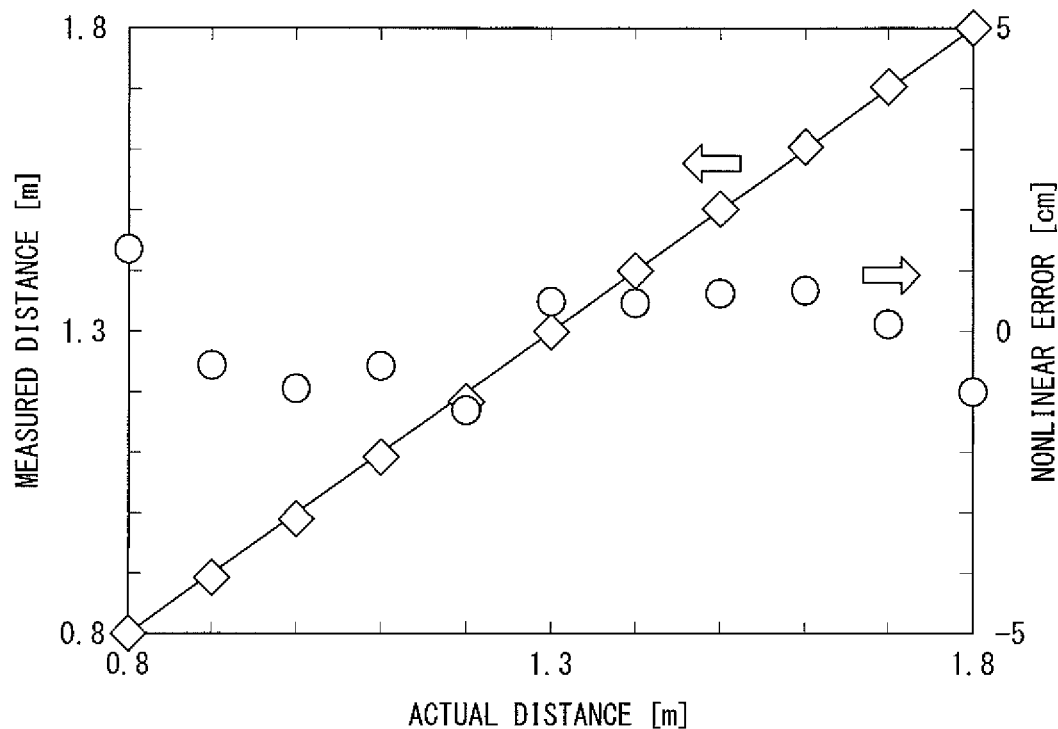
FIGS. 8A and 8B are views illustrating measurement results of accuracy (linearity) and resolution of the triple-output charge-modulation element of the first embodiment in a case where a background light canceling process is performed under 3000 lux of background light.
Figure 8B:
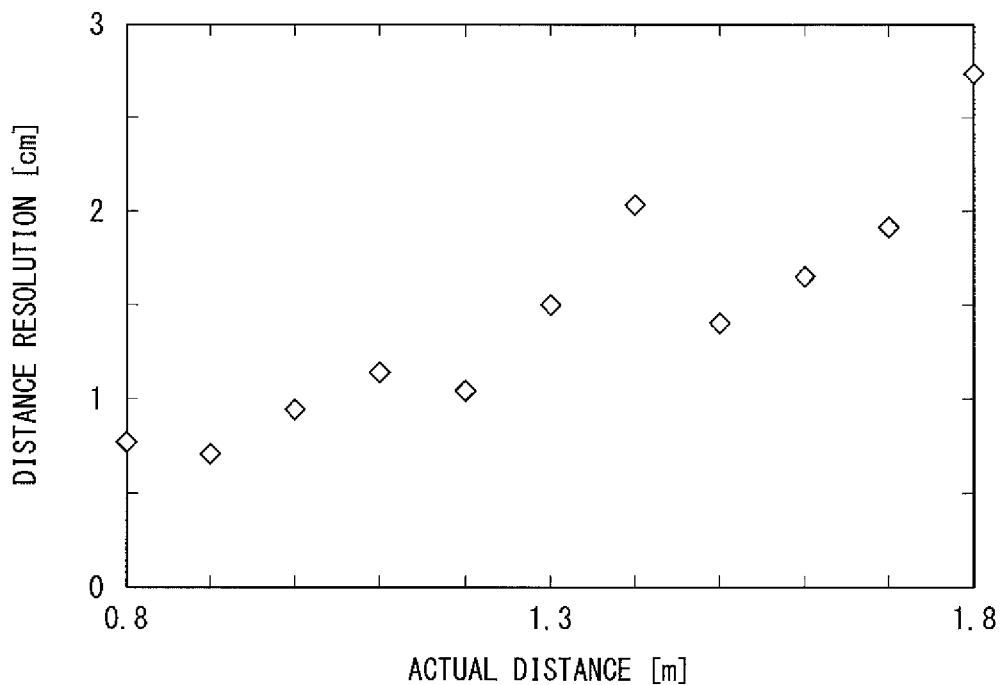

FIGS. 7A, 7B, 8A and 8B are measurement results of accuracy (linearity) and resolution for the triple-output charge-modulation element of the first embodiment. FIGS. 7A and 7B are results of the case where there is no background light, and FIGS. 8A and 8B are distance resolutions in a case where a background light canceling process is performed under 3000 lux of background light. As illustrated in FIGS. 8A and 8B, in a case where there is background light, due to light shot noise, the distance resolution is slightly deteriorated, but a resolution of less than 3 cm with respect to about 1.8 m is obtained.

In this manner, according to the triple-output charge-modulation element of the first embodiment, in comparison with the case where the potential just under the gate electrode is controlled toward the vertical direction (depth direction) by using a MOS structure of the related art, since the electric field control by static induction effect along the lateral direction (perpendicular to the charge transport path) is used, the electric field becomes substantially uniform over a long distance of the charge transport path, and the signal charges are transported at a higher speed while symmetry is maintained. Namely, if the triple-output charge-modulation element of the first embodiment is applied to a TOF range sensor, in comparison with a CMOS TOF range image sensor using a buried photodiode of the related art, the topology of the charge transport paths can be defined by an H shape, and the length of the charge transport path can be taken to be long. Therefore, a substantial aperture ratio of the aperture represented by the two-dot dashed line in FIG. 1 is improved, so that high sensitivity can be achieved.

Furthermore, in the structure where the potential just under the gate electrode is controlled toward the vertical direction by using a MOS structure of the related art, although there is noise or dark current caused by interface defects, interface states, or the like in the interface between the gate oxide film and the silicon surface, according to the triple-output charge-modulation element of the first embodiment, since the electric field is control by static induction effect along the lateral direction, it is possible to avoid the problem of generation of the noise or the dark current caused by the interface defects, the interface states, or the like in the interface between the gate oxide film and the silicon surface or the problem of deterioration in transport speed.

In addition, according to the triple-output charge-modulation element of the first embodiment, the signal charges are sequentially transported at a higher speed, being alternatively distributed to the first charge read-out region 61, second charge read-out region 62, and third charge read-out region 63 assigned at the triple end portions of the H-shaped charge transport paths, and the charges which become the component of the dark current according to the background light can be exhausted to the fourth charge-accumulation region (charge-extraction region) 64 allocated at the fourth end portion of the H-shaped charge transport paths. Therefore, the charge-modulation element is not limited to the TOF range sensor, but it can be applied to observation of physical phenomenon where the same phenomenon is repeated in an extremely short time. For example, if the triple-output charge-modulation element of the first embodiment is applied as an element of measuring a lifetime of a fluorescent material, a substantially uniform electric field is established over a long distance of the charge transport path, so that the signal charges can be transported at a higher speed. Therefore, the measurement with a higher accuracy can be established.

Solid-State Imaging Device

The triple-output charge-modulation element of the first embodiment can be applied to an active pixel $X_{ij}$ of a solid-state imaging device (TOF range image sensor). Due to the application to the active pixel $X_{ij}$ of the solid-state imaging device, in the inner portion of each active pixel $X_{ij}$, the signal charges can be transported at a higher speed.

Figure 9:
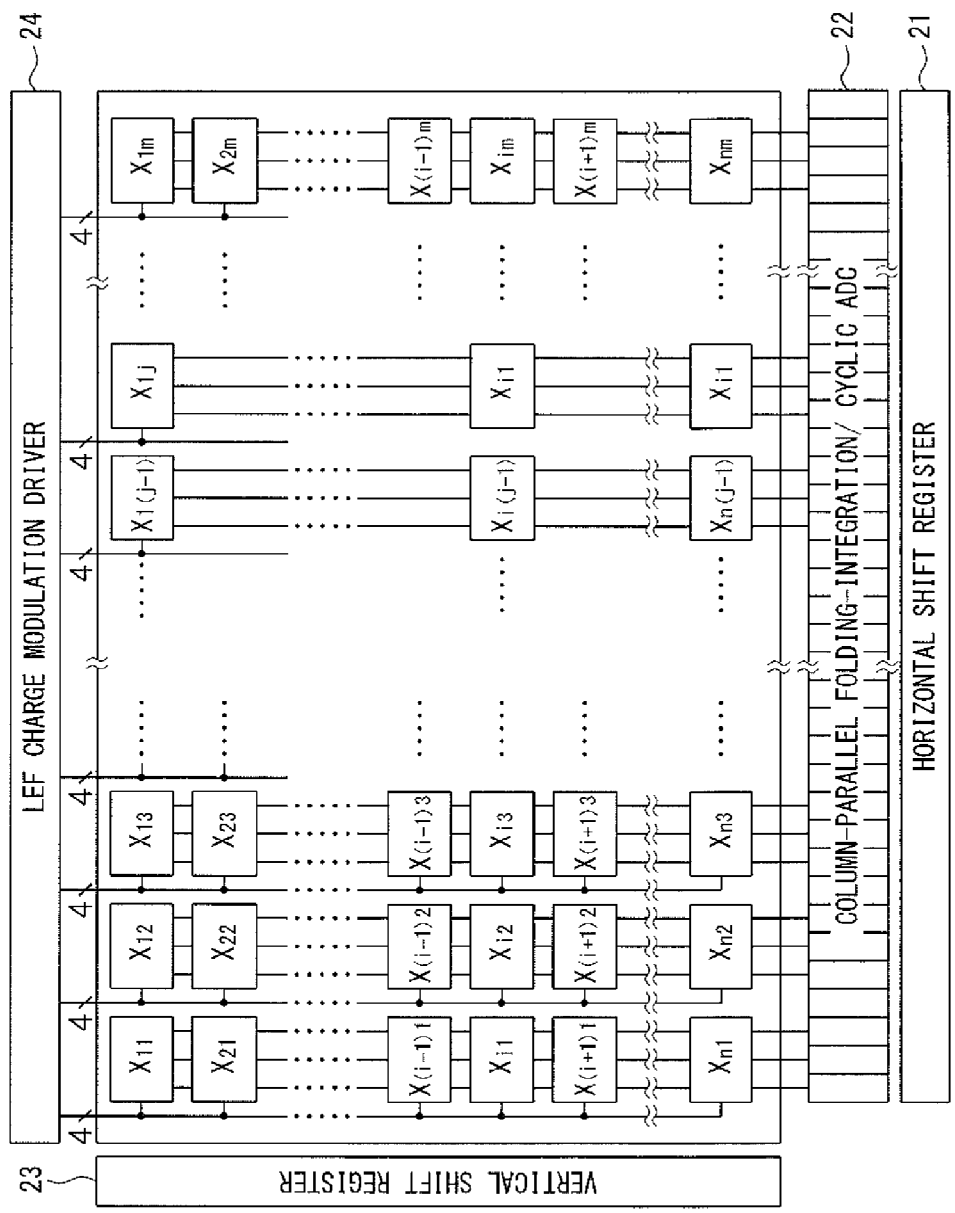
FIG. 9 is a schematic plan view illustrating an overview of a layout on a semiconductor chip of a solid-state imaging device pertaining to the first embodiment of the present invention.
Figure 10:
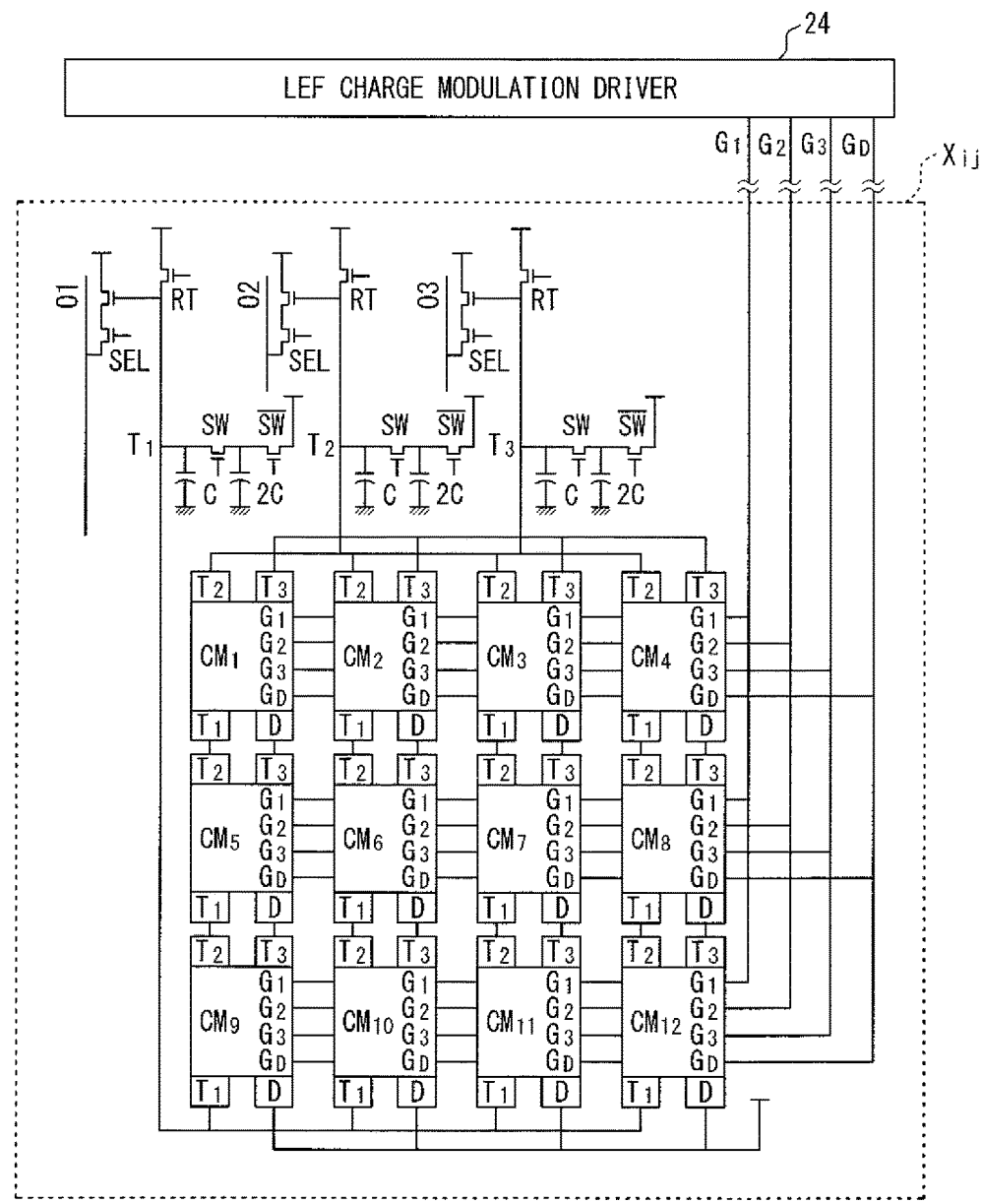
FIG. 10 is a schematic plan view illustrating an overview of an internal structure of active pixels used in the solid-state imaging device illustrated in FIG. 9.

FIG. 9 illustrates an example of a configuration of the solid-state imaging device where the active pixel $X_{ij}$ is implemented by an integrated structure, in which a plurality of the triple-output charge-modulation elements according to the first embodiment are arranged in a matrix shape as illustrated in FIG. 10, and a plurality of the active pixels $X_{ij}$ are further arranged in a matrix shape. Inside one pixel of the active pixels $X_{ij}$ a required number of the triple-output charge-modulation elements having the structure exemplified in FIG. 1 are arranged in a matrix shape and connected in parallel, so that a required sensitivity is secured. In FIG. 10, 12 (=3×4) triple-output charge-modulation elements having the structure of FIG. 1 are included.

Inside each of the twelve triple-output charge-modulation elements, the first field-control pulse $G_1$, second field-control pulse $G_2$, third field-control pulse $G_3$, and fourth field-control pulse $G_D$ having different phase relationships, which are provided from a lateral electric field control (LEF) charge modulation driver 24, are sequentially applied to the respective first field-control electrode pair (41a, 41b), the second field-control electrode pair (42a, 42b), the third field-control electrode pair (43a, 43b), and the fourth field-control electrode pair (44a, 44b) in the directions perpendicular to the directions of the charge transport paths by using the buried photodiode structure. Therefore, the depletion potentials of the charge transport paths are sequentially changed by the static induction effect by the electric field in the lateral direction, and the signal charges are transported in the selected charge transport paths at a higher speed to be sequentially accumulated to the first charge-accumulation region 61, the second charge-accumulation region 62, and the third charge-accumulation region 63, so that the dark current component can be exhausted to the fourth charge-accumulation region 64.

As illustrated in FIG. 10, to the first charge-accumulation region 61, the second charge-accumulation region 62, and the third charge-accumulation region 63, which serve as output terminals of each of twelve triple-output charge-modulation elements, capacitors C for accumulating the charges and gates of source follower amplifiers are connected, in the inside of the active pixel $X_{ij}$, and signals are read out to a peripheral read-out circuit by scheme of an active pixel circuit.

In addition, as illustrated in FIG. 10, reset transistors are also connected to nodes of the first charge-accumulation region 61, the second charge-accumulation region 62, and the third charge-accumulation region 63 of each of the twelve triple-output charge-modulation elements, and after read-out process, the charges of the first charge-accumulation region 61, the second charge-accumulation region 62, and the third charge-accumulation region 63 of each of the twelve triple-output charge-modulation elements are reset. This operation is used for noise cancellation. In FIG. 9, other capacitors 2C are also connected through transistors to the nodes of the first charge-accumulation region 61, the second charge-accumulation region 62, and the third charge-accumulation region 63, so that the amount of charges, which are scheduled to be accumulated, can be adjusted.

As illustrated in FIG. 9, the solid-state imaging device (TOF range image sensor) according to the first embodiment of the present invention merges a pixel array unit and a peripheral circuit unit (21, 22, 23, 24) on the same semiconductor chip. In the pixel array unit, a large number of the active pixels $X_{ij}$ (i=1 to n; j=1 to m; and n and m are integers) illustrated in FIG. 10 are arranged in a two-dimensional matrix shape so as to implement, for example, a rectangular imaging area. In the lower side of the pixel array unit, column-parallel folding-integration/cyclic ADCs 22 and a horizontal shift register 21 connected to the column-parallel folding-integration/cyclic ADCs 22 are provided along the direction of the pixel rows $X_{11}, X_{12}, X_{13}, \ldots X_{1m}; X_{21}, X_{22}, X_{23}, \ldots X_{2m}; X_{31}, X_{32}, X_{33}, \ldots X_{3m};$ and $X_{n1}, X_{n2}, X_{n3}, \ldots X_{nm}$ illustrated in the horizontal direction in FIG. 9. In the left side of the pixel array unit, a vertical shift register 23 is provided along the direction of the pixel columns $X_{11}, X_{21}, X_{31}, \ldots, X_{n1}; X_{12}, X_{22}, X_{32}, \ldots, X_{n2}; X_{13}, X_{23}, X_{33}, \ldots, X_{n3}; \ldots;$ and $X_{1m}, X_{2m}, X_{3m}, \ldots, X_{nm}$ illustrated in the vertical direction in FIG. 9. A timing generation circuit (not shown) is connected to the vertical shift register 23 and the horizontal shift register 21. In the solid-state imaging device pertaining to the first embodiment, the signal is read out and the A/D conversion is performed in the column-parallel folding-integration/cyclic ADC 22 provided in the lower side of the pixel array unit, so that noise is further canceled. Therefore, the signal level due to the photoelectrons is extracted, so that the signal where fixed pattern noise and a portion of temporal random noise (reset noise) are canceled is obtained.

Figure 11A:
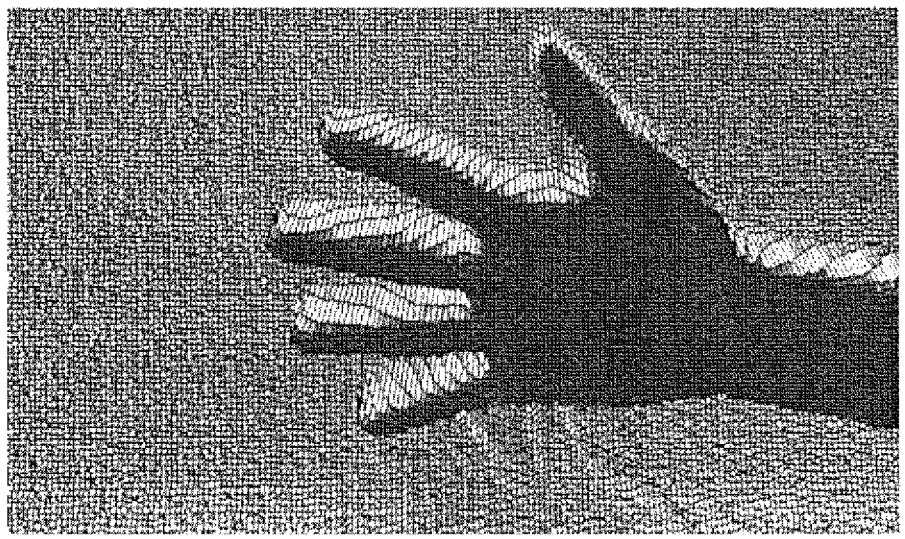
FIGS. 11A and 11B are views illustrating an example of imaging of a range image by the solid-state imaging device pertaining to the first embodiment.
Figure 11B:
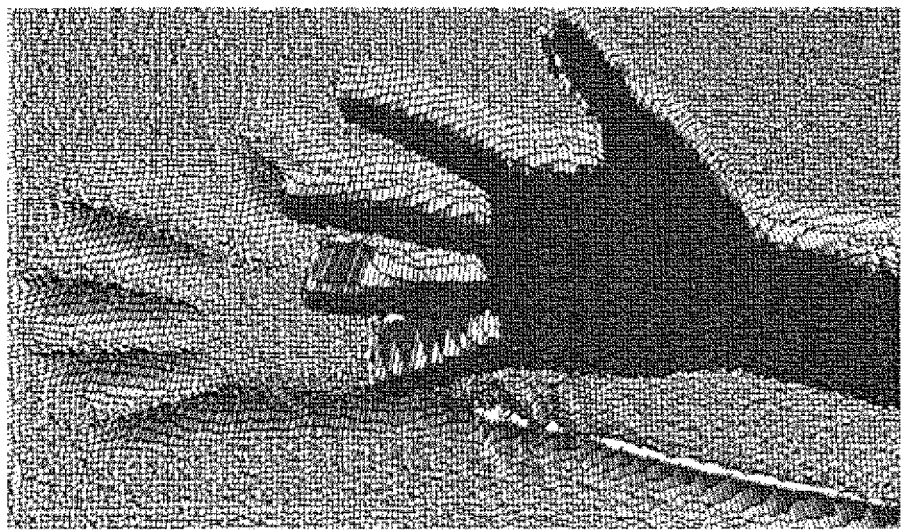

FIGS. 11A and 11B show examples of imaging of a range image by the solid-state imaging device pertaining to the first embodiment. FIG. 11A corresponds to the case of using the canceling process (using three signals) of the background component inside the active pixel $X_{ij}$ according to Eq. (6). And FIG. 11B shows a result obtained without performing the canceling process of the background component inside the active pixel $X_{ij}$, by using two consecutive frames, turning off signal light in one frame in the two consecutive frames to read out only the background component, and canceling the background component by a difference in signals between the frames.

FIGS. 11A and 11B show range images at the time of slowly shaking a hand in a distance of about 50 cm in front of a wall. It can be understood that, as shown in FIG. 11A, in the case of using the canceling inside the active pixel $X_{ij}$, a correct shape of the hand is measured, and however, as shown in FIG. 11B, in the case of using a difference between the frames, a large false range image appears in a portion of the wall. Therefore, it can be understood that the range image of a moving target can be measured at a good accuracy by using the canceling process for the background component inside the active pixel $X_{ij}$ of the solid-state imaging device pertaining to the first embodiment.

As described above, in the solid-state imaging device pertaining to the first embodiment, since the active pixels $X_{ij}$, in which a plurality of the triple-output charge modulation elements of the first embodiment are merged, are used, in comparison with the case of the configuration with a unit pixel in the method of controlling the potential just under the gate electrode in the vertical direction (the direction normal to the surface plane of the semiconductor substrate) by using a MOS structure of the related art, since the electric field control by the static induction effect along the lateral direction (the direction parallel to the surface plane of the semiconductor substrate and perpendicular to the charge transfer direction) is used with respect to each active pixel $X_{ij}$, encompassing twelve triple-output charge-modulation elements, the electric field can be established to be substantially uniform over a long distance along the charge transport path, so that the signal charges can be transported at a higher speed.

In addition, in the earlier structure of using a unit pixel in the scheme of controlling the potential just under the gate electrode in the vertical direction by using a MOS structure of the related art, although there is noise or dark current caused by interface defects, interface states, or the like in the interface between the gate oxide film and the silicon surface, according to the solid-state imaging device pertaining to the first embodiment, since the electric field control by static induction effect along the lateral direction is used with respect to each of the twelve triple-output charge-modulation elements, which implements each active pixel $X_{ij}$, inside each of the twelve triple-output charge-modulation elements, it is possible to avoid the problem of generation of the noise or the dark current caused by the interface defects, the interface states, or the like in the interface between the gate oxide film and the silicon surface or the problem of deterioration in transfer speed, so that a solid-state imaging device with lower noise, higher resolution, and higher response speed can be established.

In addition, according to the solid-state imaging device pertaining to the first embodiment, since the signal charges can be sequentially transported at a higher speed to the first charge read-out region 61, second charge read-out region 62, and third charge read-out region 63 assigned at the triple end portions of the H-shaped charge transport path in each of the twelve triple-output charge-modulation elements, which implements each active pixel $X_{ij}$, the solid-state imaging device is not limited to a two-dimensional TOF range sensor, but it can be applied to observation of physical phenomenon where the same phenomenon is repeated in an extremely short time, so that a two-dimensional image can be captured. For example, if the solid-state imaging device pertaining to the first embodiment is applied as an element of measuring a lifetime of a fluorescent material, a substantially uniform electric field is established over a long distance in the charge transfer direction, so that the signal charges can be transported at a higher speed. Therefore, it is possible to capture a two-dimensional image at a higher accuracy.

Modified Example of First Embodiment

Figure 12:
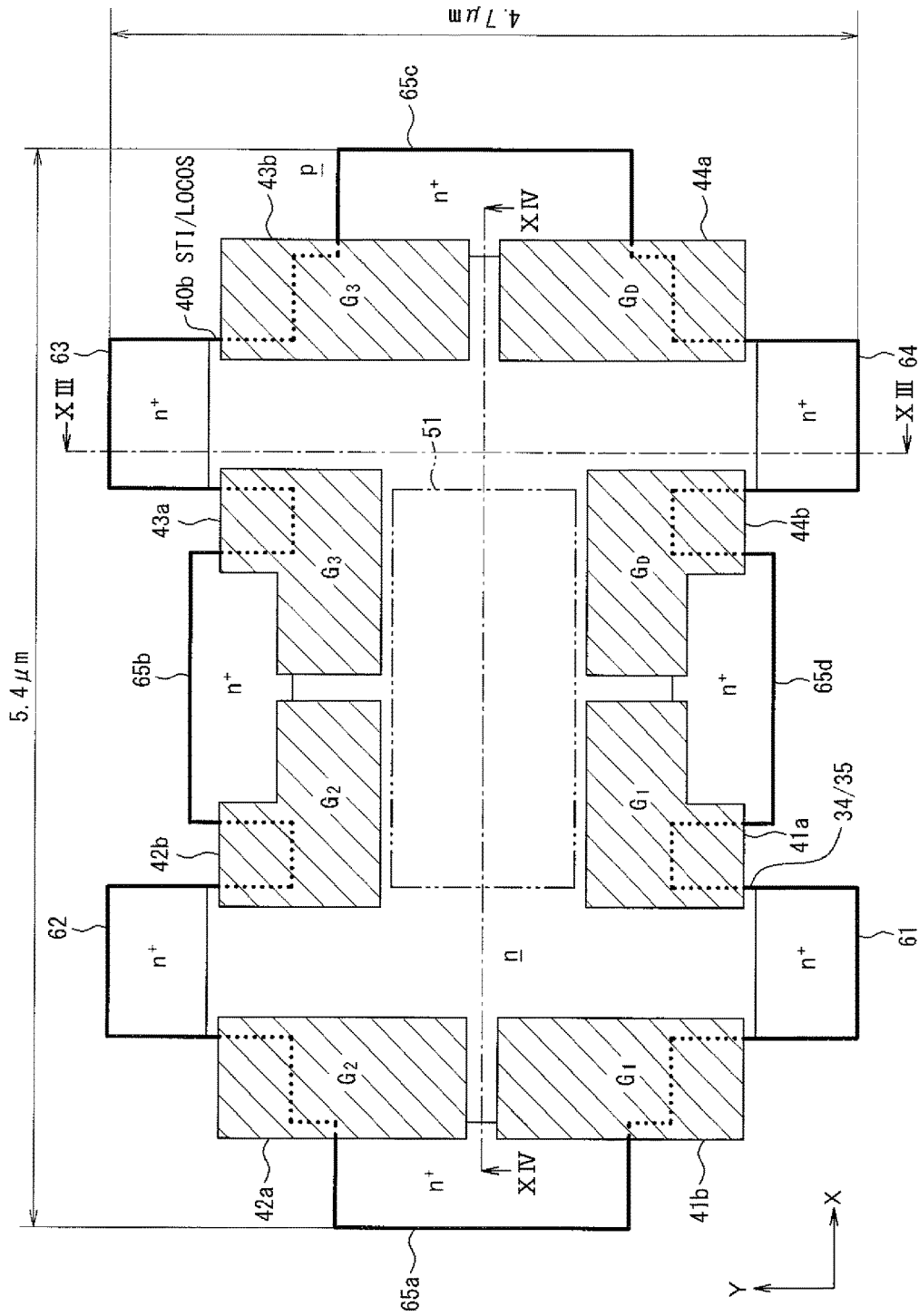
FIG. 12 is a schematic plan view (top diagram) illustrating an overview of a triple-output charge-modulation element according to a modified example of the first embodiment of the present invention.

As illustrated in FIG. 12, similarly to the structure illustrated in FIGS. 1 to 4, a triple-output charge-modulation element according to a modified example of the first embodiment of the present invention encompasses a pixel constructing area (34, 35) including an active-area setting-layer made by a p-type semiconductor, an n-type surface buried region 35 provided in an upper portion of the active-area setting-layer, and a p-type pinning layer 34 being in contact with a surface of the surface buried region 35, an insulating film provided on the pixel constructing area (34, 35), a light-receiving area which is assigned at a central portion of the pixel constructing area (34, 35), n-type first, second, third, and fourth charge-accumulation regions 61, 62, 63, and 64 which have a higher impurity concentration than the active-area setting-layer, being separated from each other at quadruple positions symmetric with respect to a center position of the light-receiving area, surrounding the light-receiving area, and a first field-control electrode pair (41a, 41b), a second field-control electrode pair (42a, 42b), a third field-control electrode pair (43a, 43b), and a fourth field-control electrode pair (44a, 44b) which are provided at positions surrounding the light-receiving area as pairs to both sides of respective charge transport paths, which extend from the center position of the light-receiving area on the insulating film to the respective first charge-accumulation region 61, second charge-accumulation region 62, third charge-accumulation region 63, and fourth charge-accumulation region 64.

As understood from the plan view of FIG. 12, the arrangement topology of the first charge-accumulation region 61, the second charge-accumulation region 62, the third charge-accumulation region 63, and the fourth charge-accumulation region 64 has a double rotational symmetry with respect to the center position of the light-receiving area.

Although the cross-sectional view corresponding to FIG. 12 is omitted in illustration, similarly to the structure illustrated in the cross-sectional views of FIGS. 2A, 3A, and 4A, since the cross-sectional structure of the triple-output charge-modulation element according to the modified example of the first embodiment has the active-area setting-layer made by a p-type semiconductor, the n-type surface buried region 35 provided in a portion of the upper portion of the active-area setting-layer, and the p-type pinning layer 34 being in contact with the surface of the surface buried region 35, actually, the cross-sectional structure of the pixel constructing area (34, 35) in the triple-output charge-modulation element according to the modified example of the first embodiment is a triple-layer structure including the active-area setting-layer, and if the p-type substrate under the active-area setting-layer is included, the cross-sectional structure is a quadruple-layer structure. In addition, the insulating film is formed on the pinning layer 34.

As illustrated in FIG. 12, the triple-output charge-modulation element according to the modified example of the first embodiment of the present invention is different from the structure illustrated in FIG. 1 in terms of features that the n-type charge-extraction auxiliary-regions 65a, 65b, 65c, and 65d having a higher impurity concentration than the active-area setting-layer are provided in a peripheral portion surrounding the light-receiving area to be separated from each other.

In the triple-output charge-modulation element according to the modified example of the first embodiment, depletion potentials of the surface buried region 35 are sequentially changed, by periodically applying field-control pulses at different phases similarly to the timing diagram illustrated in FIG. 5 to the first field-control electrode pair (41a, 41b), the second field-control electrode pair (42a, 42b), the third field-control electrode pair (43a, 43b), and the fourth field-control electrode pair (44a, 44b), and thus, potential gradients toward the directions allowing the charges to be transported are sequentially formed in one of the charge transport paths, so that destinations of majority carriers generated in the surface buried region 35 are sequentially controlled to be directed to one of the first charge-accumulation region 61, the second charge-accumulation region 62, the third charge-accumulation region 63, and the fourth charge-accumulation region 64. These operations are the same as those of the triple-output charge-modulation element of the first embodiment illustrated in FIGS. 1 to 4 and the like.

However, as illustrated in FIG. 12, since the charge-extraction auxiliary-regions 65a, 65b, 65c, and 65d are provided to the peripheral portion surrounding the light-receiving area, by applying the charge extraction pulse having a potential level higher than the voltage to the first field-control electrode pair (41a, 41b) used for building up the charge transport path, the charges of dark current components caused by background light or the like can be exhausted to the first charge-extraction auxiliary-region 65a and the fourth charge-extraction auxiliary-region 65d.

Similarly to the illustration of FIG. 2C, when one pair of the first field-control electrodes 41a and 41b is applied with a voltage of first potential level "L", as represented by the broken line, the potential well for the holes of the potential distribution in the upper edge (top) of the valence band becomes deep, and thus, the holes are accumulated in the pinning layer. However, when one pair of the first field-control electrodes 41a and 41b is applied with a voltage of second potential level "H" as represented by the solid line, the potential well for the holes becomes shallow, and thus, the holes are depleted. Although omitted in illustration, when a voltage having a further larger third potential level "V" is applied, the potential well for the holes becomes shallower. On the other hand, similarly to the illustration of FIG. 2B, when one pair of the first field-control electrodes 41a and 41b is applied with the voltage of first potential level "L" or the voltage of second potential level "H", the depletion potential of the central portion is changed in a profile where a barrier along the lateral direction of the potential distribution in the lower edge (bottom) of the conduction band is generated. When a voltage of the third potential level "V" is applied, the barrier disappears, so that the charges are exhausted to the first charge-extraction auxiliary-region 65a and the fourth charge-extraction auxiliary-region 65d.

Similarly, the charges of dark current components can be exhausted to the first charge-extraction auxiliary-region 65a and the second charge-extraction auxiliary-region 65b by applying the charge extraction pulse having a third potential level "V" to the second field-control electrode pair (42a, 42b). The charges of dark current components can be exhausted to the second charge-extraction auxiliary-region 65b and the third charge-extraction auxiliary-region 65c by applying the charge extraction pulse having a third potential level "V" to the third field-control electrode pair (43a, 43b), and the charges of dark current components can be exhausted to the third charge-extraction auxiliary-region 65c and the fourth charge-extraction auxiliary-region 65d by applying the charge extraction pulse having a third potential level to the fourth field-control electrode pair (44a, 44b). For example, in a case when the voltage of first potential level "L" used for controlling the charge transport path is −1 V and the voltage of second potential level "H" is 1.8 V, the voltage for the third potential level "V" as the charge extraction pulse may be elected to about 3.5 V.

Other operations, that is, the feature of performing charge modulation by transporting photoelectrons generated in the light-receiving area along the H-shaped charge transport paths at a higher speed by electric field control in the left and right directions along the central bar of the letter H, and the up and down directions of both side bars of the letter H, by using the first field-control electrode pair (41a, 41b), the second field-control electrode pair (42a, 42b), the third field-control electrode pair (43a, 43b), and the fourth field-control electrode pair (44a, 44b), which are quadruple gates for performing the electric field control by the static induction effect in the direction perpendicular to the charge transport paths, are the same as those of the triple-output charge-modulation element of the first embodiment illustrated in FIGS. 1 to 4 and the like.

To begin with, in an objective that the electrons generated in the light-receiving area represented by the two-dot dashed line, being labeled by reference numeral 51, in the central portion of FIG. 12 are moved along the central bar of the letter H in the left direction of FIG. 12, and further moved to the charge transport path passing through between the second field-control electrode pair (42a, 42b), if the first field-control pulse $G_1$, the third field-control pulse $G_3$, and the fourth field-control pulse $G_D$ with a first potential level "L" of −1 V are applied to the respective first field-control electrode pair (41a, 41b), third field-control electrode pair (43a, 43b), and fourth field-control electrode pair (44a, 44b) and the second field-control pulse $G_2$ with a second potential level "H" of 1.8 V is applied to the second field-control electrode pair (42a, 42b), a left-downward-inclined potential gradient represented by the broken line in FIG. 14 is generated along the cross-sectional direction XIV-XIV (X-coordinate direction) of FIG. 12. Equipotential lines in the X-Y plane as looked down from a viewpoint above the pixel constructing area (34, 35), corresponding to the potential gradient represented by the broken line in FIG. 14, and a charge moving path (charge transport path) of electrons determined by the potential distribution of the equipotential lines are illustrated in FIG. 15.

On the other hand, in an objective that the electrons generated in the light-receiving area are moved along the central bar of the letter H in the right direction of FIG. 12, and further moved to the charge transport path passing through between the fourth field-control electrode pair (44a, 44b), if the first field-control pulse $G_1$, second field-control pulse $G_2$, and third field-control pulse $G_3$ with a first potential level "L" of −1 V are applied to the respective first field-control electrode pair (41a, 41b), second field-control electrode pair (42a, 42b), and third field-control electrode pair (43a, 43b) and fourth field-control pulse $G_D$ with a second potential level "H" of 1.8 V is applied to the fourth field-control electrode pair (44a, 44b), a right-downward-inclined potential gradient represented by the solid line in FIG. 14 is generated along the cross-sectional direction XIV-XIV of FIG. 12. Equipotential lines in the X-Y plane as looked down from a viewpoint above the pixel constructing area (34, 35), corresponding to the potential gradient represented by the solid line in FIG. 14, and a charge moving path (charge transport path) of electrons determined by the potential distribution of the equipotential lines are illustrated in FIG. 15.

Figure 13:
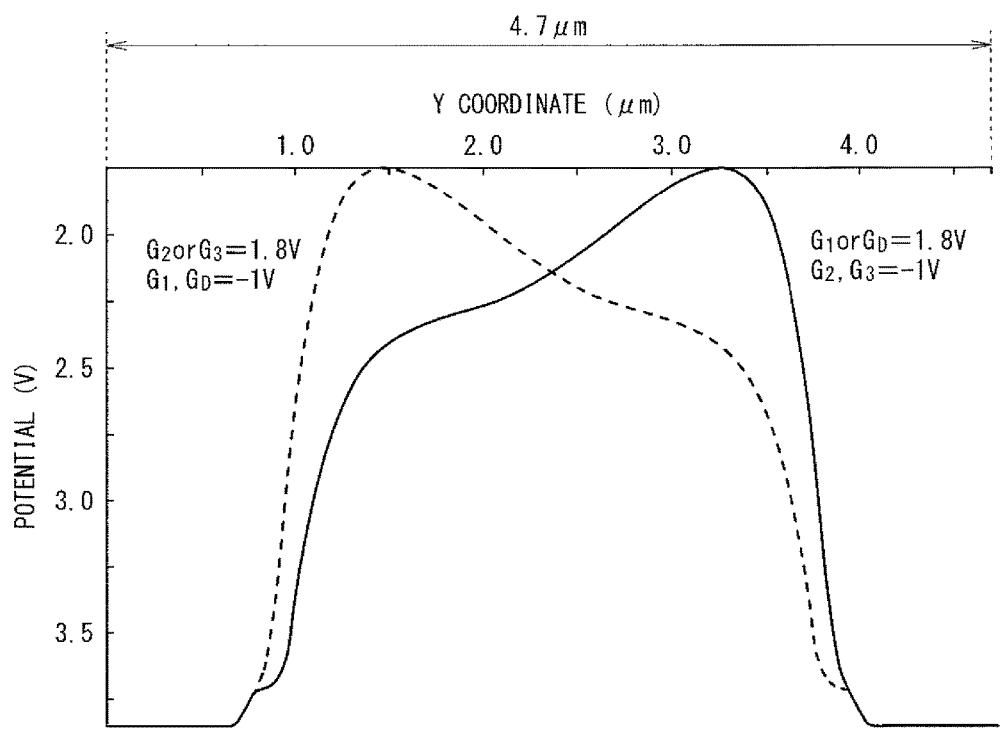
FIG. 13 is a view illustrating a potential distribution in a lower edge (bottom) of a conduction band in the triple-output charge-modulation element according to the modified example of the first embodiment as viewed in a direction XIII-XIII of FIG. 12 by using voltages applied to the first to fourth field-control electrodes as parameters.

In addition, in a case that the first and fourth field-control pulses $G_1$ and $G_D$ with a first potential level "L" of −1 V are applied to the respective first and fourth field-control electrode pairs (41a, 41b) and (44a, 44b) of FIG. 12 and the second or third field-control pulse $G_2$ or $G_3$ with a second potential level "H" of 1.8 V is applied to the second field-control electrode pair (42a, 42b) or the third field-control electrode pair (43a, 43b), the potential gradient along the cross-sectional direction XIII-XIII (Y-coordinate direction) of FIG. 12 becomes a right-downward-inclined profile represented by the broken line in FIG. 13. On the other hand, in a case that the second and third field-control pulses $G_2$ and $G_3$ with a first potential level "L" of −1 V are applied to the respective second and third field-control electrode pairs (42a, 42b) and (43a, 43b) of FIG. 12 and the first or fourth field-control pulse $G_1$ or $G_D$ with a second potential level "H" of 1.8 V is applied to the first field-control electrode pair (41a, 41b) or the fourth field-control electrode pair (44a, 44b), the potential gradient along the cross-sectional direction XIII-XIII of FIG. 12 becomes a left-downward-inclined profile represented by the solid line in FIG. 13.

Second Embodiment

As illustrated in FIG. 17, similarly to the structure illustrated in FIGS. 1 to 4, a triple-output charge-modulation element according to a second embodiment of the present invention encompasses a pixel constructing area (34, 35) including an active-area setting-layer made by a p-type semiconductor, an n-type surface buried region 35 provided in an upper portion of the active-area setting-layer, and a p-type pinning layer 34 being in contact with a surface of the surface buried region 35, an insulating film provided on the pixel constructing area (34, 35), a light-receiving area which is assigned at a central portion of the pixel constructing area (34, 35), n-type first, second, third, and fourth charge-accumulation regions 81, 82, 83, and 84 which have a higher impurity concentration than the active-area setting-layer, being separated from each other at quadruple positions symmetric with respect to a center position of the light-receiving area, surrounding the light-receiving area, and first, second, third, and fourth field-control electrode pairs (91a, 91b), (92a, 92b), (93a, 93b), and (94a, 94b) which are provided at positions surrounding the light-receiving area as pairs to both sides of respective charge transport paths, which extend from the center position of the light-receiving area on the insulating film to the respective first, second, third, and fourth charge-accumulation regions 81, 82, 83, and 84.

As understood from the plan view of FIG. 17, the arrangement topology of the first, second, third, and fourth charge-accumulation regions 81, 82, 83, and 84 has quadruple rotational symmetry with respect to the center position of the light-receiving area. As illustrated in FIG. 17, in the triple-output charge-modulation element pertaining to the second embodiment of the present invention, the n-type charge-extraction auxiliary-regions 85a, 85b, 85c, and 85d having a higher impurity concentration than the active-area setting-layer are further provided in the peripheral portion surrounding the light-receiving area to be separated from each other.

Although the cross-sectional view corresponding to FIG. 17 is omitted in illustration, similarly to the structure illustrated in the cross-sectional views of FIGS. 2A, 3A, and 4A, since the cross-sectional structure of the triple-output charge-modulation element pertaining to the second embodiment has the active-area setting-layer made by a p-type semiconductor, the n-type surface buried region 35 provided in a portion of the upper portion of the active-area setting-layer, and the p-type pinning layer 34 being in contact with the surface of the surface buried region 35, actually, the cross-sectional structure of the pixel constructing area (34, 35) in the triple-output charge-modulation element pertaining to the second embodiment is a triple-layer structure including the active-area setting-layer, and if the p-type substrate under the active-area setting-layer is included, the cross-sectional structure is a quadruple-layer structure. In addition, the insulating film is formed on the pinning layer 34.

In the triple-output charge-modulation element pertaining to the second embodiment, depletion potentials of the surface buried region 35 are sequentially changed, by periodically applying field-control pulses at different phases similarly to the timing diagram illustrated in FIG. 5 to the first, second, third, and fourth field-control electrode pairs (91a, 91b), (92a, 92b), (93a, 93b), and (94a, 94b), and thus, potential gradients toward the directions allowing the charges to be transported are sequentially formed in one of the charge transport paths, so that destinations of majority carriers generated in the surface buried region 35 are sequentially controlled so as to elect one of the first, second, third, and fourth charge-accumulation regions 81, 82, 83, and 84. In addition, as illustrated in FIG. 17, since the charge-extraction auxiliary-regions 85a, 85b, 85c, and 85d are provided to the peripheral portion, the charges of dark current components caused by background light or the like can be exhausted to the first charge-extraction auxiliary-region 85a and the fourth charge-extraction auxiliary-region 85d by applying to the first field-control electrode pair (91a, 91b) the charge extraction pulse having a potential level higher than the voltage for establishing the charge transport path.

When one pair of the first field-control electrodes 91a and 91b is applied with a voltage of first potential level "L", as represented by the broken line in FIG. 2C, the potential well for the holes of the potential distribution in the upper edge (top) of the valence band becomes deep, and thus, the holes are accumulated in the pinning layer. When one pair of the first field-control electrodes 91a and 91b is applied with a voltage of second potential level "H", as represented by the solid line in FIG. 2C, the potential well for the holes becomes shallow, and thus, the holes are depleted. Although omitted in illustration, when a voltage having a further larger third potential level "V" is applied, the potential well for the holes becomes shallower. On the other hand, similarly to the illustration of FIG. 2B, when one pair of the first field-control electrodes 91a and 91b is applied with the voltage of first potential level "L" or the voltage of second potential level "H", the depletion potential of the central portion is changed in a profile where a barrier along the lateral direction of the potential distribution in the lower edge (bottom) of the conduction band is generated. When a voltage of the third potential level "V" is applied, the barrier disappears, so that the charges are exhausted to the first charge-extraction auxiliary-region 85a and the fourth charge-extraction auxiliary-region 85d.

Similarly, the charges of dark current components can be exhausted to the first charge-extraction auxiliary-region 85a and the second charge-extraction auxiliary-region 85b by applying the charge extraction pulse having the third potential level "V" to the second field-control electrode pair (92a,

92b). Furthermore, the charges of dark current components can be exhausted to the fourth charge-extraction auxiliary-region 85d and the third charge-extraction auxiliary-region 85c by applying the charge extraction pulse having the third potential level "V" to the third field-control electrode pair (93a, 93b), and the charges of dark current components can be exhausted to the third charge-extraction auxiliary-region 85c and the second charge-extraction auxiliary-region 85b by applying the charge extraction pulse having the third potential level "V" to the fourth field-control electrode pair (94a, 94b). For example, if the voltage of first potential level "L" is −1 V and the voltage of second potential level "H" is 1.3 V for building up the charge transport path, a voltage of the third potential level "V" as the charge extraction pulse may be set to about 3 V.

In the triple-output charge-modulation element pertaining to the second embodiment, the charge transport paths implement an X-shape so that the charge transport paths cross each other at the center of the light-receiving area. Charge modulation can be performed by transporting photoelectrons generated in the light-receiving area along the X-shaped charge transport paths at a higher speed by electric field control in quadruple directions of the letter X by using first, second, third, and fourth field-control electrode pairs (91a, 91b), (92a, 92b), (93a, 93b), and (94a, 94b) which are quadruple gates performing the electric field control by static induction effect in the directions perpendicular to the respective charge transport paths.

In the triple-output charge-modulation element pertaining to the second embodiment, in an objective that the electrons generated in the light-receiving area represented by the two-dot dashed line, being labeled by reference numeral 51, in the central portion of FIG. 17, are transported along the X-shaped charge transport paths in the left upward direction of FIG. 17 to pass through between the first field-control electrode pair (91a, 91b), if the second field-control pulse $G_2$, the third field-control pulse $G_3$, and the fourth field-control pulse $G_D$ with a first potential level "L" of −1 V are applied to the respective second, third, and fourth field-control electrode pairs (92a, 92b), (93a, 93b), and (94a, 94b), and if the first field-control pulse $G_1$ with a second potential level "H" of 1.3 V is applied to the first field-control electrode pair (91a, 91b), a left-downward-inclined potential gradient represented by the broken line in FIG. 19 is generated along the cross-sectional direction XVII-XVII (left-upward-inclined diagonal direction) of FIG. 17. Equipotential lines in the X-Y plane as looked down from a viewpoint above the pixel constructing area (34, 35) corresponding to the potential gradient represented by the broken line in FIG. 19 and the charge moving path (charge transport path) of electrons determined by the potential distribution of the equipotential lines are illustrated in FIG. 20.

On the other hand, in an objective that the electrons generated in the light-receiving area are transported along the X-shaped charge transport paths in the right downward direction of FIG. 17 to pass through between the fourth field-control electrode pair (94a, 94b), if the first, second, and third field-control pulses $G_1$, $G_2$, and $G_3$ with a first potential level "L" of −1 V are applied to the respective first, second, and third field-control electrode pairs (91a, 91b), (92a, 92b), and (93a, 93b), and if the fourth field-control pulse $G_D$ with a second potential level "H" of 1.3 V is applied to the fourth field-control electrode pair (94a, 94b), a right-downward-inclined potential gradient represented by the solid line in FIG. 19 is generated along the cross-sectional direction XVII-XVII of FIG. 17. Equipotential lines in the X-Y plane as looked down from a viewpoint above the pixel constructing area (34, 35) corresponding to the potential gradient represented by the solid line in FIG. 19 and the charge moving path (charge transport path) of electrons determined by the potential distribution of the equipotential lines are illustrated in FIG. 21.

In addition, in a case that the first or fourth field-control pulse $G_1$ or $G_D$ with a second potential level "H" of 1.3 V is applied to the first field-control electrode pair (91a, 91b) or the fourth field-control electrode pair (94a, 94b) of FIG. 17, and that the second and third field-control pulses $G_2$ and $G_3$ with a first potential level "L" of −1 V are applied to the second field-control electrode pairs (92a, 92b) and the third field-control electrode pairs (93a, 93b), the potential gradient along the cross-sectional direction XIII-XIII (right-upward-inclined diagonal direction) of FIG. 17 becomes a two-humped profile having a shallow recess in the central portion illustrated in FIG. 18.

As described heretofore, according to the triple-output charge-modulation element pertaining to the second embodiment, in comparison with a case where the potential just under the gate electrode is controlled toward the vertical direction (depth direction) by using a MOS structure of the related art, since the electric field control by static induction effect along the lateral direction (perpendicular to the direction of the charge transport path) is used, the electric field becomes substantially uniform over a long distance of the charge transport path, and therefore, the signal charges are transported at a higher speed while symmetry is maintained. Particularly, in comparison with the equipotential lines profile of the H-shaped charge transport paths illustrated in FIGS. 15 and 16, the equipotential lines profile of the X-shaped charge transport paths illustrated in FIGS. 20 and 21 is excellent in the symmetry of the charge transport paths toward the quadruple charge-accumulation regions (first, second, third, and fourth charge-accumulation regions 81, 82, 83, and 84). Namely, if the triple-output charge-modulation element pertaining to the second embodiment is applied to a TOF range sensor, in comparison with the case of the H-shaped charge transport paths, distance measurement can be performed more accurately. Furthermore, as a result of excellent symmetry of the charge transport paths, the charge-modulation element is less susceptible to the influence of deviation of mask alignment in the manufacturing process. In addition, in comparison with a CMOS TOF range image sensor using a buried photodiode of the related art, naturally, the topology of the charge transport paths can be established by an X-shape having a high symmetry, and the length of the charge transport path can be taken to be long. Therefore, a substantial planar dimension of the light-receiving area is further increased, so that high sensitivity can be achieved.

In addition, as described in the advantageous features of the triple-output charge-modulation element of the first embodiment, in contrast to the structure where the potential just under the gate electrode is controlled toward the vertical direction by using a MOS structure of the related art, in which noise or dark current is caused by interface defects, interface states, or the like in the interface between the gate oxide film and the silicon surface, according to the triple-output charge-modulation element pertaining to the second embodiment, since the electric field is control by static induction effect along the lateral direction, it is possible to avoid the problem of generation of the noise or the dark current caused by the interface defects, the interface states, or the like in the interface between the gate oxide film and the silicon surface or the problem of deterioration in transport speed.

In addition, according to the triple-output charge-modulation element pertaining to the second embodiment, the signal charges are sequentially transported at a higher speed, being alternatively distributed to the first charge read-out region 61, second charge read-out region 62, and third charge read-out region 63 assigned at the triple end portions of the X-shaped charge transport paths, and the charges which become the component of the dark current according to the background light can be exhausted to the fourth charge-accumulation region (charge-extraction region) 64 allocated at the fourth end portion of the X-shaped charge transport paths. Therefore, the charge-modulation element is not limited to the TOF range sensor, but it can be applied to observation of physical phenomenon where the same phenomenon is repeated in an extremely short time. For example, if the triple-output charge-modulation element pertaining to the second embodiment is applied as an element of measuring a lifetime of a fluorescent material, a substantially uniform electric field is established over a long distance in the direction of the charge transport path, so that the signal charges can be transported at a higher speed. Therefore, the measurement with a higher accuracy can be established.

Third Embodiment

As illustrated in FIGS. 22, 23A, and 25A, a quadruple-output charge-modulation element according to a third embodiment of the present invention encompasses a pixel constructing area (32, 34, 35) including an active-area setting-layer 32 made by a p-type semiconductor, an n-type surface buried region 35 provided in an upper portion of the active-area setting-layer 32, and a p-type pinning layer 34 being in contact with a surface of the surface buried region 35, an insulating film 11 provided on the pixel constructing area (32, 34, 35), a light-receiving area which is assigned at a central portion of the pixel constructing area (32, 34, 35), n-type first, second, third, and fourth charge-accumulation regions 81, 82, 83, and 84 which have a higher impurity concentration than the active-area setting-layer 32, being separated from each other at quadruple positions symmetric with respect to a center position of the light-receiving area, surrounding the light-receiving area, and first, second, third, and fourth field-control electrode pairs (91a, 91b), (92a, 92b), (93a, 93b), and (94a, 94b) which are provided at positions surrounding the light-receiving area as pairs to both sides of respective charge transport paths, which extend from the center position of the light-receiving area on the insulating film 11 to the respective first, second, third, and fourth charge-accumulation regions 81, 82, 83, and 84. As understood from the plan view of FIG. 22, the arrangement topology of the first, second, third, and fourth charge-accumulation regions 81, 82, 83, and 84 acting as quadruple-output terminals has quadruple rotational symmetry with respect to the center position of the light-receiving area.

As illustrated in the cross-sectional views of FIGS. 23A and 25A, since the cross-sectional structure of the quadruple-output charge-modulation element pertaining to the third embodiment has the active-area setting-layer 32 made by a p-type semiconductor, the n-type surface buried region 35 provided in a portion of the upper portion of the active-area setting-layer 32, and the p-type pinning layer 34 being in contact with the surface of the surface buried region 35, actually, the cross-sectional structure of the pixel constructing area (32, 34, 35) in the quadruple-output charge-modulation element pertaining to the third embodiment is a triple-layer structure including the active-area setting-layer 32, and if the p-type semiconductor substrate 31 under the active-area setting-layer 32 is included, the cross-sectional structure is a quadruple-layer structure. In addition, the insulating film 11 is formed on the pinning layer 34.

As illustrated in FIG. 22, in the quadruple-output charge-modulation element pertaining to the third embodiment of the present invention, the n-type first, second, third, and fourth charge-extraction auxiliary-regions 85a, 85b, 85c, and 85d having a higher impurity concentration than the active-area setting-layer 32 are further provided in the peripheral portion surrounding the light-receiving area, being separated from each other. A convex portion of the first charge-extraction auxiliary-region 85a formed in a T-shape is inserted between the first field-control electrode 91b and the second field-control electrode 92a, and as illustrated in FIG. 23A, an apex of the convex portion protruding from the T-shape faces the n-type surface buried region 35 through the p-type active-area setting-layer 32. In addition, a convex portion of the second charge-extraction auxiliary-region 85b formed in a T-shape is inserted between the second field-control electrode 92b and the fourth field-control electrode 95a, and an apex of the convex portion faces the surface buried region 35 through the active-area setting-layer 32, the convex portion is a portion protruding from the T-shape. Furthermore, a convex portion of the third charge-extraction auxiliary-region 85c formed in a T-shape is inserted between the fourth field-control electrode 95b and the third field-control electrode 93a, and as illustrated in FIG. 23A, an apex of the convex portion faces the n-type surface buried region 35 through the p-type active-area setting-layer 32. A convex portion of fourth charge-extraction auxiliary-region 85d formed in a T-shape is inserted between the third field-control electrode 93b and the first field-control electrode 91a, and an apex of the convex portion faces the surface buried region 35 through the active-area setting-layer 32.

Furthermore, a first charge transfer gate electrode 96a which transfers charges ascribable to the dark current generated in the light-receiving area by the background light from the surface buried region 35 to the first charge-extraction auxiliary-region 85a by using the p-type active-area setting-layer 32 as a channel region and controlling a potential of the channel region according to a MOS structure is provided between the first field-control electrode 91b and the second field-control electrode 92a. Furthermore, a second charge transfer gate electrode 96b which transfers charges ascribable to the dark current generated in the light-receiving area from the surface buried region 35 to the second charge-extraction auxiliary-region 85b is provided between the second field-control electrode 92b and the fourth field-control electrode 95a, a third charge transfer gate electrode 96c which transfers the charges ascribable to the dark current to the third charge-extraction auxiliary-region 85c is provided between the fourth field-control electrode 95b and the third field-control electrode 93a, a fourth charge transfer gate electrode 96d which transfers the charges ascribable to the dark current to the fourth charge-extraction auxiliary-region 85d is provided between third field-control electrode 93b and the first field-control electrode 91a.

In order to transfer charges to one of the first, second, third, and fourth charge-accumulation regions 81, 82, 83, and 84 along one of the charge transport paths along the quadruple directions implemented by an X-shape, by applying the charge extraction control pulse $G_D$ with a first potential level "L"$_D$ of voltage to each of the first, second, third, and fourth charge transfer gate electrodes 96a, 96b, 96c, and 96d, a potential barrier as represented by the solid line of FIG. 23B is generated on the surface of the p-type active-area setting-layer 32 just under each of the first, second, third, and fourth charge transfer gate electrodes 96a, 96b, 96c, and 96d.

More specifically, under a condition that the first field-control pulse $G_1$, the third field-control pulse $G_3$, and the fourth field-control pulse $G_D$ with a first potential level "L" of −1 V are applied to the respective first, third, and fourth field-control electrode pairs (91a, 91b), (93a, 93b), and (94a, 94b), the second field-control pulse $G_2$ with a second potential level "H" of 1.8 V is applied to the second field-control electrode pair (92a, 92b), and the charge extraction control pulse $G_D$ with a first potential level "$L"_D$ of 1 V is applied to each of the first, second, third, and fourth charge transfer gate electrodes 96a, 96b, 96c, and 96d, the solid line in FIG. 23B becomes a right-downward-inclined two-humped profile having a shallow recess in the central portion represented by the broken line in FIG. 24. On the other hand, under a condition that the first, second, and fourth field-control pulses $G_1$, $G_2$, and $G_4$ with a first potential level "L" of −1 V are applied to the respective first, second, and fourth field-control electrode pairs (91a, 91b), (92a, 92b), and (94a, 94b), the third field-control pulse $G_3$ with a second potential level "H" of 1.8 V is applied to the third field-control electrode pair (93a, 93b), and the charge extraction control pulse $G_D$ with a first potential level "$L"_D$ of 1 V is applied to the each of the first, second, third, and fourth charge transfer gate electrodes 96a, 96b, 96c, and 96d, the solid line in FIG. 23B becomes a left-downward-inclined two-humped profile having a shallow recess in the central portion represented by the solid line in FIG. 24.

In the quadruple-output charge-modulation element pertaining to the third embodiment, in the state that potential barriers are generated just under the respective first, second, third, and fourth charge transfer gate electrodes 96a, 96b, 96c, and 96d, quadruple field-control pulses at different phases are periodically applied to the first, second, third, and fourth field-control electrode pairs (91a, 91b), (92a, 92b), (93a, 93b), and (94a, 94b) as illustrated in the timing diagram illustrated in FIG. 31. If the field-control pulses at different phases are applied, since the depletion potential of the surface buried region 35 is sequentially changed along the X-shaped charge transport paths, the potential gradient which can transport the changes is sequentially formed in one of the charge transport paths along the X-shaped quadruple directions. The potential gradient is sequentially formed in one of the charge transport paths along the quadruple directions, so that destinations of majority carriers generated in the surface buried region 35 are sequentially elected to one of the first, second, third, and fourth charge-accumulation regions 81, 82, 83, and 84.

On the other hand, under a condition that each of the first, second, third, and fourth charge transfer gate electrodes 96a, 96b, 96c, and 96d is applied with the charge extraction control pulse $G_D$ with a second potential level "$H"_D$ of voltage, the height of the potential barrier just under each of the first, second, third, and fourth charge transfer gate electrodes 96a, 96b, 96c, and 96d is decreased as represented by the broken line in FIG. 23B. More specifically, under a condition that the first, second, third, and fourth field-control pulses $G_1$, $G_2$, $G_3$, and $G_4$ with a first potential level "L" of −1 V are applied to the respective first, second, third, and fourth field-control electrode pairs (91a, 91b), (92a, 92b), (93a, 93b), and (94a, 94b), and that the charge extraction control pulse $G_D$ with a second potential level "$H"_D$ of 3.3 V is applied to each of the first, second, third, and fourth charge transfer gate electrodes 96a, 96b, 96c, and 96d, the broken line in FIG. 23B becomes the profile represented by the two-dot dashed line in FIG. 24. Equipotential lines in the X-Y plane as looked down from a viewpoint above the pixel constructing area (32, 34, 35) corresponding to the potential gradient represented by the two-dot dashed line in FIG. 24 and the charge moving path (charge transport path) of electrons determined by the potential distribution of the equipotential lines are illustrated in FIG. 28, where the illustration is focused to only the charge transport path leading to the first charge-extraction auxiliary-region 85a. If each of the first, second, third, and fourth charge transfer gate electrodes 96a, 96b, 96c, and 96d is simultaneously applied with the charge extraction control pulse $G_D$ with a second potential level "$H"_D$ of 3.3 V the charge transport paths leading to the respective second, third, and fourth charge-extraction auxiliary-regions 85b, 85c, and 85d are also simultaneously established.

If the height of the potential barrier is decreased as represented by the broken line in FIG. 23B, the charges of dark current components caused by the background light or the like can be exhausted from the surface buried region 35 to each of the first, second, third, and fourth charge-extraction auxiliary-regions 85a, 85b, 85c, and 85d.

In the quadruple-output charge-modulation element pertaining to the third embodiment, the charge transport paths implement an X-shape so that the charge transport paths cross each other at the center of the light-receiving area. Charge modulation can be performed by transporting photoelectrons generated in the light-receiving area along the X-shaped charge transport paths at a higher speed by electric field control in quadruple directions of the letter X by using first, second, third, and fourth field-control electrode pairs (91a, 91b), (92a, 92b), (93a, 93b), and (94a, 94b) which are quadruple gates performing the electric field control by static induction effect in the directions perpendicular to the respective charge transport paths.

In the quadruple-output charge-modulation element pertaining to the third embodiment, in an objective that the electrons generated in the light-receiving area represented by the two-dot dashed line, being labeled by reference numeral 51, in the central portion of FIG. 22 are transported along the X-shaped charge transport paths in the left upward direction of FIG. 22 to pass through between the first field-control electrode pair (91a, 91b), under a condition that the charge extraction control pulse $G_D$ with a first potential level "$L"_D$ of 1 V is applied to each of the first, second, third, and fourth charge transfer gate electrodes 96a, 96b, 96c, and 96d, if the second, the third, and the fourth field-control pulses $G_2$, $G_3$, and $G_4$ with a first potential level "L" of −1 V are applied to the respective second, third, and fourth field-control electrode pairs (92a, 92b), (93a, 93b), and (94a, 94b), and if the first field-control pulse $G_1$ with a second potential level "H" of 1.8 V is applied to the first field-control electrode pair (91a, 91b), a left-downward-inclined potential gradient represented by the broken line in FIG. 27 is generated along the cross-sectional direction XXVII-XXVII (left-upward-inclined diagonal direction) of FIG. 22. In this condition, the potential gradient along the cross-sectional direction XXV-XXV (right-upward-inclined diagonal direction) of FIG. 22 becomes a two-humped profile having a shallow recess in the central portion illustrated by FIG. 26. Equipotential lines in the X-Y plane as looked down from a viewpoint above the pixel constructing area (32, 34, 35) corresponding to the potential gradient represented by the broken line in FIG. 27 and the charge moving path (charge transport path) of electrons determined by the potential distribution of the equipotential lines are illustrated in FIG. 28.

On the other hand, the electrons generated in the light-receiving area are transported along the X-shaped charge transport paths in the right downward direction of FIG. 22 to pass through between the fourth field-control electrode pair (94a, 94b), under a condition that the charge extraction control pulse $G_D$ with a first potential level "$L"_D$ of 1 V is applied to each of the first, second, third, and fourth charge transfer gate electrodes 96a, 96b, 96c, and 96d, if the first, second, and third field-control pulses $G_1$, $G_2$, and $G_3$ with a first potential level "L" of −1 V are applied to the respective first, second, and third field-control electrode pairs (91a, 91b), (92a, 92b), and (93a, 93b), and if the fourth field-control pulse $G_D$ with a second potential level "H" of 1.8 V is applied to the fourth field-control electrode pair (94a, 94b), a right-downward-inclined potential gradient represented by the solid line in FIG. 27 is generated along the cross-sectional direction XXVII-XXVII of FIG. 22. In this condition, the potential gradient along the cross-sectional direction XXV-XXV (right-upward-inclined diagonal direction) of FIG. 22 becomes a two-humped profile having a shallow recess in the central portion illustrated in FIG. 26. Equipotential lines in the X-Y plane as looked down from a viewpoint above the pixel constructing area (32, 34, 35) corresponding to the potential gradient represented by the solid line in FIG. 27 and the charge moving path (charge transport path) of electrons determined by the potential distribution of the equipotential lines are illustrated in FIG. 29. From FIGS. 27 to 29 and the like, it can be understood that the potential distribution in the X-Y plane transporting the electrons in the direction of the first charge-accumulation region 81 is generated, while generating the potential barrier in the directions of the second, the third, and the fourth charge-accumulation regions 82, 83, and 84, or that the potential distribution in the X-Y plane transporting the electrons in the direction of the fourth charge-accumulation region 84 is generated, while generating the potential barrier in the directions of the first, the second, and the third charge-accumulation regions 81, 82, and 83, by changing the voltages of the first, second, third, and fourth field-control pulses $G_1$, $G_2$, $G_3$, and $G_4$.

Similarly, in the quadruple-output charge-modulation element pertaining to the third embodiment, the electrons generated in the light-receiving area represented by the two-dot dashed line, being labeled by reference numeral 51, in the central portion of FIG. 22 are transported along the X-shaped charge transport paths in the right upward direction of FIG. 22 to pass through between the third field-control electrode pair (93a, 93b), under a condition that the charge extraction control pulse $G_D$ with a first potential level "$L"_D$ of 1 V is applied to each of the first, second, third, and fourth charge transfer gate electrodes 96a, 96b, 96c, and 96d, if the first, second, and fourth field-control pulses $G_1$, $G_2$, and $G_4$ with a first potential level "L" of −1 V are applied to the respective first, second, and fourth field-control electrode pairs (91a, 91b), (92a, 92b), and (94a, 94b), and if the third field-control pulse $G_3$ with a second potential level "H" of 1.8 V is applied to the third field-control electrode pair (93a, 93b), a right-downward-inclined potential gradient represented by the broken line in FIG. 25 is generated along the cross-sectional direction XXV-XXV (right-upward-inclined diagonal direction) of FIG. 22.

In addition, the electrons generated in the light-receiving area are transported along the X-shaped charge transport paths in the left downward direction of FIG. 22 to pass through between the second field-control electrode pair (92a, 92b), under a condition that the charge extraction control pulse $G_D$ with a first potential level "$L"_D$ of 1 V are applied to each of the first, second, third, and fourth charge transfer gate electrodes 96a, 96b, 96c, and 96d, if the first, third, and fourth field-control pulses $G_1$, $G_3$, and $G_4$ with a first potential level "L" of −1 V are applied to the respective first, third, and fourth field-control electrode pairs (91a, 91b), (93a, 93b), and (94a, 94b), and if the second field-control pulse $G_2$ with a second potential level "H" of 1.8 V is applied to the second field-control electrode pair (92a, 92b), a left-downward-inclined potential gradient represented by the solid line in FIG. 27 is generated.

FIG. 31 illustrates operation timing of the quadruple-output charge-modulation element pertaining to the third embodiment. In the integration period when the light pulse is received and the modulated charges are accumulated, the charge-modulation element is operated by periodically applying quintuple gate signals implemented by the first, second, third, and fourth field-control pulses $G_1$, $G_2$, $G_3$, and $G_4$, and the charge extraction control pulse as illustrated in FIG. 31. In the period when the first field-control pulse $G_1$ is at the second potential level "H", the second field-control pulse $G_2$ is at the first potential level "L", the third field-control pulse $G_3$ is at the first potential level "L", the fourth field-control pulse $G_4$ is at the first potential level "L", and the charge extraction control pulse $G_D$ is at the first potential level "$L_D$", the signal charges generated in the light-receiving area are transferred to the first charge-accumulation region 81 illustrated in FIG. 22. In the period when the second field-control pulse $G_2$ is at the second potential level "H", the first field-control pulse $G_1$ is at the first potential level "L", the third field-control pulse $G_3$ is at the first potential level "L", the fourth field-control pulse $G_4$ is at the first potential level "L", and the charge extraction control pulse $G_D$ is at the first potential level "$L_D$", the signal charges generated in the light-receiving area are transferred to the second charge-accumulation region 82. In the period when the third field-control pulse $G_3$ is at the second potential level "H", the first field-control pulse $G_1$ is at the first potential level "L", the third field-control pulse $G_3$ is at the first potential level "L", the fourth field-control pulse $G_4$ is at the first potential level "L", and the charge extraction control pulse $G_D$ is at the first potential level "$L_D$", the signal charges generated in the light-receiving area are transferred to the third charge-accumulation region 83. In the period when the fourth field-control pulse $G_4$ is at the second potential level "H", the first field-control pulse $G_1$ is at the first potential level "L", the second field-control pulse $G_2$ is at the first potential level "L", the third field-control pulse $G_3$ is at the first potential level "L", and the charge extraction control pulse $G_D$ is at the first potential level "$L_D$", the signal charges generated in the light-receiving area are transferred to the terminal of the fourth charge-accumulation region 84.

On the other hand, in the period when the charge extraction control pulse $G_D$ is at the second potential level "$H_D$", the first field-control pulse $G_1$ is at the first potential level "L", the second field-control pulse $G_2$ is at the first potential level "L", the third field-control pulse $G_3$ is at the first potential level "L", and the fourth field-control pulse $G_4$ is at the first potential level "L", the signal charges generated in the light-receiving area are exhausted to the first, second, third, and fourth charge-extraction auxiliary-regions 85a, 85b, 85c, and 85d.

At this time, if the light pulse arrives at the timing of the first incoming light of FIG. 31, the charge amounts Q1, Q2, and Q3 accumulated in the respective first, second, and third charge-accumulation regions 81, 82, and 83 are expressed as Eq. (5), (3), and (4). In addition, the charge Q4 accumulated in the fourth charge-accumulation region 84 is expressed as follows:

$$Q4=I_aT_0 \quad (15)$$

The TOF of the light is obtained by Eq. (6).

If the light pulse arrives at the timing of the second incoming light of FIG. 31, when the TOF (delay time) at this time is denoted by $T_{d2}$, the charge amounts Q1, Q2, Q3, and Q4 accumulated in the respective first, second, third, and fourth charge-accumulation regions 81, 82, 83, and 84 at this time are expressed as follows:

$$Q1=I_aT_0 \quad (16)$$

$$Q2=I_aT_0 \quad (17)$$

$$Q3=I_{ph}(2T_0-T_{d2})+I_aT_0 \quad (18)$$

$$Q4=I_{ph}(2T_{d2}-T_0)+I_aT_0 \quad (19)$$

By using these formulas, the $T_{d2}$ can be obtained as the following Formula:

$$T_{d2}=T_0+T_0(Q4-Q1)/(Q4+Q3-2Q1) \quad (20)$$

In this manner, if the quadruple-output charge-modulation element pertaining to the third embodiment is used, the distance measurement can be performed in a range of the TOF of twice $T_0$ by using the pulse width of $T_0$.

Whether or not the TOF of the light pulse is larger than the pulse width $T_0$ is found by comparing Q2 and Q4. Namely, if Q2>Q4, the TOF of the light pulse is calculated by using Eq. (6), and if Q2≤Q4, the TOF of the light pulse is calculated by using Eq. (20).

FIG. 32 illustrates operation timing in the case of obtaining the distance corresponding to the delay time of three times the pulse width $T_0$ of the outgoing light by using the quadruple-output charge-modulation element pertaining to the third embodiment. In this case, the light pulse width $T_0$ and the pulse widths of the first, second, third, and fourth field-control pulses $G_1$, $G_2$, $G_3$, and $G_4$ are set to be equal. With respect to the outgoing light pulse, in the case (first incoming light) where the delay time (TOF) of the received incoming light pulse is the delay time $T_{d1}$ of FIG. 32, the charge amounts Q1, Q2, Q3, and Q4 are expressed as follows:

$$Q1=I_{ph}(T_0-T_{d2})+I_aT_0 \quad (21)$$

$$Q2=I_{ph}T_{d1}+I_aT_0 \quad (22)$$

$$Q3=I_aT_0 \quad (23)$$

$$Q4=I_aT_0 \quad (24)$$

Therefore, $T_{d1}$ can be obtained by the following Formula:

$$T_{d1}=T_0(Q2-Q4)/(Q1+Q2-2Q4) \quad (25)$$

With respect to the outgoing light pulse, in the case (second arriving pulse) where the delay time (TOF) of the received incoming light pulse is the delay time $T_{d2}$ of FIG. 32, the charge amounts Q1, Q2, Q3, and Q4 accumulated in the respective first, second, third, and fourth charge-accumulation regions 81, 82, 83, and 84 are expressed as follows:

$$Q1=I_aT_0 \quad (26)$$

$$Q2=I_{ph}(2T_0-T_{d2})+I_aT_0 \quad (27)$$

$$Q3=I_{ph}(T_{d2}-T_0)+I_aT_0 \quad (28)$$

$$Q4=I_aT_0 \quad (29)$$

Therefore, the delay time $T_{d2}$ can be obtained by the following Formula:

$$T_{d2}=T_0+T_0(Q3-Q1)/(Q2+Q3-2Q1) \quad (30)$$

With respect to the outgoing light pulse, in the case (third arriving pulse) where the delay time (TOF) of the received incoming light pulse is the delay time $T_{d3}$ of FIG. 32, the charge amounts Q1, Q2, Q3, and Q4 accumulated in the respective first, second, third, and fourth charge-accumulation regions 81, 82, 83, and 84 are expressed as follows:

$$Q1=I_aT_0 \quad (31)$$

$$Q2=I_aT_0 \quad (32)$$

$$Q3=I_{ph}(3T_0-T_{d3})+I_aT_0 \quad (33)$$

$$Q4=I_{ph}(T_{d3}-2T_0)+I_aT_0 \quad (34)$$

Therefore, the delay time $T_{d3}$ can be obtained by the following Formula:

$$T_{d3}=2T_0+T_0(Q4-Q1)/(Q3+Q4-2Q1) \quad (35)$$

Which time zone the TOF of the light pulse exists in is found by comparison of charges, and which of Eqs. (25), (30), and (35) is used according to the time zone is determined as listed in Table 1, so that the distance corresponding to the delay time of three times the pulse width $T_0$ can be measured.

TABLE 1

| Condition | Time zone of TOF of light | Used Formula |
|---|---|---|
| $Q_1 > Q_3$, $Q_2 > Q_4$ | $0 < T_d \le T_0$ | Eq. (25) |
| $Q_1 \le Q_3$, $Q_2 > Q_4$ | $T_0 < T_d \le 2T_0$ | Eq. (30) |
| $Q_1 \le Q_3$, $Q_2 \le Q_4$ | $2T_0 < T_d \le 3T_0$ | Eq. (35) |

In this manner, according to the quadruple-output charge-modulation element pertaining to the third embodiment, in comparison with a case where the potential just under the gate electrode is controlled toward the vertical direction (depth direction) by using a MOS structure of the related art, since the electric field control by static induction effect along the lateral direction (perpendicular to the direction of the charge transport path) is used, the electric field becomes substantially uniform over a long distance of the charge transport path, and therefore, the signal charges are transported at a higher speed while symmetry is maintained. Particularly, in comparison with the equipotential lines profile of the H-shaped charge transport paths illustrated in FIGS. 15 and 16, the equipotential lines profile of the X-shaped charge transport paths illustrated in FIGS. 28 and 29 is excellent in the symmetry of the charge transport paths toward the quadruple charge-accumulation regions (first, second, third, and fourth charge-accumulation regions 81, 82, 83, and 84). Namely, if the quadruple-output charge-modulation element pertaining to the third embodiment is applied to a TOF range sensor, in comparison with the case of the H-shaped charge transport paths, distance measurement can be performed more accurately. Furthermore, as a result of excellent symmetry of the charge transport paths, the charge-modulation element is less susceptible to the influence of deviation of mask alignment in the manufacturing process. In addition, in comparison with a CMOS TOF range image sensor using a buried photodiode of the related art, naturally, the topology of the charge transport paths can be achieved by an X-shape having a high symmetry, and the length of the charge transport path can be taken to be long. Therefore, a substantial planar dimension of the light-receiving area is further increased, so that high sensitivity can be achieved.

In addition, as described in the advantageous features of the quadruple-output charge-modulation element of the first embodiment, in contrast to the structure where the potential just under the gate electrode is controlled toward the vertical direction by using a MOS structure of the related art, in which noise or dark current is caused by interface defects, interface states, or the like in the interface between the gate oxide film and the silicon surface, according to the quadruple-output charge-modulation element pertaining to the third embodiment, since the electric field is control by static induction effect along the lateral direction, it is possible to avoid the problem of generation of the noise or the dark current caused by the interface defects, the interface states, or the like in the interface between the gate oxide film and the silicon surface or the problem of deterioration in transport speed.

In addition, according to the quadruple-output charge-modulation element pertaining to the third embodiment, the signal charges are sequentially transported at a higher speed, being alternatively distributed to the first, second, third, and fourth charge read-out regions 81, 82, 83, and 84 allocated at the quadruple end portions of the X-shaped charge transport paths. Therefore, the charge-modulation element is not limited to the TOF range sensor, but it can be applied to observation of physical phenomenon where the same phenomenon is repeated in an extremely short time. For example, if the quadruple-output charge-modulation element pertaining to the third embodiment is applied as an element of measuring a lifetime of a fluorescent material, a substantially uniform electric field is established over a long distance in the direction of the charge transport path, so that the signal charges can be transported at a higher speed. Therefore, the measurement with a higher accuracy can be established.

Fourth Embodiment

As illustrated in FIGS. 33 and 34A, a quadruple-output charge-modulation element according to a fourth embodiment of the present invention encompasses a pixel constructing area (32, 34, 35) including an active-area setting-layer 32 made by a p-type semiconductor, an n-type surface buried region 35 provided in an upper portion of the active-area setting-layer 32, and a p-type pinning layer 34 being in contact with a surface of the surface buried region 35, an insulating film 11 provided on the pixel constructing area (32, 34, 35), a light-receiving area which is assigned at a central portion of the pixel constructing area (32, 34, 35), n-type first, second, third, and fourth charge-accumulation regions 81, 82, 83, and 84 which have a higher impurity concentration than the active-area setting-layer 32, being separated from each other at quadruple positions symmetric with respect to a center position of the light-receiving area, surrounding the light-receiving area, and first, second, third, and fourth field-control electrode pairs (91*a*, 91*b*), (92*a*, 92*b*), (93*a*, 93*b*), and (94*a*, 94*b*) which are provided at positions surrounding the light-receiving area as pairs to both sides of respective charge transport paths, which extend from the center position of the light-receiving area on the insulating film 11 to the respective first, second, third, and fourth charge-accumulation regions 81, 82, 83, and 84. As understood from the plan view of FIG. 33, the arrangement topology of the first, second, third, and fourth charge-accumulation regions 81, 82, 83, and 84 acting as quadruple-output terminals has quadruple rotational symmetry with respect to center position of the light-receiving area.

As illustrated in the cross-sectional view of FIG. 34A, since the cross-sectional structure of the quadruple-output charge-modulation element pertaining to the fourth embodiment has the active-area setting-layer 32 made by a p-type semiconductor, the n-type surface buried region 35 provided in a portion of the upper portion of the active-area setting-layer 32, and the p-type pinning layer 34 being in contact with the surface of the surface buried region 35, actually, the cross-sectional structure of the pixel constructing area (32, 34, 35) in the quadruple-output charge-modulation element pertaining to the fourth embodiment is a triple-layer structure including the active-area setting-layer 32, and if the p-type semiconductor substrate 31 under the active-area setting-layer 32 is included, the cross-sectional structure is a quadruple-layer structure. In addition, the insulating film 11 is formed on the pinning layer 34.

As illustrated in FIG. 33, in the quadruple-output charge-modulation element pertaining to the fourth embodiment of the present invention, the n-type first, second, third, and fourth charge-extraction auxiliary-regions 85*a*, 85*b*, 85*c*, and 85*d* having a higher impurity concentration than the active-area setting-layer 32 are further provided in the peripheral portion surrounding the light-receiving area, being separated from each other. A convex portion of the first charge-extraction auxiliary-region 85*a* formed in a T-shape is inserted between the first field-control electrode 91*b* and the second field-control electrode 92*a*, and similarly to the illustration of FIG. 23A of the third embodiment, an apex of the convex portion faces the n-type surface buried region 35 through the p-type active-area setting-layer 32. In addition, a convex portion of the second charge-extraction auxiliary-region 85*b* formed in a T-shape is inserted between the second field-control electrode 92*b* and the third field-control electrode 93*a*, and an apex of the convex portion faces the surface buried region 35 through the active-area setting-layer 32. Furthermore, a convex portion of the third charge-extraction auxiliary-region 85*c* formed in a T-shape is inserted between the third field-control electrode 93*b* and the fourth field-control electrode 94*a*, and as illustrated in FIG. 23A, an apex of the convex portion faces the n-type surface buried region 35 through the p-type active-area setting-layer 32. A convex portion of the fourth charge-extraction auxiliary-region 85*d* formed in a T-shape is inserted between the fourth field-control electrode 94*b* and the first field-control electrode 91*a*, and an apex of the convex portion faces the surface buried region 35 through the active-area setting-layer 32.

Furthermore, a first charge transfer gate electrode 96*a* which transfers charges ascribable to the dark current generated in the light-receiving area by the background light from the surface buried region 35 to the first charge-extraction auxiliary-region 85*a* by using the p-type active-area setting-layer 32 as a channel region and controlling a potential of the channel region according to a MOS structure is provided between the first field-control electrode 91*b* and the second field-control electrode 92*a*. Furthermore, a second charge transfer gate electrode 96*b* which transfers charges ascribable to the dark current generated in the light-receiving area from the surface buried region 35 to the second charge-extraction auxiliary-region 85*b* is provided between the second field-control electrode 92*b* and the third field-control electrode 93*a*, a third charge transfer gate electrode 96*c* which transfers charges ascribable to the dark current to the third charge-extraction auxiliary-region 85*c* is provided between the third field-control electrode 93*b* and the fourth field-control electrode 94*a*, and a fourth charge transfer gate electrode 96*d* which transfers charges ascribable to the dark current to the fourth charge-extraction auxiliary-region 85*d* is provided between the fourth field-control electrode 94*b* and the first field-control electrode 91*a*.

In order to transfer charges to one of the first, second, third, and fourth charge-accumulation regions 81, 82, 83, and 84 along one of the charge transport paths along the X-shaped quadruple directions, by applying the charge extraction control pulse $G_D$ with a first potential level "$L_D$" of voltage to each of the first, second, third, and fourth charge transfer gate electrodes 96*a*, 96*b*, 96*c*, and 96*d*, a potential barrier as represented by the solid line of FIG. 23B in the third embodiment is generated on the surface of the p-type active-area setting-layer 32 just under each of the first, second, third, and fourth charge transfer gate electrodes 96*a*, 96*b*, 96*c*, and 96*d*.

On the other hand, in a case that each of the first, second, third, and fourth charge transfer gate electrodes 96*a*, 96*b*, 96*c*, and 96*d* is applied with the charge extraction control pulse $G_D$ with a second potential level "$H_D$" of voltage, the height of the potential barrier just under each of the first, second, third, and fourth charge transfer gate electrodes 96*a*, 96*b*, 96*c*, and 96*d* is decreased as represented by the broken line in FIG. 23B. If the height of the potential barrier is decreased as represented by the broken line in FIG. 23B, the charges of dark current components caused by the background light or the like can be exhausted from the surface buried region 35 to each of the first, second, third, and fourth charge-extraction auxiliary-regions 85*a*, 85*b*, 85*c*, and 85*d*.

In the quadruple-output charge-modulation element pertaining to the fourth embodiment, the charge transport paths implement an X-shape so that the charge transport paths cross each other at the center of the light-receiving area. Charge modulation can be performed by transporting photoelectrons generated in the light-receiving area along the X-shaped charge transport paths at a higher speed by electric field control in quadruple directions of the letter X by using first, second, third, and fourth field-control electrode pairs (91*a*, 91*b*), (92*a*, 92*b*), (93*a*, 93*b*), and (94*a*, 94*b*) which are quadruple gates performing the electric field control by static induction effect in the directions perpendicular to the respective charge transport paths.

For example, in the quadruple-output charge-modulation element pertaining to the fourth embodiment, in an objective that the electrons generated in the light-receiving area represented by the two-dot dashed line, being labeled by reference numeral 51, in the central portion of FIG. 33 are transported along the X-shaped charge transport paths in the right upward direction of FIG. 33 to pass through between the third field-control electrode pair (93*a*, 93*b*), under a condition that the charge extraction control pulse $G_D$ with a first potential level "$L_D$" of 1 V are applied to each of the first, second, third, and fourth charge transfer gate electrodes 96*a*, 96*b*, 96*c*, and 96*d*, if the first, second, and third field-control pulses $G_1$, $G_2$, and $G_3$ with a first potential level "L" of −1 V are applied to the respective first, second, and third field-control electrode pairs (91*a*, 91*b*), (92*a*, 92*b*), and (93*a*, 93*b*), and if the fourth field-control pulse $G_4$ with a second potential level "H" of 1.8 V is applied to the fourth field-control electrode pair (94*a*, 94*b*), a right-downward-inclined potential gradient represented by the broken line in FIG. 34 is generated along the cross-sectional direction XXXIV-XXXIV (right-upward-inclined diagonal direction) of FIG. 33.

On the other hand, under a condition that the charge extraction control pulse $G_D$ with a first potential level "$L_D$" of 1 V is applied to each of the first, second, third, and fourth charge transfer gate electrodes 96*a*, 96*b*, 96*c*, and 96*d*, if the first, second, and third field-control pulses $G_1$, $G_2$, and $G_3$ with a first potential level "L" of −1 V are applied to the respective first, third, and fourth field-control electrode pairs (91*a*, 91*b*), (93*a*, 93*b*), and (94*a*, 94*b*), and if the second field-control pulse $G_2$ with a second potential level "H" of 1.8 V is applied to the second field-control electrode pair (92*a*, 94*b*), a right-upward-inclined potential gradient represented by the solid line in FIG. 34 is generated along the cross-sectional direction XXXIV-XXXIV (right-upward-inclined diagonal direction) of FIG. 33.

FIG. 35 illustrates operation timing of the quadruple-output charge-modulation element pertaining to the fourth embodiment. In the integration period when the light pulse is received and the modulated charges are accumulated, the charge-modulation element is operated by periodically applying quintuple gate signals implemented by the first, second, third, and fourth field-control pulses $G_1$, $G_2$, $G_3$, and $G_4$, and the charge extraction control pulse as illustrated in FIG. 35. In the period when the first field-control pulse $G_1$ is at the second potential level "H", the second field-control pulse $G_2$ is at the first potential level "L", the third field-control pulse $G_3$ is at the first potential level "L", the fourth field-control pulse $G_4$ is at the first potential level "L", and the charge extraction control pulse $G_D$ is at the first potential level "$L_D$", the signal charges generated in the light-receiving area are transferred to the first charge-accumulation region 81 illustrated in FIG. 33. In the period when the second field-control pulse $G_2$ is at the second potential level "H", the first field-control pulse $G_1$ is at the first potential level "L", the third field-control pulse $G_3$ is at the first potential level "L", the fourth field-control pulse $G_4$ is at the first potential level "L", and the charge extraction control pulse $G_D$ is at the first potential level "$L_D$", the signal charges generated in the light-receiving area are transferred to the second charge-accumulation region 82. In the period when the third field-control pulse $G_3$ is at the second potential level "H", the first field-control pulse $G_1$ is at the first potential level "L", the third field-control pulse $G_3$ is at the first potential level "L", the fourth field-control pulse $G_4$ is at the first potential level "L", and the charge extraction control pulse $G_D$ is at the first potential level "$L_D$", the signal charges generated in the light-receiving area are transferred to the third charge-accumulation region 83. In the period when the fourth field-control pulse $G_4$ is at the second potential level "H", the first field-control pulse $G_1$ is at the first potential level "L", the second field-control pulse $G_2$ is at the first potential level "L", the third field-control pulse $G_3$ is at the first potential level "L", and the charge extraction control pulse $G_D$ is at the first potential level "$L_D$", the signal charges generated in the light-receiving area are transferred to the terminal of the fourth charge-accumulation region 84.

On the other hand, in the period when the charge extraction control pulse $G_D$ is at the second potential level "$H_D$", the first field-control pulse $G_1$ at the first potential level "L", the second field-control pulse $G_2$ is at the first potential level "L", the third field-control pulse $G_3$ is at the first potential level "L", and the fourth field-control pulse $G_4$ is at the first potential level "L", the signal charges generated in the light-receiving area are exhausted to the first, second, third, and fourth charge-extraction auxiliary-region 85a, 85b, 85c, and 85d.

At this time, if the light pulse arrives at the timing of the first incoming light of FIG. 35, the charge amounts Q1, Q2, Q3, and Q4 accumulated in the respective first, second, third, and fourth charge-accumulation regions 81, 82, 83, and 84 are expressed as Eqs. (36), (37), (38), and (39) by denoting the delay time of the light pulse according to the TOF of the first incoming light by $T_{d1}$:

$$Q1 = I_{ph}T_{d1} + I_aT_0 \qquad (36)$$

$$Q2 = I_aT_0 \qquad (37)$$

$$Q3 = I_aT_0 \qquad (38)$$

$$Q4 = I_{ph}(T_0 - T_{d1}) + I_aT_0 \qquad (39)$$

The delay time $T_{d1}$ of the light pulse according to the TOF of the first incoming light can be obtained by using Eqs. (36), (37), (38), and (39) as the following Formula:

$$T_{d1} = T_0(Q1-Q3)/(Q4+Q1-2Q3) \qquad (40)$$

In Eq. (40), instead of Q3, Q2 may be used. Alternatively, (Q2+Q3)/2 may be used.

If the light pulse arrives at the timing of the second incoming light of FIG. 35, when the delay time of the light pulse according to the TOF of the second incoming light is denoted by $T_{d2}$, the charge amounts Q1, Q2, Q3, and Q4 accumulated in the respective first, second, third, and fourth charge-accumulation regions 81, 82, 83, and 84 are expressed as Eqs. (41), (42), (43), and (44):

$$Q1 = I_{ph}(2T_0 - T_{d2}) + I_aT_0 \qquad (41)$$

$$Q2 = I_{ph}(T_{d2} - T_0) + I_aT_0 \qquad (42)$$

$$Q3 = I_aT_0 \qquad (43)$$

$$Q4 = I_aT_0 \qquad (44)$$

By using Eqs. (41), (42), (43), and (44), the delay time $T_{d2}$ of the light pulse according to the TOF of the second incoming light can be obtained as the following Formula:

$$T_{d2} = T_0 + T_0(Q2-Q4)/(Q1+Q2-2Q4) \qquad (45)$$

In Eq. (45), instead of Q4, Q3 may be used. Alternatively, (Q3+Q4)/2 may be used.

If the light pulse arrives at the timing of the third incoming light of FIG. 35, when the delay time of the light pulse according to the TOF of the third incoming light is denoted by $T_{d3}$, the charge amounts Q1, Q2, Q3, and Q4 accumulated in the respective first, second, third, and fourth charge-accumulation regions 81, 82, 83, and 84 are expressed as Eqs. (46), (47), (48), and (49):

$$Q1 = I_aT_0 \qquad (46)$$

$$Q2 = I_{ph}(3T_0 - T_{d3}) + I_aT_0 \qquad (47)$$

$$Q3 = I_{ph}(T_{d3} - 2T_0) + I_aT_0 \qquad (48)$$

$$Q4 = I_aT_0 \qquad (49)$$

By using Eqs. (46), (47), (48), and (49), the delay time $T_{d3}$ of the light pulse according to the TOF of the third incoming light can be obtained as the following Formula:

$$T_{d3} = 2T_0 + T_0(Q3-Q1)/(Q1+Q2-2Q1) \qquad (50)$$

In Eq. (50), instead of Q1, Q4 may be used. Alternatively, (Q1+Q4)/2 may be used.

If the light pulse arrives at the timing of the fourth incoming light of FIG. 35, when the delay time of the light pulse according to the TOF of the fourth incoming light is denoted by $T_{d4}$, the charge amounts Q1, Q2, Q3, and Q4 accumulated in the respective first, second, third, and fourth charge-accumulation regions 81, 82, 83, and 84 are expressed as Eqs. (51), (52), (53), and (54):

$$Q1 = I_aT_0 \qquad (51)$$

$$Q2 = I_aT_0 \qquad (52)$$

$$Q3 = I_{ph}(4T_0 - T_{d4}) + I_aT_0 \qquad (53)$$

$$Q4 = I_{ph}(T_{d4} - 3T_0) + I_aT_0 \qquad (54)$$

By using Eqs. (51), (52), (53), and (54), the delay time $T_{d4}$ of the light pulse according to the TOF of the fourth incoming light can be obtained as the following Formula:

$$T_{d4} = 3T_0 + T_0(Q4-Q2)/(Q4+Q3-2Q2) \qquad (55)$$

In Eq. (55), instead of Q2, Q1 may be used. Alternatively, (Q1+Q2)/2 may be used.

In this manner, if the quadruple-output charge-modulation element pertaining to the fourth embodiment is used, the distance measurement can be performed in a range of the TOF of four times $T_0$ by using the pulse width of $T_0$. Which time zone the TOF of the light pulse exists in is found by comparison of charges, and which of Eqs. (40), (45), (50), and (55) is used according to the time zone is determined as listed in Table 2, so that the distance corresponding to the delay time of four times $T_0$ can be measured.

TABLE 2

| Condition | Time zone of TOF of light | Used Formula |
|---|---|---|
| $Q_1 > Q_3, Q_4 > Q_2$ | $0 < T_{d1} \leq T_0$ | Eq. (40) |
| $Q_1 > Q_3, Q_2 \leq Q_4$ | $T_0 < T_{d2} \leq 2T_0$ | Eq. (45) |
| $Q_1 \leq Q_3, Q_2 \leq Q_4$ | $2T_0 < T_{d3} \leq 3T_0$ | Eq. (50) |
| $Q_1 \leq Q_3, Q_4 > Q_2$ | $3T_0 < T_{d4} \leq 4T_0$ | Eq. (55) |

As described heretofore, according to the quadruple-output charge-modulation element pertaining to the fourth embodiment, in contrast to a structure that the potential just under the gate electrode is controlled toward the vertical direction (depth direction) by using a MOS structure of the related art, since the electric field control by static induction effect along the lateral direction (perpendicular to the direction of the charge transport path) is used, the electric field becomes substantially uniform over a long distance of the charge transport path, and therefore, the signal charges are transported at a higher speed while symmetry is maintained. Particularly, in comparison with the equipotential lines profile of the H-shaped charge transport paths illustrated in FIGS. 15 and 16, the equipotential lines profile of the X-shaped charge transport paths illustrated in FIGS. 28 and 29 is excellent in the symmetry of the charge transport paths toward the quadruple charge-accumulation regions (first, second, third, and fourth charge-accumulation regions 81, 82, 83, and 84). Namely, if the quadruple-output charge-modulation element pertaining to the fourth embodiment is applied to a TOF range sensor, in comparison with the case of the H-shaped charge transport paths, distance measurement can be performed more accurately. Furthermore, as a result of excellent symmetry of the charge transport paths, the charge-modulation element is less susceptible to the influence of deviation of mask alignment in the manufacturing process. In addition, in comparison with a CMOS TOF range image sensor using a buried photodiode of the related art, naturally, the topology of the charge transport paths can be achieved by an X-shape having a high symmetry, and the length of the charge transport path can be taken to be long. Therefore, a substantial planar dimension of the light-receiving area is further increased, so that high sensitivity can be achieved.

In addition, as described in the advantageous features of the quadruple-output charge-modulation element of the first embodiment, in contrast to the structure that the potential just under the gate electrode is controlled toward the vertical direction by using a MOS structure of the related art, in which noise or dark current is caused by interface defects, interface states, or the like in the interface between the gate oxide film and the silicon surface, according to the quadruple-output charge-modulation element pertaining to the fourth embodiment, since the electric field is control by static induction effect along the lateral direction, it is possible to avoid the problem of generation of the noise or the dark current caused by the interface defects, the interface states, or the like in the interface between the gate oxide film and the silicon surface or the problem of deterioration in transport speed.

In addition, according to the quadruple-output charge-modulation element pertaining to the fourth embodiment, the signal charges are sequentially transported at a higher speed, being alternatively distributed to the first, second, third, and fourth charge read-out regions 81, 82, 83, and 84 allocated at the quadruple end portions of the X-shaped charge transport paths. Therefore, the charge-modulation element is not limited to the TOF range sensor, but it can be applied to observation of physical phenomenon where the same phenomenon is repeated in an extremely short time. For example, if the quadruple-output charge-modulation element pertaining to the fourth embodiment is applied as an element of measuring a lifetime of a fluorescent material, a substantially uniform electric field is established over a long distance in the direction of the charge transport path, so that the signal charges can be transported at a higher speed. Therefore, the measurement with a higher accuracy can be established.

Other Embodiments

Heretofore, the present invention is described by using the first to fourth embodiments. However, it should be noted that the description and drawings as a portion of the disclosure are not be understood to limit the present invention. It is obvious to the ordinarily skilled in the art that various alternative embodiments, examples, and operating techniques are available from the disclosure.

In the description of the first to fourth embodiments of the present invention described above, the first conductivity type (p-type) is assigned as p-type, and the second conductivity type (n-type) is assigned as n-type. However, it can be easily understood that, even in a case that the first conductivity type is n-type and the second conductivity type is p-type, if the electrical polarities are set to be reverse, the same effectiveness can be obtained.

In the description of the first to fourth embodiments, the signal charges which are subject to the processes of transportation and accumulation or the like are defined as electrons, and in the potential diagrams, the downward direction (depth direction) is defined as the positive direction of the potential. In a case where electrical polarities are set to be inverse, since the charges which are subject to processes are holes, in a potential shape representing a potential barrier, a potential valley, a potential well, or the like in the charge-modulation element, the downward direction (depth direction) of the drawings is represented by the negative direction of the potential.

In addition, the semiconductor material which implements the semiconductor region where the charge transport paths of the present invention are defined is not limited to silicon (Si). In addition, in technical fields of compound semiconductors, there are problems of interface defects or interface states in the interface between the surface of the compound semiconductor and the insulating film. And therefore, because the architecture of controlling the potential in the semiconductor by static induction effect along the lateral direction recited in the present invention can avoid the influence of the interface defects or the interface states, the structures and technical ideas of the charge-modulation elements or the solid-state imaging devices exemplarily described in the first to fourth embodiments will become important schemes for charge-modulation elements or solid-state imaging devices, using various compound semiconductors such as group III-V compound semiconductor or group II-VI compound semiconductor.

Like this, it should be noted that the present invention includes various embodiments which are not disclosed herein. Therefore, the scope of the present invention is defined only by the present invention specifying matters according to the claims reasonably derived from the description heretofore.

REFERENCE SIGNS LIST

11 insulating film
21 horizontal shift register
22 converter
23 vertical shift register
24 charge modulation driver
31 semiconductor substrate
32 active-area setting-layer
34 pinning layer
35 surface buried region
41*a*, 41*b* first field-control electrode
42*a*, 42*b* second field-control electrode
43*a*, 43*b* third field-control electrode
44*a*, 44*b* fourth field-control electrode
51 optical shielding plate
61 first charge-accumulation region
62 second charge-accumulation region
63 third charge-accumulation region
64 fourth charge-accumulation region (charge-extraction region)
65*a* first charge-extraction auxiliary-region
65*b* second charge-extraction auxiliary-region
65*c* third charge-extraction auxiliary-region
65*d* fourth charge-extraction auxiliary-region
81 first charge-accumulation region
82 second charge-accumulation region
83 third charge-accumulation region
84 fourth charge-accumulation region
85*a* first charge-extraction auxiliary-region
85*b* second charge-extraction auxiliary-region
85*c* third charge-extraction auxiliary-region
85*d* fourth charge-extraction auxiliary-region
91*a*, 91*b* first field-control electrode
92*a*, 92*b* second field-control electrode
93*a*, 93*b* third field-control electrode
95*a*, 95*b* fourth field-control electrode
96*a* first charge transfer gate electrode 96b second charge transfer gate electrode
96c third charge transfer gate electrode
96d fourth charge transfer gate electrode
$T_1A_{ija}$ signal read-out transistor (amplifying transistor)
$T_1R_{ija}$ first reset transistor
$T_1S_{ija}$ first switching transistor
$T_2A_{ijb}$ signal read-out transistor (amplifying transistor)
$T_2R_{ijb}$ second reset transistor
$T_2S_{ijb}$ second switching transistor
$X_{ij}$ active pixel

The invention claimed is:

1. A charge-modulation element comprising:
a pixel constructing area including:
an active-area setting-layer of a first conductivity type,
a surface buried region of a second conductivity type provided in an upper portion of the active-area setting-layer, and
a pinning layer of the first conductivity type being in contact with a surface of the surface buried region;
an insulating film provided on the pixel constructing area;
a light-receiving area assigned at a central portion of the pixel constructing area;
first, second, third, and fourth charge-accumulation regions of the second conductivity type, allocated at separated quadruple positions with an orthogonal mirror symmetry, the orthogonal mirror symmetry having two axes of symmetry, the two axes are mutually perpendicular, and the first, second, third, and fourth charge-accumulation regions having a higher impurity concentration than the active-area setting-layer, and being separated from each other at quadruple positions symmetric with respect to the center position of the light-receiving area, surrounding the light-receiving area; and
first, second, third, and fourth field-control electrode pairs being provided at four positions surrounding the light-receiving area so as to define four directionally branched charge transport paths, which extend from the center position of the light-receiving area to the respective first, second, third, and fourth charge-accumulation regions, such that each of the first, second, third, and fourth field-control electrode pairs are allocated to both sides of the charge transport paths respectively, on the insulating film,
wherein depletion potentials of the surface buried region are sequentially changed, by periodically applying field-control pulses at different phases to the first, second, third, and fourth field-control electrode pairs, and thus, potential gradient for transporting the charges is generated in one of the charge transport paths, so that the destination of majority carriers generated in the surface buried region is controlled so as to be sequentially set to one of the first, second, third, and fourth charge-accumulation regions.

2. The charge-modulation element of claim 1, wherein an arrangement topology of the first, second, third, and fourth charge-accumulation regions has a double rotational symmetry or quadruple rotational symmetry with respect to the center position of the light-receiving area.

3. The charge-modulation element of claim 1,
wherein each of the first, the second, and the third charge-accumulation regions acts as a charge read-out region, configured to accumulate and to read out the majority carriers as signal charges, and
wherein the fourth charge-accumulation region acts as a charge-extraction region extracting charges as a dark current component generated in the surface buried region according to background light.

4. The charge-modulation element of claim 3, wherein, in the pinning layer, a density of carriers having a conductivity type opposite to that of the signal charges is changed by voltages applied to the first to fourth field-control electrode pairs together with a change in depletion potential of the charge transport path.

5. The charge-modulation element of claim 1, further comprising a second conductivity type charge-extraction region having a higher impurity concentration than the active-area setting-layer and being separated from each of the first, second, third, and fourth charge-accumulation regions and being arranged at a position surrounding the light-receiving area,
wherein each of the first, second, third, and fourth charge-accumulation regions acts as a charge read-out region, configured to accumulate and to read out the majority carriers as signal charges.

6. The charge-modulation element of claim 5, wherein, in the pinning layer, a density of carriers having a conductive type opposite to that of the signal charges is changed by voltages applied to the first to fourth electric field control electrode pairs together with a change in depletion potential of the charge transport path.

7. The charge-modulation element of claim 1, wherein the active-area setting-layer is provided on a first conductivity type or a second conductivity type semiconductor substrate.

8. The charge-modulation element of claim 1, wherein an optical shielding plate is further provided above the insulating film, and
wherein a planar pattern of the light-receiving area is defined by selectively irradiating the central portion of the pixel constructing area with light through an opening of the optical shielding plate.

9. A solid-state imaging device comprising a plurality of active pixels arrayed on a same semiconductor chip, each of the active pixels including a plurality of charge-modulation elements arranged in a matrix shape so as to establish an integrated structure, wherein each of the charge-modulation element includes:
a pixel constructing area including:
an active-area setting-layer of a first conductivity type,
a surface buried region of a second conductivity type provided in an upper portion of the active-area setting-layer, and
a pinning layer of the first conductivity type being in contact with a surface of the surface buried region;
an insulating film provided on the pixel constructing area;
a light-receiving area assigned at a central portion of the pixel constructing area;
first, second, third, and fourth charge-accumulation regions of the second conductivity type, allocated at separated quadruple positions with an orthogonal mirror symmetry, the orthogonal mirror symmetry having two axes of symmetry, the two axes are mutually perpendicular, and the first, second, third, and fourth charge-accumulation regions having a higher impurity concentration than the active-area setting-layer, and being separated from each other at quadruple positions symmetric with respect to the center position of the light-receiving area, surrounding the light-receiving area; and
first, second, third, and fourth field-control electrode pairs being provided at four positions surrounding the light-receiving area so as to define four directionally branched charge transport paths, which extend from the center position of the light-receiving area to the respective first, second, third, and fourth charge-accumulation regions, such that each of the first, second, third, and fourth field-control electrode pairs are allocated to both sides of the charge transport paths respectively, on the insulating film, wherein, in each of the charge-modulation elements, depletion potentials of the surface buried region are sequentially changed, by periodically applying field-control pulses at different phases to the first, second, third, and fourth field-control electrode pairs, and thus, potential gradient for transporting the charges is generated in one of the charge transport paths, so that the destination of majority carriers generated in the surface buried region is controlled so as to be sequentially set to one of the first, second, third, and fourth charge-accumulation regions.

10. The solid-state imaging device of claim 9, wherein, in each of the plurality of the charge-modulation elements constituting the active pixel, each of the first, the second, and the third charge-accumulation regions acts as a charge read-out region, configured to accumulate and to read out majority carriers generated in the surface buried region as signal charges, and the fourth charge-accumulation region acts as a charge-extraction region extracting charges as a dark current component generated in the surface buried region according to background light.

11. The solid-state imaging device of claim 10, wherein, in each of the active pixels, a peripheral circuit configured to read out the signal charges from the first, the second, and the third charge-accumulation regions is arranged around an area, where the charge-modulation elements are arranged in the matrix shape.

12. The solid-state imaging device of claim 10, wherein, in each of the active pixels, a peripheral circuit reading out the signal charges from the first, second, third, and fourth charge-accumulation regions of each of the plurality of the charge-modulation elements is arranged around an area, where the charge-modulation elements are arranged in the matrix shape.

13. The solid-state imaging device of claim 9, wherein each of the plurality of the charge-modulation elements in each of the active pixel further includes a second conductivity type charge-extraction region having a higher impurity concentration than the active-area setting-layer and being separated from each of the first, second, third, and fourth charge-accumulation regions and being arranged at a position surrounding the light-receiving area, and wherein each of the first, second, third, and fourth charge-accumulation regions acts as a charge read-out region, configured to accumulate and to read out the majority carriers as signal charges.

\* \* \* \* \*